United States Patent [19]

Ishigaki et al.

[11] Patent Number: 5,777,920
[45] Date of Patent: Jul. 7, 1998

[54] SEMICONDUCTOR MEMORY DEVICE AND METHOD OF MANUFACTURING THE SAME

[75] Inventors: Yoshiyuki Ishigaki; Kazuhito Tsutsumi, both of Hyogo, Japan

[73] Assignee: Mitsubishi Denki Kabushiki Kaisha, Tokyo, Japan

[21] Appl. No.: 648,605

[22] Filed: May 15, 1996

[30] Foreign Application Priority Data

Dec. 7, 1995 [JP] Japan .................................. 7-319347

[51] Int. Cl.$^6$ .................................................. G11C 11/00
[52] U.S. Cl. .......................... 365/154; 365/156; 365/182; 257/903; 257/244; 257/297
[58] Field of Search .................................. 365/154, 156, 365/182; 257/903, 244, 288, 297

[56] References Cited

U.S. PATENT DOCUMENTS

| | | | |
|---|---|---|---|
| 4,975,756 | 12/1990 | Haken et al. | 257/371 X |
| 5,483,083 | 1/1996 | Meguro et al. | 365/154 X |
| 5,523,598 | 6/1996 | Watanabe et al. | 257/301 |
| 5,570,311 | 10/1996 | Ema et al. | 365/154 |
| 5,592,013 | 1/1997 | Honda | 257/903 X |
| 5,596,212 | 1/1997 | Kuriyama | 257/903 X |
| 5,598,013 | 1/1997 | Yokoyama | 257/903 X |

FOREIGN PATENT DOCUMENTS

| | | |
|---|---|---|
| 2-122522 | 5/1990 | Japan . |
| 4-262574 | 9/1992 | Japan . |

OTHER PUBLICATIONS

T. Yamanaka et al., "A 25 $\mu m^2$, New Poly-Si PMOS Load (PPL) SRAM Cell Having Excellent Soft Error Immunity", IEDM 88, pp. 48–51.

*Primary Examiner*—David C. Nelms
*Assistant Examiner*—Huan Hoang
*Attorney, Agent, or Firm*—Lowe, Price, LeBlanc & Becker

[57] ABSTRACT

A groove is formed at a surface of a p$^-$-well region. One of source/drain regions of each of access transistors has an n$^-$-impurity region and an n$^+$-impurity region forming an LDD structure. Another n$^-$-impurity region is disposed such that n$^+$-impurity region is located between these n$^-$-impurity regions, and is formed at the whole bottom surface of groove. Thereby, it is possible to provide a semiconductor memory device of a high performance including an SRAM in which resistance against soft error is improved, a junction leak current is reduced and a current consumption during standby can be reduced.

22 Claims, 58 Drawing Sheets

PERIPHERAL CIRCUIT

MEMORY CELL

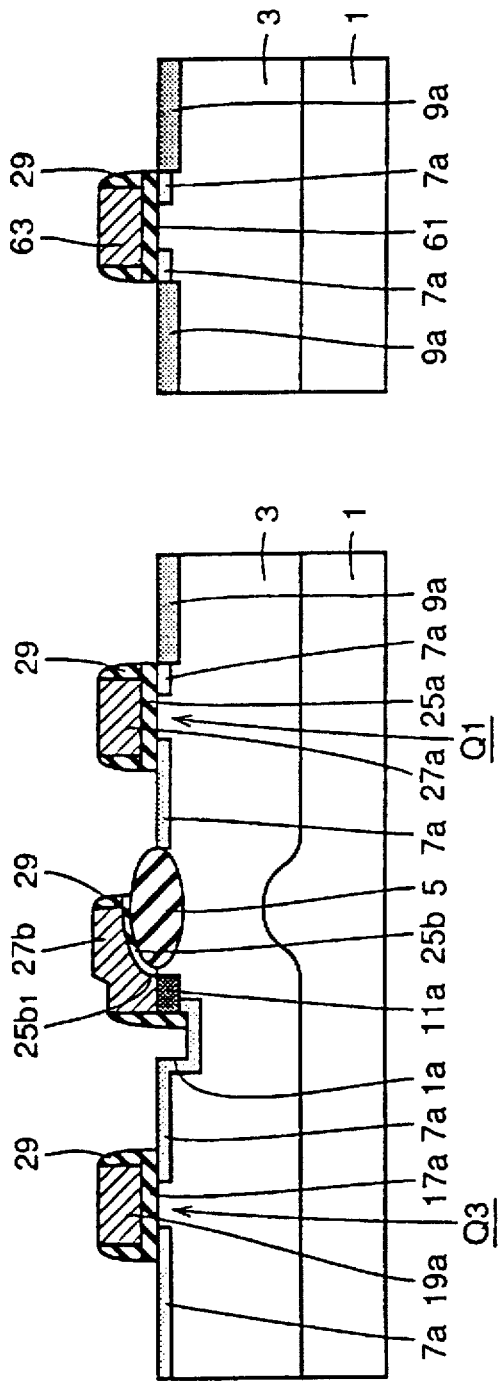

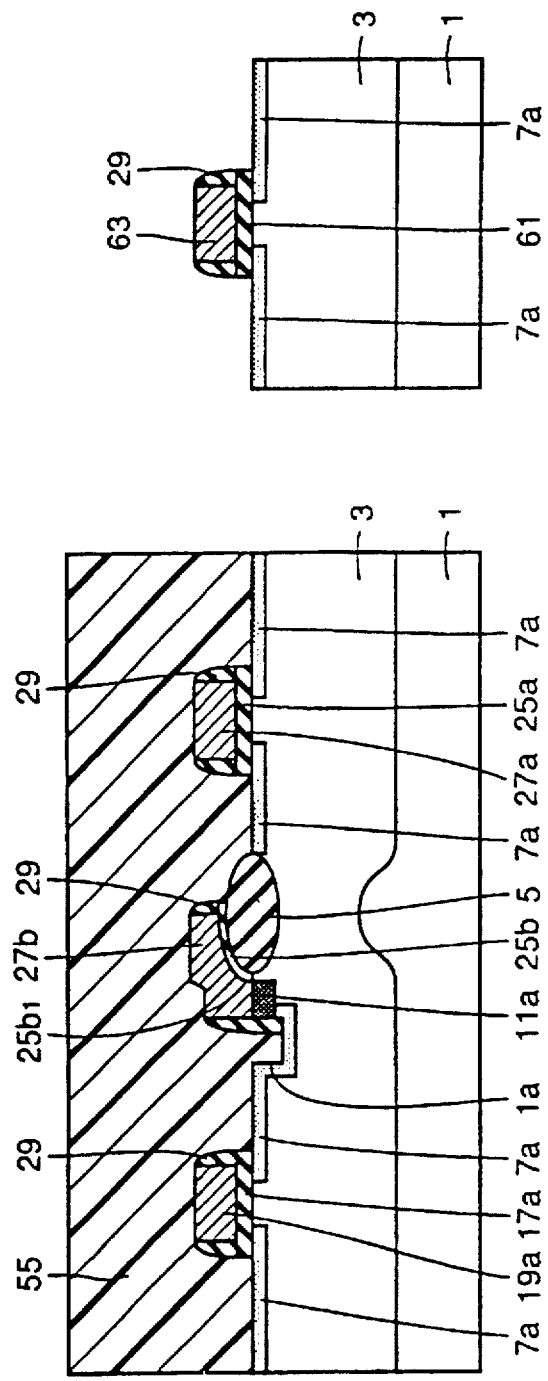

PERIPHERAL CIRCUIT

MEMORY CELL

PERIPHERAL CIRCUIT

MEMORY CELL $X < 0 \mu m$ $X > 0.4 \mu m$

SEMICONDUCTOR MEMORY DEVICE AND METHOD OF MANUFACTURING THE SAME

BACKGROUND OF THE INVENTION

1. Field of the Invention

The present invention relates to a semiconductor memory device and a method of manufacturing the same, and in particular to a semiconductor memory device including an SRAM (Static Random Access Memory) allowing random writing and reading as well as a method of manufacturing the same.

2. Description of the Background Art

SRAMs are a kind of well-known semiconductor memory devices. As compared with DRAMs (Dynamic Random Access Memories), SRAMs have such an advantage that refreshing is not required and a state of storage is stable.

FIG. 54 is an equivalent circuit diagram of an SRAM memory cell of a high resistance load type. Referring to FIG. 54, the SRAM which is a kind of nonvolatile semiconductor memory device includes memory cells which are arranged at crossings of complementary data lines (bit lines) 107 and 108 and word lines 109 arranged in a matrix form. Each memory cell is formed of a flip-flop circuit, which is formed of a pair of inverter circuits, and two access transistors Q3 and Q4. The flip-flop circuit forms cross-coupled two storage nodes N1 and N2, and has a bistable state of (High and Low) or (Low and High). The memory cell maintains the bistable state as long as it is supplied with a predetermined supply voltage.

Paired access transistors Q3 and Q4 are made of MOS (Metal Oxide Semiconductor) transistors. One of source/drain regions of access transistor Q3 is connected to storage node N1, and the other is connected to bit line 107. One of source/drain regions of access transistor Q4 is connected to storage node N2, and the other is connected to bit line 108. Each of gates of access transistors Q3 and Q4 is connected to word line 109, which controls on/off of access transistors Q3 and Q4.

Each inverter circuit is formed of one driver transistor Q1 (or Q2) and one load element R1 (or R2). Paired driver transistors Q1 and Q2 are made of MOS transistors. Each of source regions of paired driver transistors Q1 and Q2 is connected to a GND (ground potential) 112. A drain region of driver transistor Q1 is connected to storage node N1, and a drain region of driver transistor Q2 is connected to storage node N2. A gate of driver transistor Q1 is connected to storage node N2, and a gate of driver transistor Q2 is connected to storage node N1.

In this example, the load element is formed of a high resistance. Each of high resistances R1 and R2 forming the pair of load elements is connected at one of its ends to a Vcc power supply 110, and is connected at the other end to storage node N1 or N2.

The flip-flop circuit is formed by the pair of inverter circuits cross-coupled as described above.

When writing data into the memory cell, word line 109 is selected to turn on transistors Q3 and Q4, and a voltage corresponding to an intended logical value is applied to bit line pair 107 and 108, so that the flip-flop circuit is set to intended one of the bistable states.

When reading data from the memory cell, access transistors Q3 and Q4 are turned on to transmit potentials on storage nodes N1 and N2 to bit lines 107 and 108, respectively.

In the conventional semiconductor memory device, connection between the gate electrodes of driver transistors Q1 and Q2 and the source/drain regions of access transistors Q3 and Q4 is made by means of so-called direct contact or shared direct contact. Description will now be given on the memory cell structure of the SRAM of the conventional high resistance load type using the direct contact.

FIG. 55 is a cross section schematically showing the memory cell structure of the conventional SRAM using the direct contact. FIGS. 56 to 59 are plans showing major portions at four levels (from the lower to the higher) of a structure including four memory cells in the conventional SRAM.

More specifically, FIG. 55 shows a structure including the pair of driver transistors Q1 and Q2 and the pair of access transistors Q3 and Q4 formed at a substrate, and FIG. 56 shows a structure of a ground interconnection layer. FIG. 58 shows a structure of high resistances R1 and R2 forming the pair of load elements, and FIG. 59 shows a structure of bit lines.

FIG. 55 shows a section taken along line 55—55' in FIGS. 56 to 59. In FIGS. 56 to 59, a region surrounded by alternate long and two short dashes line represents a region of one unit cell (unit cell).

Referring to FIGS. 55 and 56, $p^-$-well region 3 is formed on $n^-$-silicon substrate 1. A field insulating layer 5 for element isolation is formed at the surface of $p^-$-well region 3. The pair of driver transistors Q1 and Q2 and the pair of access transistors Q3 and Q4 are formed at the surface portions of $p^-$-well region 3 isolated by field insulating layer 5.

Driver transistor Q1 has a drain region 21a, a source region 23a, a gate insulating layer 25a and a gate electrode layer 27a. Each of drain region 21a and source region 23a has an LDD (Lightly Doped Drain) structure formed of two-layer structure including an $n^-$-impurity region 7a and $n^+$-impurity region 9a. Gate electrode layer 27a is formed on a region between drain region 21a and source region 23a with a gate insulating layer 27a therebetween.

Driver transistor Q2 has a drain region, a source region and a gate insulating layer (not shown) as well as a gate electrode layer 27b. The drain region and source region have an LDD structure made of a two-layer structure formed of $n^-$-impurity region 7b and $n^+$-impurity region 9b, similarly to driver transistor Q1. Gate electrode layer 27b is formed on a region between the drain region and source region with the gate insulating layer therebetween.

Access transistor Q3 has a pair of source/drain regions 13a and 15a, a gate insulating layer 17a and a gate electrode layer 19a. Each of paired source/drain regions 13a and 15a has an LDD structure made of a two-layer structure formed of $n^-$-impurity region 7a and $n^+$-impurity region 9a. Gate electrode layer 19a is formed on a region between the pair of source/drain regions 13a and 15a with gate insulating layer 17a therebetween, and is integral with the word line.

Access transistor Q4 has a pair of source/drain regions 13a and 15a and a gate insulating layer (not shown) as well as a gate electrode layer 19a. The paired source/drain regions have an LDD structure made of a two-layer structure formed of $n^-$-impurity region 7b and $n^+$-impurity region 9b, similarly to access transistor Q2. Gate electrode layer 19b is formed on a region between the pair of source/drain regions with the gate insulating layer therebetween, and is integral with the word line.

A side wall insulating layer 29 is formed on each of side walls of gate electrode layers 27a and 27b of the pair of driver transistors Q1 and Q2 and gate electrode layers 19a and 19b of the pair of access transistors Q3 and Q4.

Another n⁻-impurity region 7a is also formed such that n⁺-impurity region 9a is located between this n⁻-impurity region 7a and n⁻-impurity region 7a located immediately under side wall insulating layer 29 at the side wall of gate electrode layer 19a and that n⁺-impurity region 9a is located between this n⁻-impurity region 7a and n⁻-impurity region 7a located immediately under side wall insulating layer 29 at the side wall of gate electrode layer 27a. Thereby, drain region 21a of driver transistor Q1 and one of source/drain regions 15a of access transistor Q3 commonly use the impurity region and are electrically connected.

Drain region 21a of driver transistor Q1 and one of source/drain regions 15a of access transistor Q3 are electrically connected to gate electrode layer 27b of driver transistor Q2 through an opening 25b₁ formed at gate insulating layer 25b. An n-type impurity region 11a is formed at a surface of p⁻-well region 3 to which gate electrode layer 27b is connected.

Another n⁻-impurity region 7b is also formed such that n⁺-impurity region 9b is located between this n⁻-impurity region 7b and n⁻-impurity region 7b located immediately under side wall insulating layer (not shown) at the side wall of gate electrode layer 19b and that n⁺-impurity region 9b is located between this n⁻-impurity region 7b and n⁻-impurity region 7b located immediately under side wall insulating layer 29 at the side wall of gate electrode layer 27b. Thereby, the drain region of driver transistor Q2 and one of the source/drain regions of access transistor Q4 commonly use the impurity region and are electrically connected together.

The drain region of driver transistor Q2 and one of the source/drain regions of access transistor Q4 are electrically connected to gate electrode layer 27a of driver transistor Q1 through an opening 25a₁ formed at gate insulating layer 25a. An n-type impurity region (not shown) is formed at a surface of p⁻-well region 3 to which gate electrode layer 27a is connected.

Referring to FIGS. 55 and 57, there is formed an interlayer insulating layer 31 covering the pair of driver transistors Q1 and Q2 as well as the pair of access transistors Q3 and Q4. The interlayer insulating layer 31 is provided with a contact hole 31a reaching source region 23a of driver transistor Q1 and a contact hole 31b reaching the source region of driver transistor Q2. There is formed a ground interconnection layer 33 which is electrically connected to the source regions of driver transistors Q1 and Q2 through contact holes 31a and 31b, respectively.

Referring to FIGS. 55 and 58, ground interconnection layer 33 is covered with an interlayer insulating layer 35. Ground interconnection layer 33 and interlayer insulating layer 35 are provided with a contact hole 35b reaching gate electrode layer 27a of driver transistor Q1 and a contact hole 35a reaching gate electrode layer 27b of driver transistor Q2.

There is formed a first doped polycrystalline silicon layer 37 which is electrically connected to gate electrode layer 27b of driver transistor Q2 through contact hole 35a. Doped polycrystalline silicon layer 37 has low resistance regions 37a and 37c as well as a high resistance region 37b. Low resistance region 37a is connected to gate electrode layer 27b through contact hole 35a. High resistance region 37b is arranged between low resistance regions 37a and 37c and forms high resistance R1.

There is formed a second doped polycrystalline silicon layer 39 which is electrically connected to gate electrode layer 27a of driver transistor Q1 through contact hole 35b. Second doped polycrystalline silicon layer 39 has low resistance regions 39a and 39c as well as a high resistance region 39b. Low resistance region 39a is connected to gate electrode layer 27a through contact hole 35b. High resistance region 39b is arranged between low resistance regions 39a and 39c and forms high resistance R2.

Low resistance regions 37c and 39c of first and second doped polycrystalline silicon layers 37 and 39 are utilized as Vcc interconnections of respective memory cells.

Referring to FIGS. 55 and 59, there is formed an interlayer insulating layer 41 covering first and second doped polycrystalline silicon layers 37 and 39. Interlayer insulating layers 41, 35 and 33 are provided with a contact hole 41a reaching source/drain region 13a of access transistor Q3 as well as contact hole 41b reaching the source/drain region of access transistor Q4.

There is formed a bit line 43a which is electrically connected to source/drain region 13a of access transistor Q3 through contact hole 41a and extends on interlayer insulating layer 41. There is also formed a bit line 43b which is electrically connected to the source/drain region of access transistor Q4 through contact hole 41b and extends on interlayer insulating layer 41.

Here, "direct contact" means such a contact structure that, as shown in FIGS. 55 and 56, polycrystalline silicon interconnections such as gate electrodes 27a and 27b of driver transistors Q1 and Q2 are directly connected to the surface of semiconductor substrate (p⁻-well region 3) through openings 25a₁ and 25b₁, respectively.

Now, description will be given on a memory cell structure of the conventional SRAM using the shared direct contact.

FIG. 60 is a cross section schematically showing a memory cell structure of the conventional SRAM using the shared direct contact. Referring to FIG. 60, the shared direct contact means such a contact structure that gate electrode layers 27a and 27b of driver transistors Q1 and Q2 are not directly connected to the surface of the semiconductor substrate (p⁻-well region 3), but are connected to the surface of semiconductor substrate via low resistance regions 37a and 39a of first and second doped polycrystalline silicon layers 37 and 39, respectively.

More specifically, interlayer insulating layers 31 and 35 are provided with contact hole 35 exposing the surfaces of gate electrode layer 27b and semiconductor substrate. Low resistance region 37a is formed along the inner surface of contact hole 35 so that gate electrode layer 27b and source region 15a are electrically connected together via low resistance region 37a.

n-type impurity region 11a is formed at a portion where the semiconductor substrate is connected to low resistance region 37a.

Since structures other than the above are substantially the same as those shown in FIG. 55, the same or similar portions bear the same reference characters, and will not be described below.

Now, description will be given on a positional relationship between a hole pattern of a mask for forming opening 25a₁ (25b₁) (which will be referred to merely as an opening pattern) and gate electrode layer 27a (27b).

It is assumed that X shown in FIG. 61 represents a distance between one side of opening pattern 25a₁ and an end of gate electrode layer 27a. Based on this assumption, inventors and others made an experiment to find the followings. For example, with opening pattern 25a₁ having a side of 0.4 μm, connection resistance R is small when distance X is in a range from 0.1 to 0.3 μm, as shown in FIG. 62. Thus, in the case where gate electrode layer 27a does not completely cover the opening pattern region of the direct contact but covers it only partially, connection resistance R between gate electrode layer 27a and the substrate is small. The reason for this can be considered as follows.

FIGS. 63 and 64 are cross sections showing portions corresponding to region S in FIG. 55. More specifically, FIG. 63 shows a structure including the gate electrode layer which completely covers the opening pattern region of the direct contact, and FIG. 64 shows a structure including the gate electrode layer not covering any portion of the same.

Referring first to FIG. 63, $n^-$-impurity region 7a is formed by ion implantation with a mask formed of gate electrode layer 27b and others. n-type impurity region 11a is formed by diffusion of impurity in gate electrode layer 27b into $p^-$-well region 3. Therefore, p-type region ($p^-$-well region 3) is formed between $n^-$-impurity region 7a and n-type impurity region 11a, if opening pattern region $25b_1$ is completely covered by gate electrode layer 27b, i.e., if distance X in FIG. 61 is negative. Accordingly, $n^-$-impurity region 7a and n-type impurity region 11a cannot maintain electrical connection.

Referring to FIG. 64, if any portion of opening pattern region $25b_1$ is not covered by gate electrode layer 27b, i.e., if distance X in FIG. 61 is equal to or larger than a width of opening pattern region $25b_1$, gate electrode layer 27b cannot be electrically connected to source/drain region 15a of the access transistor.

Meanwhile, in the structure where the gate electrode layer covers only a portion of the opening pattern region, structures shown in FIGS. 63 and 64 are unlikely to be formed even if gate electrode layer 27b and opening region $25b_1$ are formed at deviated positions due to deviation of an overlapped mask. Therefore, connection with a low resistance can be stably formed.

Further, the structure where the gate electrode layer of the driver transistor covers only a portion of the opening pattern region can provide an advantage that the memory cell size can be reduced as compared with the structure where the gate electrode layer fully covers the opening pattern region. This will be described below.

FIGS. 65 and 66 are plans showing a major portion of a memory cell. More specifically, FIG. 65 shows a structure in which the gate electrode layer of the driver transistor covers the whole opening pattern region, and FIG. 66 shows a structure where it covers only a portion of the opening pattern region.

Referring to FIGS. 65 and 66, it is necessary to minimize widths $L_1$ and $L_8$ of word lines 19a and 19b, sizes $L_2$ and $L_7$ of spaces between word lines 19a and 19b and gate electrode layers 27a and 27b, and an isolation width $L_5$ between nodes. A channel length $L_4$ of the driver transistor depends on a performance of the transistor. Therefore, these widths or sizes $L_1$–$L_5$, $L_7$ and $L_8$ in the structure shown in FIG. 65 are equal to those in the structure shown in FIG. 66, respectively.

However, if gate electrode layer 27a completely covers opening pattern region $25a_1$, size $L_{6A}$ must be equal to or larger than the width of opening pattern region $25a_1$. Meanwhile, in the structure where gate electrode layer 27a covers only a portion of opening pattern region $25a_1$, size $L_{6B}$ can be smaller than the width of opening pattern region $25a_1$. Therefore, size $L_{6B}$ can be smaller than size $L_{6A}$. Accordingly, the structure in which the gate electrode layer of driver transistor covers only a portion of opening pattern region $25a_1$ can reduce a size $L_B$ of a longer side of the memory cell compared with the structure in which opening pattern region $25a_1$ is completely covered.

Based on the foregoing consideration, such a structure may be envisaged that gate electrode layer 27b covers only a portion of the opening pattern region as shown in FIG. 67. FIG. 68 shows a distribution of an impurity concentration along line 68—68' in FIG. 67 in the structure in which $p^-$-well region 3 has a p-type impurity profile of a retrograde type.

In the structure shown in FIG. 67, the gate electrode layer functioning as an etching stopper located above $p^-$-well region 3 does not exist in the opening pattern region during etching for patterning gate electrode layer 27b. Therefore, etching is also effected on a portion of the surface of $p^-$-well region 3, which is not covered with gate electrode layer 27b and is exposed through the opening, so that a groove 1a of several hundreds to several thousands of angstroms in depth is formed at this exposed surface portion.

Owing to formation of groove 1a, etching residue produced by patterning of the gate electrode layer is removed, so that it is possible to prevent, for example, short circuit between gate electrode layers 27b and 19a.

Owing to formation of groove 1a, a portion of $n^+$-impurity region 9a formed at a bottom of groove 1a. Therefore, at a region under groove 1a, a junction between $n^+$-impurity region 9a and $p^-$-well region 3 is located at a deeper position than that in the structure not provided with a groove (FIG. 55). This increases a junction capacity between $n^+$-impurity region 9a and $p^-$-well region 3, and thus improves resistance against soft error of the memory cell.

In the structure shown in FIG. 67, however, the deep junction between $n^+$-impurity region 9a and $p^-$-well region 3 at the bottom of groove 1a causes a problem of an increased junction leak current. This problem will be described below in detail.

A mechanism of increase in the junction leak current will be briefly described below.

In general, a junction leak current Ir in the reverse bias state of the pn junction increases due to an avalanche effect or tunnel phenomenon when an electric field applied to the junction increases, and it significantly increases when the voltage increases to a range near a breakdown voltage. The leak current increases in accordance with increase in the electric field applied to the junction. The electric field applied to a depletion layer in the pn junction increases in accordance with reduction in the width of the depletion layer, i.e., in accordance with increase in a concentration of each dopant forming p-type or n-type semiconductor layer in the metallurguical pn junction.

In a structure which can be approximated to an oblique junction such as an n/p junction, i.e., junction having approximately equal n-type and p-type concentrations, the junction leak current is affected by the depletion layer widths of concentrations of both the n-type and p-type impurities, and increases in accordance with increase in each concentration. In a structure which can be approximated to a one-side-stepped junction such as an $n^+$/p junction (having an n-type concentration higher than a p-type concentration), increase in the concentration of p-type impurity affects to reduce the width of depletion layer and thus increase the junction leak current to a higher extent compared with the concentration of n-type impurity. In a structure having a profile of a so-called retrograde type in which the concentration of p-type impurity increases as the position moves deep in a substrate direction, the junction leak current increases, even in the $n^+$/p junction, in accordance with increase in the concentration of n-type impurity and thus increase in depth of the junction position, because the concentration of p-type impurity increases in accordance with the above increase in the depth.

In a structure having a p-type impurity profile of the retrograde type shown in FIG. 68, the concentration of p-type impurity increases at the junction position in accordance with increase in a diffusion depth of the n-type region (from solid line to dotted line) and thus increase in depth of the pn junction. Therefore, if the junction between $n^+$-impurity region 9a and $p^-$-well region 3 is located at a deeper position due to provision of groove 1a as shown in FIG. 67, the junction leak current increases.

Meanwhile, in the structure using the shared direct contact shown in FIG. 60, low resistance region 37a is in direct contact with the surface of $n^+$-impurity region 9a. Low resistance region 37a contains impurity at a high concentration for reducing its resistance. Therefore, impurity is liable to diffuse from low resistance region 37a into $n^+$-impurity region 9a in a later step, e.g., for thermal processing, so that the concentration of n-type impurity in $n^+$-impurity region 9a increases, and a diffusion depth of $n^+$-impurity region 9a increases. In this position, therefore, $n^+$-impurity region 9a and $p^-$-well region 3 form pn junction at a deeper position, resulting in increase in the junction leak current similarly to the case of the foregoing direct contact.

If the junction leak current increases in the SRAM as described above, the current consumption increases particularly during standby, and difficulty in data holding arises.

SUMMARY OF THE INVENTION

Accordingly, it is an object of the invention to provide a high-performance semiconductor memory device, in which resistance against soft error is improved and a current consumption during standby can be reduced by reducing a junction leak current, as well as a method of manufacturing the same.

According to an aspect of the invention, a semiconductor memory device provided with static memory cells includes a semiconductor substrate and an access transistor. The semiconductor substrate has a main surface and is provided at the main surface with a groove. The access transistor has a pair of source/drain regions formed at the main surface of the semiconductor substrate and spaced from each other. One of the source/drain regions has first, second and third impurity regions. The first impurity region is formed at the main surface of the semiconductor substrate, and has a first diffusion depth from the main surface. The second impurity region is formed at the main surface of the semiconductor substrate, is in contact with an end of the first impurity region near the other of the source/drain regions, and has a smaller impurity concentration than the first impurity region. The third impurity region is spaced from the second impurity region with the first impurity region therebetween, is formed at a whole bottom surface of the groove, and has a second diffusion depth from the bottom surface of the groove smaller than the first diffusion depth.

According to the semiconductor memory device of the above aspect, the third impurity region having the diffusion depth smaller than that of the first impurity region is formed at the whole bottom surface of the groove. Therefore, a depth of junction between the third impurity region and the semiconductor substrate under the groove can be smaller than that in a structure where the first impurity region is formed at the bottom of the groove. Therefore, an impurity concentration of the semiconductor substrate at the position of junction to the third impurity region can be smaller than that in the structure including the first impurity region formed at the bottom of the groove. Accordingly, a leak current at the junction between the third impurity region and the semiconductor substrate can be reduced.

Since the structure is provided with the groove and the third impurity region is arranged at the whole bottom surface of the groove, the depth of junction between the third impurity region and the semiconductor substrate can be larger than that in the conventional structure not provided with the groove. Therefore, the impurity concentration of the semiconductor substrate at the position of junction to the third impurity region formed at the bottom surface of the groove can be larger than that in the conventional structure already described. Accordingly, the junction capacity and thus the capacity of the storage node can be larger than that in the conventional structure, so that resistance against soft error can be improved.

Preferably, in the above aspect, the third impurity region has a smaller impurity concentration than the first impurity region.

Since the third impurity region has a smaller impurity concentration than the first impurity region, the impurity concentration of the third impurity region at the position of junction to the semiconductor substrate can be smaller than that in the structure including the first impurity region formed at the bottom of the groove. Therefore, the leak current at the junction between the third impurity region and the semiconductor substrate can be reduced further effectively.

Preferably, the device of the above aspect further includes a driver transistor and a load element. The driver transistor includes a pair of source/drain regions formed at the main surface and spaced from each other, and a gate electrode layer formed on a region between the pair of source/drain regions with a gate insulating layer therebetween. The load element is electrically connected at one of its ends to the gate electrode layer of the driver transistor, and is connected at the other end to a power supply potential line.

Preferably, in the above aspect, the gate electrode layer of the driver transistor is in contact with a surface of one of the source/drain regions of the access transistor. One end of the load element is in contact with the surface of the gate electrode layer of the driver transistor.

Thereby, in the structure where the gate electrode layer of the driver transistor and the semiconductor substrate are joined together by a so-called direct contact, the junction leak current between the third impurity region and the semiconductor substrate can be reduced, and the resistance against soft error can be improved.

Preferably, in the above aspect, an end of the load element is in contact with a surface of the gate electrode layer of the driver transistor and a surface of one of the source/drain regions of the access transistor.

Thereby, in the structure where the gate electrode layer of the driver transistor and the semiconductor substrate are joined together by a so-called shared direct contact, the junction leak current between the third impurity region and the semiconductor substrate can be reduced, and the resistance against soft error can be improved.

Preferably, in the above aspect, the gate electrode layer of the driver transistor is in contact with one of the source/drain regions of the access transistor. An end of the load element is in contact with the surface of the gate electrode layer of the driver transistor and the surface of one of the source/drain regions of the access transistor.

Thereby, in the structure where the gate electrode layer of the driver transistor and the semiconductor substrate are joined together by means of combination of a so-called direct contact and a so-called shared direct contact, the junction leak current between the third impurity region and the semiconductor substrate can be reduced, and the resistance against soft error can be improved.

Preferably, in the above aspect, the device further includes a driver transistor having a pair of source/drain regions formed at the main surface of the semiconductor substrate and spaced from each other, and a gate electrode layer formed on a region between the pair of source/drain regions with a gate insulating layer therebetween. An impurity concentration of a region of the semiconductor substrate immediately under the groove is smaller, at a depth of a junction between the semiconductor substrate and the third impurity region arranged at the bottom of the groove, than the impurity concentration of the semiconductor substrate immediately under the gate electrode layer of the driver transistor.

Thereby, the impurity concentration of the semiconductor substrate at the position of junction to the third impurity region is further reduced, and the junction leak current is further reduced.

Preferably, in the above aspect, a depth from the main surface of the semiconductor substrate to the bottom surface of the groove is 300 Å or more.

This provides remarkable improvement in the resistance against soft error.

Preferably, in the above aspect, the load element is a resistance.

This can provide an SRAM memory cell of a high load type, in which the junction leak is suppressed and the resistance against soft error is improved.

Preferably, in the above aspect, the load element is a thin-film transistor, and an end of the load element electrically connected to the gate electrode layer of the driver transistor is either a drain region or a gate electrode layer of the thin-film transistor.

This can provide an SRAM memory cell of a CMOS type, in which the junction leak is suppressed and the resistance against soft error is improved.

According to another aspect of the invention, a semiconductor memory device provided with static memory cells includes a semiconductor substrate, a driver transistor and an access transistor. The semiconductor substrate has a main surface and is provided at the main surface with a groove. The driver transistor has a pair of source/drain regions formed at the main surface of the semiconductor substrate and spaced from each other. The source region of the driver transistor has first and second impurity regions. The first impurity region is formed at the main surface of the semiconductor substrate, and has a first diffusion depth from the main surface. The second impurity region is formed at the main surface of the semiconductor substrate, is in contact with an end of the first impurity region near the drain region, and has a smaller impurity concentration than the first impurity region. The access transistor has a pair of source/drain regions formed at the main surface and spaced from each other. One of the source/drain regions of the access transistor is formed at a whole bottom surface of the groove, and has a second diffusion depth from the bottom surface of the groove smaller than the first diffusion depth.

According to the semiconductor memory device of the above aspect, the one of the source/drain regions of the access transistor having the diffusion depth smaller than that of the first impurity region is formed at the whole bottom surface of the groove. Therefore, a depth of junction between the one of the source/drain regions and the semiconductor substrate at the position under the groove can be smaller than that in a structure where the first impurity region is formed at the bottom of the groove. Therefore, an impurity concentration of the semiconductor substrate at the position of junction to the one of the source/drain regions of the access transistor can be smaller than that in the structure including the first impurity region formed at the bottom of the groove. Accordingly, a leak current at the junction between the one of the source/drain regions of the access transistor and the semiconductor substrate can be reduced.

Since the structure is provided with the groove and the one of the source/drain regions of the access transistor is arranged at the whole bottom surface of the groove, the depth of junction between the one of the source/drain regions of the access transistor and the semiconductor substrate can be larger than that in the conventional structure not provided with the groove. Therefore, the impurity concentration of the semiconductor substrate at the position of junction to the one of the source/drain regions of the access transistor formed at the bottom surface of the groove can be larger than that in the conventional structure already described. Accordingly, the junction capacity and thus the capacity of the storage node can be larger than that in the conventional structure, so that the resistance against soft error can be improved.

Preferably, in the above aspect, the one of the source/drain regions of the access transistor has a smaller impurity concentration than the first impurity region.

Since the one of the source/drain regions of the access transistor has a smaller impurity concentration than the first impurity region, the impurity concentration of the one of the source/drain regions of the access transistor at the position of junction to the semiconductor substrate can be smaller than that in the structure including the first impurity region formed at the bottom of the groove. Therefore, the leak current at the junction between the one of the source/drain regions of the access transistor and the semiconductor substrate can be reduced further effectively.

According to further another aspect of the invention, a semiconductor memory device provided with static memory cells and a peripheral circuit includes a semiconductor substrate, an MIS transistor included in the peripheral circuit and an access transistor. The semiconductor substrate has a main surface and is provided at the main surface with a groove. The MIS transistor has a pair of source/drain regions formed at the main surface and spaced from each other. One of the source/drain regions of the MIS transistor has first and second impurity regions. The first impurity region is formed at the main surface of the semiconductor substrate, and has a first diffusion depth from the main surface. The second impurity region is formed at the main surface, is in contact with an end of the first impurity region near the other of the source/drain regions, and has a smaller impurity concentration than the first impurity region. The access transistor has a pair of source/drain regions formed at the main surface and spaced from each other. One of the source/drain regions of the access transistor is formed at a whole bottom surface of the groove, and has a second diffusion depth from the bottom surface of the groove smaller than the first diffusion depth.

According to the semiconductor memory device of the above aspect, the one of the source/drain regions of the access transistor having the diffusion depth smaller than that of the first impurity region is formed at the whole bottom surface of the groove. Therefore, a depth of junction between the one of the source/drain regions and the semiconductor substrate at the position under the groove can be smaller than that in a structure where the first impurity region is formed at the bottom of the groove. Therefore, an impurity concentration of the semiconductor substrate at the position of junction to the one of the source/drain regions of the access transistor can be smaller than that in the structure including the first impurity region formed at the bottom of the groove. Accordingly, a leak current at the junction between the one of the source/drain regions of the access transistor and the semiconductor substrate can be reduced.

Since the structure is provided with the groove and the one of the source/drain regions of the access transistor is arranged at the bottom of the groove, the depth of junction between the one of the source/drain regions of the access transistor and the semiconductor substrate can be larger than that in the conventional structure not provided with the groove. Therefore, the impurity concentration of the semiconductor substrate at the position of junction to the one of the source/drain regions of the access transistor formed at the bottom of the groove can be larger than that in the conventional structure already described. Accordingly, the junction capacity and thus the capacity of the storage node can be larger than that in the conventional structure, so that the resistance against soft error can be improved.

Preferably, in the above aspect, the one of the source/drain regions of the access transistor has a smaller impurity concentration than the first impurity region.

Since the one of the source/drain regions of the access transistor has a smaller impurity concentration than the first impurity region, the impurity concentration of the one of the source/drain regions of the access transistor at the position of junction to the semiconductor substrate can be smaller than that in the structure including the first impurity region formed at the bottom of the groove. Therefore, the leak current at the junction between the one of the source/drain regions of the access transistor and the semiconductor substrate can be reduced further effectively.

Preferably, the device of the above aspect further includes a driver transistor having a pair of source/drain regions formed at the main surface of the semiconductor substrate and spaced from each other, and a gate electrode layer formed on a region between the pair of source/drain regions with a gate insulating layer therebetween. A silicide layer is formed in contact with the source region of the driver transistor.

Thereby, the resistance of the source region of the driver transistor is reduced, and it is possible to prevent destruction of data stored in the SRAM memory cell.

Preferably, in the above aspect, arsenic is introduced as impurity into the pair of source/drain regions of the access transistor, and phosphorus is introduced as impurity into the pair of source/drain regions of the MIS transistor included in the peripheral circuit.

By introduction of arsenic of a small diffusion coefficient for forming the source/drain regions of the access transistor, it is possible to prevent increase in the diffusion depth of the one of the source/drain regions of the access transistor at the bottom of the groove, and the junction leak current can be reduced. By introduction of phosphorus of a large diffusion coefficient into the source/drain regions of the peripheral circuit transistor, it is possible to moderate an impurity concentration profile at the junction between the drain region and the semiconductor substrate in the direction from the source region to the drain region, so that the drain electric field is relieved.

According to yet another aspect of the invention, a semiconductor memory device provided with static memory cells and a peripheral circuit includes a semiconductor substrate, an access transistor, a driver transistor, an MIS transistor included in the peripheral circuit and a silicide layer. The semiconductor substrate has a main surface. The access transistor has a pair of source/drain regions formed at the main surface of the semiconductor substrate and spaced from each other. The driver transistor has a pair of source/drain regions formed at the main surface of the semiconductor substrate and spaced from each other. The MIS transistor has a pair of source/drain regions formed at the main surface of the semiconductor substrate and spaced from each other. The pair of source/drain regions of the access transistor, the pair of source/drain regions of the driver transistor, and the pair of source/drain regions of the MIS transistor have impurity concentrations of $1 \times 10^{19} \text{cm}^{-3}$ or less. The silicide layer is formed in contact with a surface of the source region of the driver transistor.

According to the semiconductor memory device of the above aspect, since the silicide layer is formed in contact with the source region of the driver transistor, the resistance of the source region of the driver transistor is reduced, and it is possible to prevent destruction of data stored in the SRAM memory cell.

Preferably, in the above aspect, the device further includes second and third silicide layers formed in contact with surfaces of the pair of source/drain regions of the MIS transistor included in the peripheral circuit, respectively.

Thereby, it is possible to reduce resistances of the pair of source/drain regions of the MIS transistor included in the peripheral circuit.

Preferably, in the above aspect, arsenic is introduced as impurity into the pairs of source/drain regions of the access transistor and the driver transistor, and phosphorus is introduced as impurity into the pair of source/drain regions of the MIS transistor included in the peripheral circuit.

By introduction of arsenic of a small diffusion coefficient for forming the source/drain regions of the access transistor and the driver transistor, it is possible to prevent increase in the diffusion depth of the one of the source/drain regions of the access transistor at the bottom of the groove, and the junction leak current can be reduced. By introduction of phosphorus of a large diffusion coefficient into the source/drain regions of the peripheral circuit transistor, it is possible to moderate an impurity concentration profile at the junction between the drain region and the semiconductor substrate in the direction from the source region to the drain region, so that the drain electric field is relieved.

According to an aspect of the invention, a method of manufacturing a semiconductor memory device provided with static memory cells includes the following steps:

An insulating layer having an opening exposing a portion of a main surface of a semiconductor substrate is formed on the main surface of the semiconductor substrate. A conductive layer filling the opening is formed on the insulating layer. Etching is effected on the conductive layer to form a gate electrode layer of an access transistor extending on the insulating layer and a gate electrode layer of a driver transistor covering a portion of the opening to make contact with the main surface of the semiconductor substrate and extending on the insulating layer, and to form a groove at the main surface of the semiconductor substrate not covered with the gate electrode layer of the driver transistor and exposed through the opening. Impurity is introduced, using the gate electrode layers of the access transistor and the driver transistor as a mask, to form at the main surface a pair of first impurity regions located at opposite sides of a region under the gate electrode layer of the access transistor and having a first diffusion depth from the main surface. One of the first impurity regions is formed at a whole bottom surface of the groove, and is electrically connected to the gate electrode layer of the driver transistor. A side wall insulating layer is formed at a side wall of the gate electrode layer of the access transistor. A resist pattern is formed on the groove, and impurity is introduced, using the gate electrode layer of the access transistor, the side wall insulating layer and the resist pattern as a mask, to form at the main surface a pair of second impurity regions located at opposite sides of regions under the gate electrode layer of the access transistor and the side wall insulating layer, having a second diffusion depth from the main surface larger than the first diffusion depth, and having a larger impurity concentration than the first impurity region. A load element having one end connected to the gate electrode layer of the driver transistor and the other end connected to a power supply potential line is formed.

According to the above aspect of the invention, the method of manufacturing the semiconductor memory device can provide an SRAM memory cell structure, in which the junction leak current is reduced and the resistance against soft error is improved.

Preferably, in the above aspect, the step of forming the first impurity regions has a step of implanting impurity by a rotary implanting method.

Since the impurity is introduced by the rotary implanting method, the impurity is sufficiently introduced even into a side wall of the groove. Therefore, it is possible to prevent increase in the resistance of one of the source/drain regions of the access transistor at the side wall of the groove.

According to another aspect of the invention, a method of manufacturing a semiconductor memory device provided with static memory cells includes the following steps:

A conductive layer is formed on a main surface of a semiconductor substrate with an insulating layer therebetween. Etching is effected on the conductive layer to form a gate electrode layer of an access transistor and a gate electrode layer of a driver transistor extending on the insulating layer. Impurity is introduced, using the gate electrode layers of the access transistor and the driver transistor as a mask, to form at the main surface a pair of first impurity regions located at opposite sides of a region under the gate electrode layer of the access transistor. A side wall insulating layer is formed at a side wall of the gate electrode layer of the access transistor. A resist pattern is formed on a portion of the first impurity region near an end of the gate electrode layer of the driver transistor and on an end of the gate electrode layer of the driver transistor, and impurity is introduced, using the gate electrode layer of the access transistor, the side wall insulating layer and the resist pattern as a mask, to form at the main surface a pair of second impurity regions located at opposite sides of regions under the gate electrode layer of the access transistor and the side wall insulating layer and having a first diffusion depth from the main surface. A groove is formed at the main surface provided with the first impurity region near the gate electrode layer of the driver transistor. A load element having one end being in contact with a bottom surface of the groove and the gate electrode layer of the driver transistor and the other end connected to a power supply potential line is formed. A third impurity region having a second diffusion depth from the bottom surface of the groove smaller than the first diffusion depth and electrically connected to the first and second impurity regions is formed at the whole bottom surface of the groove.

According to the above aspect of the invention, the method of manufacturing the semiconductor memory device can provide an SRAM memory cell structure using shared direct contact, in which the junction leak current is reduced and the resistance against soft error is improved.

According to still another aspect of the invention, a method of manufacturing a semiconductor memory device provided with static memory cells includes the following steps:

An insulating layer having an opening exposing a portion of a main surface of a semiconductor substrate is formed on the main surface of the semiconductor substrate. A conductive layer filling the opening is formed on the insulating layer. Etching is effected on the conductive layer to form a gate electrode layer of an access transistor extending on the insulating layer and a gate electrode layer of a driver transistor covering a portion of the opening to make contact with the main surface of the semiconductor substrate and extending on the insulating layer, and to form a groove at the main surface of the semiconductor substrate not covered with the gate electrode layer of the driver transistor and exposed through the opening. Impurity is introduced, using the gate electrode layers of the access transistor and the driver transistor as a mask, to form at the main surface a pair of first impurity regions located at opposite sides of a region under the gate electrode layer of the access transistor and to form at the main surface a pair of second impurity regions located at opposite sides of a region under the gate electrode layer of the driver transistor. The first and second impurity regions have a first diffusion depth from the main surface. One of the first impurity regions is formed at a whole bottom surface of the groove, and is electrically connected to the gate electrode layer of the driver transistor. A side wall insulating layer is formed at a side wall of the gate electrode layer of the driver transistor. Impurity is introduced selectively into one of the second impurity regions forming a source region of the driver transistor, using the gate electrode layer of the driver transistor and the side wall insulating layer as a mask, to form at the main surface a third impurity region having a second diffusion depth from the main surface larger than the first diffusion depth and having a larger impurity concentration than the first impurity region.

According to the above aspect of the invention, the method of manufacturing the semiconductor memory device can provide an SRAM memory cell structure, in which the junction leak current is reduced and the resistance against soft error is improved.

Preferably, in the above aspect, the step of forming the first impurity regions has a step of implanting impurity by a rotary implanting method.

Since the impurity is introduced by the rotary implanting method, the impurity is sufficiently introduced even into a side wall of the groove. Therefore, it is possible to prevent increase in the resistance of one of the source/drain regions of the access transistor at the side wall of the groove.

According to yet another aspect of the invention, a method of manufacturing a semiconductor memory device provided with static memory cells and a peripheral circuit includes the following steps:

An insulating layer having an opening exposing a portion of a main surface of a semiconductor substrate is formed on the main surface of the semiconductor substrate. A conductive layer filling the opening is formed on the insulating layer. Etching is effected on the conductive layer to form a gate electrode layer of an access transistor extending on the insulating layer and a gate electrode layer of an MIS transistor included in the peripheral circuit, and to form a groove at the main surface of the semiconductor substrate exposed through the opening. Impurity is introduced, using the gate electrode layers of the access transistor and the MIS transistor as a mask, to form at the main surface a pair of first impurity regions located at opposite sides of a region under the gate electrode layer of the access transistor and to form at the main surface a pair of second impurity regions located at opposite sides of a region under the gate electrode layer of the MIS transistor. The first and second impurity regions have a first diffusion depth from the main surface. One of the first impurity regions is formed at a whole bottom surface of the groove. A side wall insulating layer is formed at a side wall of the gate electrode layer of the MIS transistor. A resist pattern is formed on the memory cell, and impurity is introduced into the second impurity region, using the gate electrode layer of the MIS transistor, the side wall insulating layer and the resist pattern as a mask, to form at the main surface a third impurity region having a second diffusion depth from the main surface larger than the first diffusion depth and having a larger impurity concentration than the first impurity region.

According to the above aspect of the invention, the method of manufacturing the semiconductor memory device can provide an SRAM memory cell structure, in which the junction leak current is reduced and the resistance against soft error is improved.

Preferably, in the above aspect, the step of forming the first impurity regions has a step of implanting impurity by a rotary implanting method.

Since the impurity is introduced by the rotary implanting method, the impurity is sufficiently introduced even into a side wall of the groove. Therefore, it is possible to prevent increase in the resistance of one of the source/drain regions of the access transistor at the side wall of the groove.

Preferably, in the above aspect, the first impurity regions are formed by introduction of arsenic, and the second impurity regions are formed by introduction of phosphorus.

Owing to introduction of arsenic of a small diffusion coefficient for forming the first impurity regions, it is possible to prevent increase in the diffusion depth of the first impurity regions at the bottom of the groove, and the junction leak current can be reduced. Owing to introduction of phosphorus of a large diffusion coefficient into the second and third impurity regions, it is possible to moderate an impurity concentration profile at the junction between the drain region and the semiconductor substrate in the direction from the source region to the drain region, so that the drain electric field is relieved.

According to further another aspect of the invention, a method of manufacturing a semiconductor memory device provided with static memory cells and a peripheral circuit includes the following steps:

Gate electrode layers of an access transistor and a driver transistor having predetermined patterned configurations and a gate electrode layer of an MIS transistor included in the peripheral circuit and having a predetermined patterned configuration are formed on a main surface of a semiconductor substrate with an insulating layer therebetween. Impurity is introduced, using the gate electrode layers of the access transistor, the driver transistor and the MIS transistor as a mask, to form at the main surface a pair of first impurity regions located at opposite sides of a region under the gate electrode layer of the access transistor, to form at the main surface a pair of second impurity regions located at opposite sides of a region under the gate electrode layer of the driver transistor, and to form at the main surface a pair of third impurity regions located at opposite sides of a region under the gate electrode layer of the MIS transistor. The first, second and third impurity regions have impurity concentrations of $1 \times 10^{19} cm^{-3}$ or less. A silicide layer is formed in contact with a surface of one of the second impurity regions forming the source region of the driver transistor.

According to the method of manufacturing the semiconductor memory device of the above aspect of the invention, the source/drain regions of the respective transistors can be formed by performing ion-implantation only one time, so that the manufacturing process can be simplified.

Further, the method can provide an SRAM memory cell structure in which the junction leak current is reduced and the resistance against soft error is improved.

Preferably, in the above aspect, the step of forming the first impurity regions includes a step of implanting the impurity by a rotary implanting method.

Owing to implantation of the impurity by the rotary implanting method, the source region of the driver transistor can cover the whole surface of the silicide layer. Therefore, it is possible to prevent short circuit between the source region of the driver transistor and the semiconductor substrate by the silicide layer.

Preferably, in the above aspect, the first and second impurity regions are formed by introduction of arsenic, and the third impurity region is formed by introduction of phosphorus.

Owing to introduction of arsenic of a small diffusion coefficient for forming the source/drain regions of the access transistor, it is possible to prevent increase in the diffusion depth of one of the source/drain regions of the access transistor at the bottom of the groove, and the junction leak current can be reduced. Owing to introduction of phosphorus of a large diffusion coefficient into the source/drain regions of the peripheral circuit transistor, it is possible to moderate an impurity concentration profile at the junction between the drain region and the semiconductor substrate in the direction from the source region to the drain region, so that the drain electric field is relieved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 34A, 34B, 35A and 35B are schematic cross sections showing, in accordance with the order of steps, a method of manufacturing a semiconductor memory device of an embodiment 3 of the invention;

FIGS. 38 and 39 are schematic cross sections showing, in accordance with the order of steps, a method of manufacturing a semiconductor memory device of an embodiment 4 of the invention;

DESCRIPTION OF THE PREFERRED EMBODIMENTS

Figure 1:
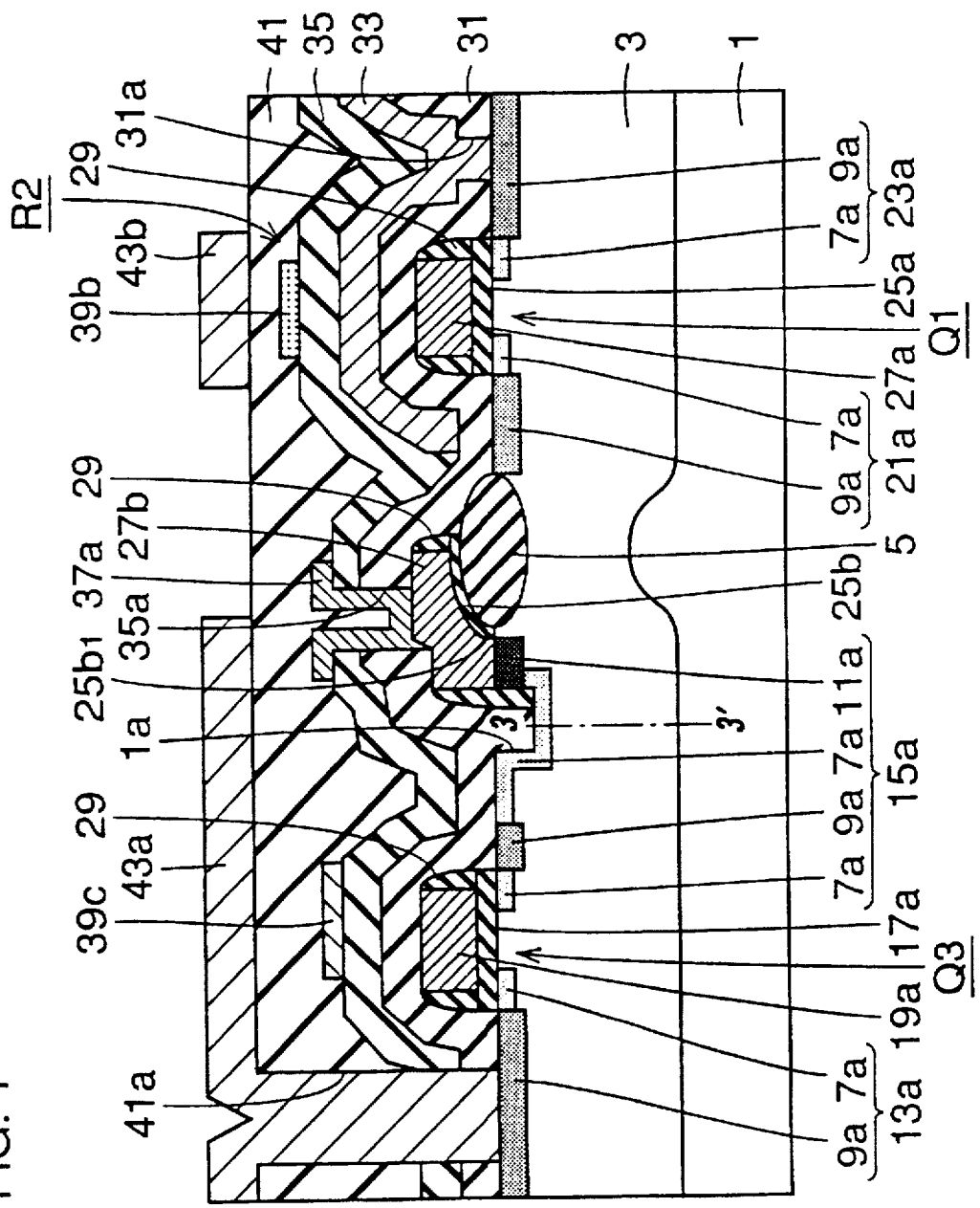
FIG. 1 is a schematic cross section showing a structure of a semiconductor memory device of an embodiment 1 of the invention.

Embodiments of the invention will now be described below with reference to the drawing.

Embodiment 1

Figure 2:
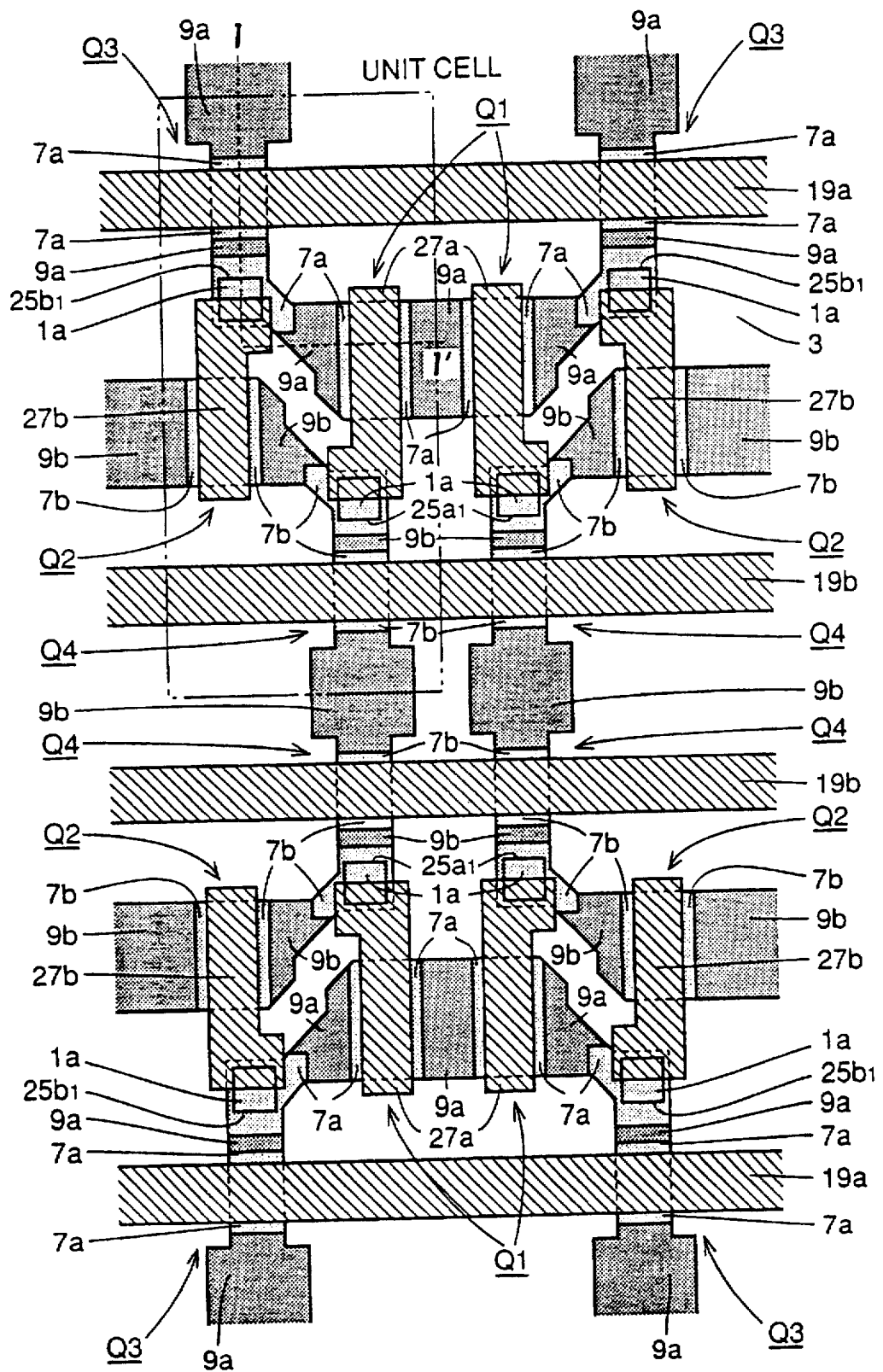
FIG. 2 is a fragmentary plan schematically showing the structure of the semiconductor memory device of the embodiment 1 of the invention.

FIG. 2 is a fragmentary plan of driver transistors and access transistors of a semiconductor memory device shown in FIG. 1, and shows a structure corresponding to four SRAM memory cells. FIG. 1 shows a section taken along line I—I'" in FIG. 2.

Figure 67:
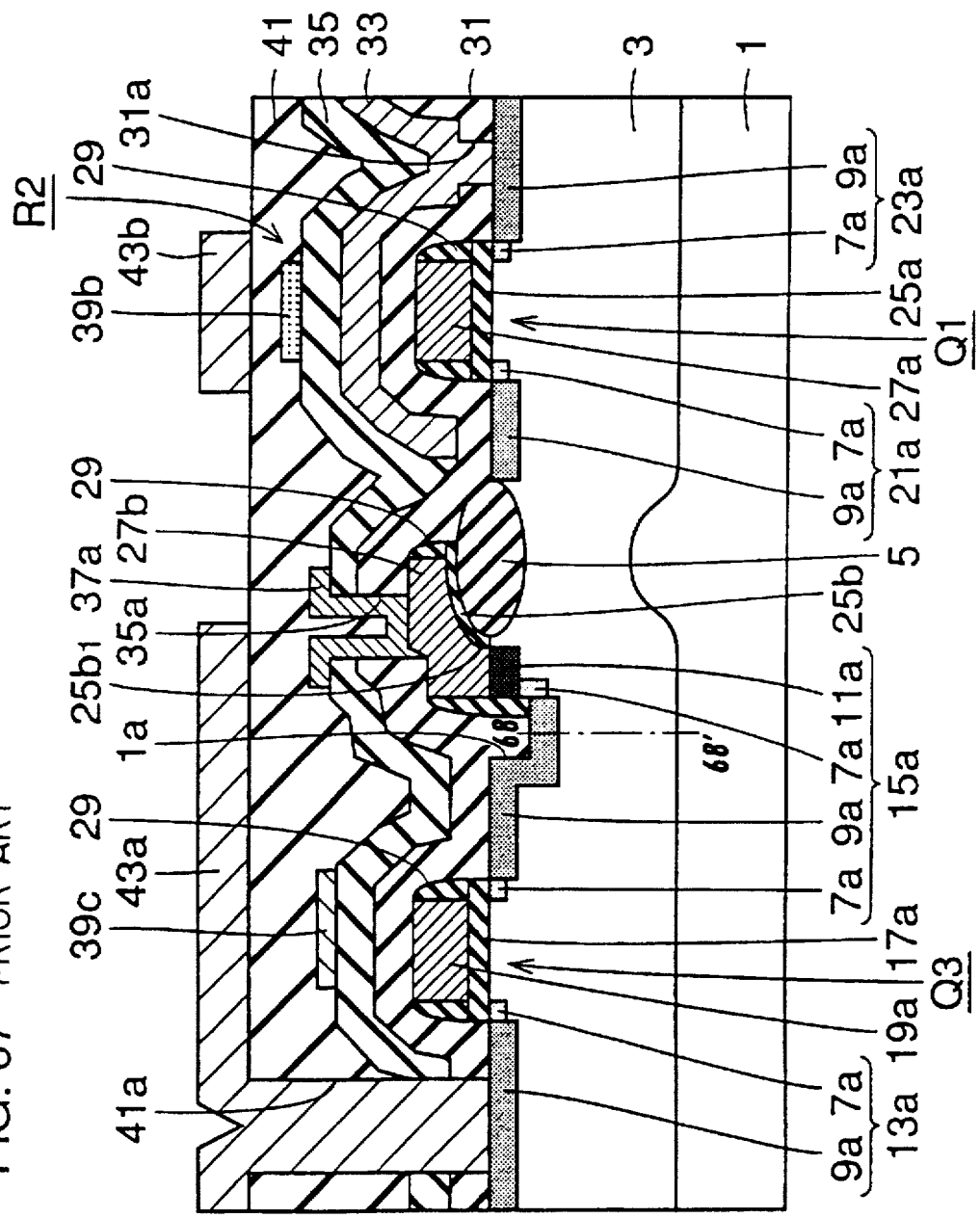
FIG. 67 is a schematic cross section showing a memory cell structure formed by partial overlapping of the opening pattern over the gate electrode layer.
Figure 68:
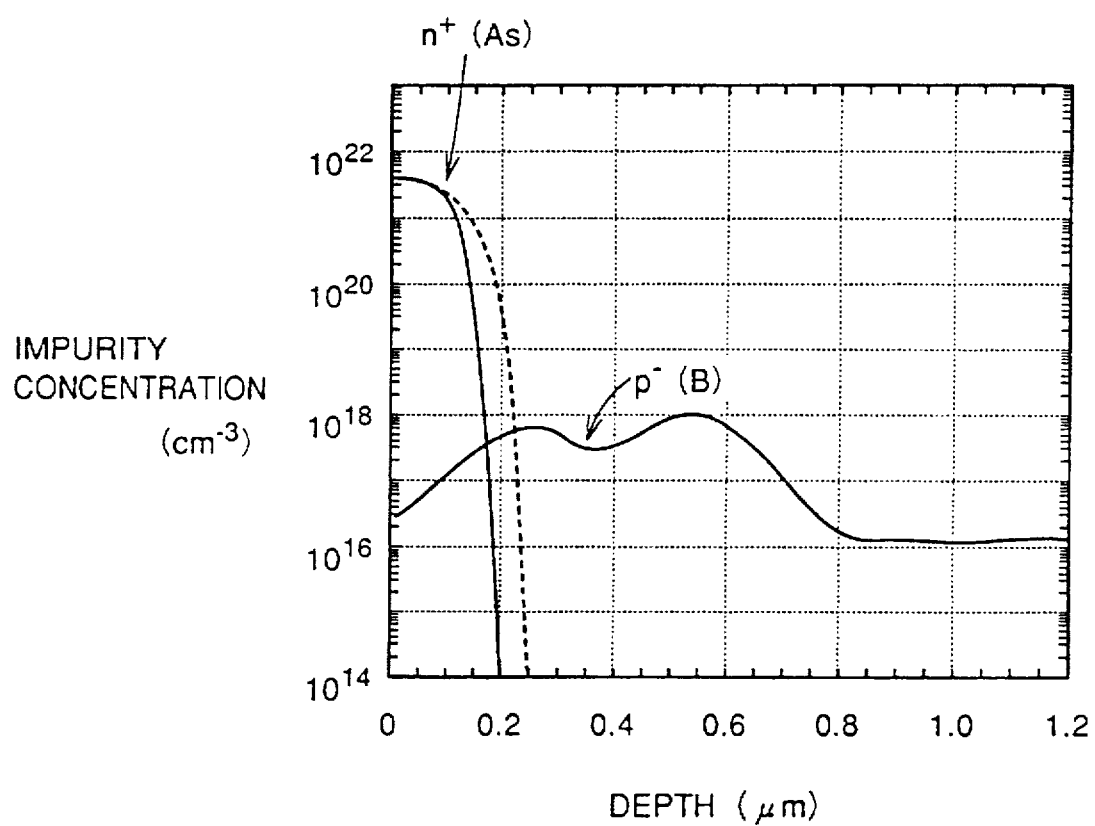
FIG. 68 is a graph showing a distribution of an impurity concentration along line 68—68' in FIG. 67.

Referring to FIGS. 1 and 2, the structure of this embodiment uses a so-called direct contact, and differs from the structure shown in FIG. 67 in a structure of an n-type region near a groove 1a.

Figure 65:
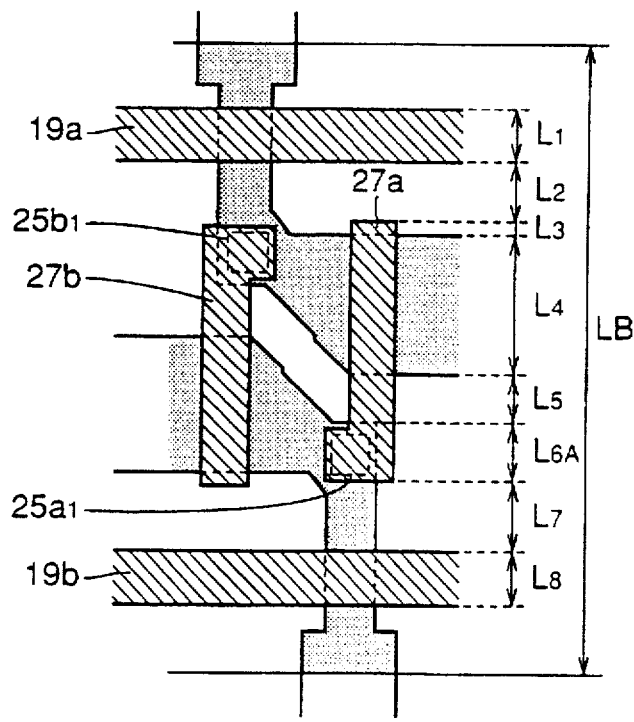
FIG. 65 is a fragmentary plan showing a size of a memory cell set by complete overlapping of the gate electrode layer over the opening pattern.
Figure 66:
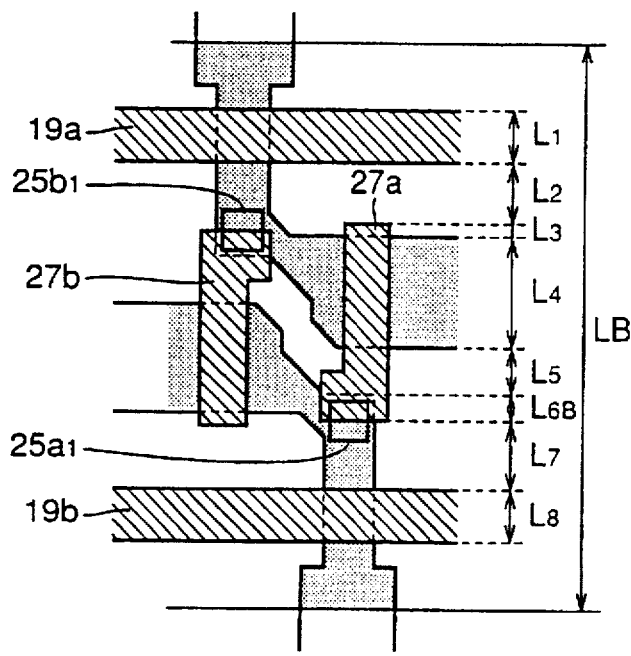
FIG. 66 is a fragmentary plan showing a size of a memory cell set by partial overlapping of the opening pattern over the gate electrode layer.

More specifically, n⁻-impurity regions 7a and 7b are formed at the whole bottom surface of each groove 1a.

n⁻-impurity region 7a located immediately under each side wall insulating layer 29 differs from the structure shown in FIG. 65 in that it extends toward the channel region. This is owing to the fact that ion implantation for forming n⁻-impurity region is performed by the tilt-angle rotary implantation.

n⁻-impurity region 7a has a diffusion depth smaller than n⁺-impurity region 9a. In other words, if the top surfaces of n⁻-impurity region 7a and n⁺-impurity region 9a were located on a common plane, the depth of n⁻-impurity region 7a from the common plan would be smaller than that of n⁺-impurity region 9a.

Since structures other than the above are substantially the same as those shown in FIG. 67, the same or similar portions and members bear the same reference characters, and will not be described below.

Figure 3:
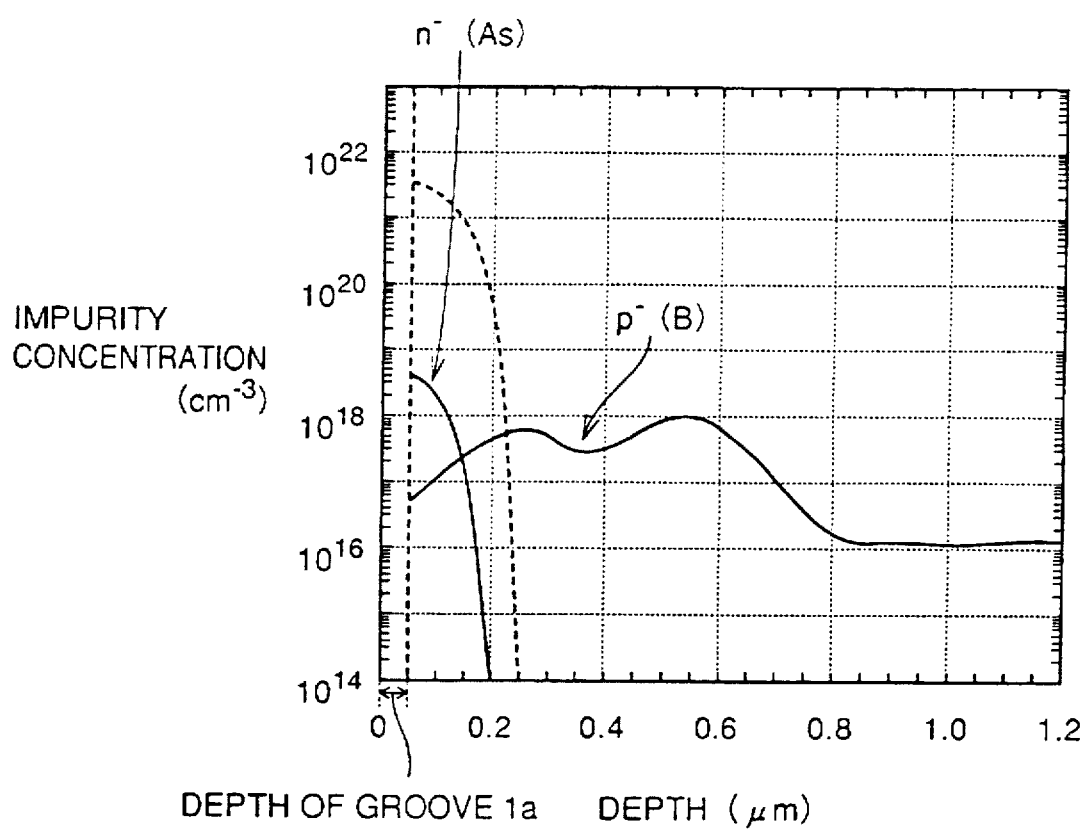
FIG. 3 is a graph showing a distribution of an impurity concentration along line 3—3' in FIG. 1.

Referring to FIG. 3, a p⁻-well region 3 has a distribution of impurity concentration of a so-called retrograde type, in which the p-type impurity concentration increases in accordance with increase in depth, e.g., from the substrate surface. In this distribution of p-type impurity concentration, an impurity concentration peak is formed at a depth of 0.2 to 0.3 μm by impurity implantation which is performed for controlling threshold voltages of the driver and access transistors. n⁻-impurity region 7a has an impurity concentration of $1 \times 10^{18}$ to $1 \times 10^{19} cm^{-3}$ at the impurity concentration peak.

In the graph, dotted line at a depth of 0.05 μm represents a position of the bottom surface of groove 1a.

A manufacturing method of this embodiment will now be described below.

FIGS. 4 to 10 show sections taken along line X—X' in FIGS. 11 to 17, respectively.

Figure 4:
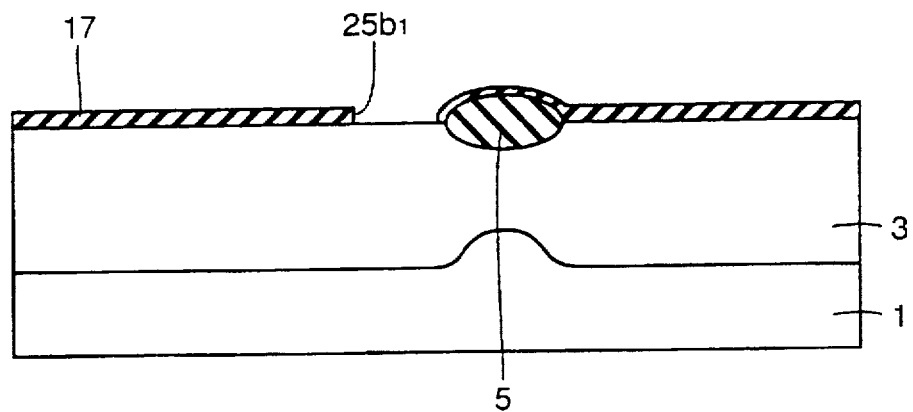
FIGS. 4 to 10 are schematic cross sections showing, in accordance with the order of steps, a method of manufacturing the semiconductor memory device of the embodiment 1 of the invention.
Figure 11:
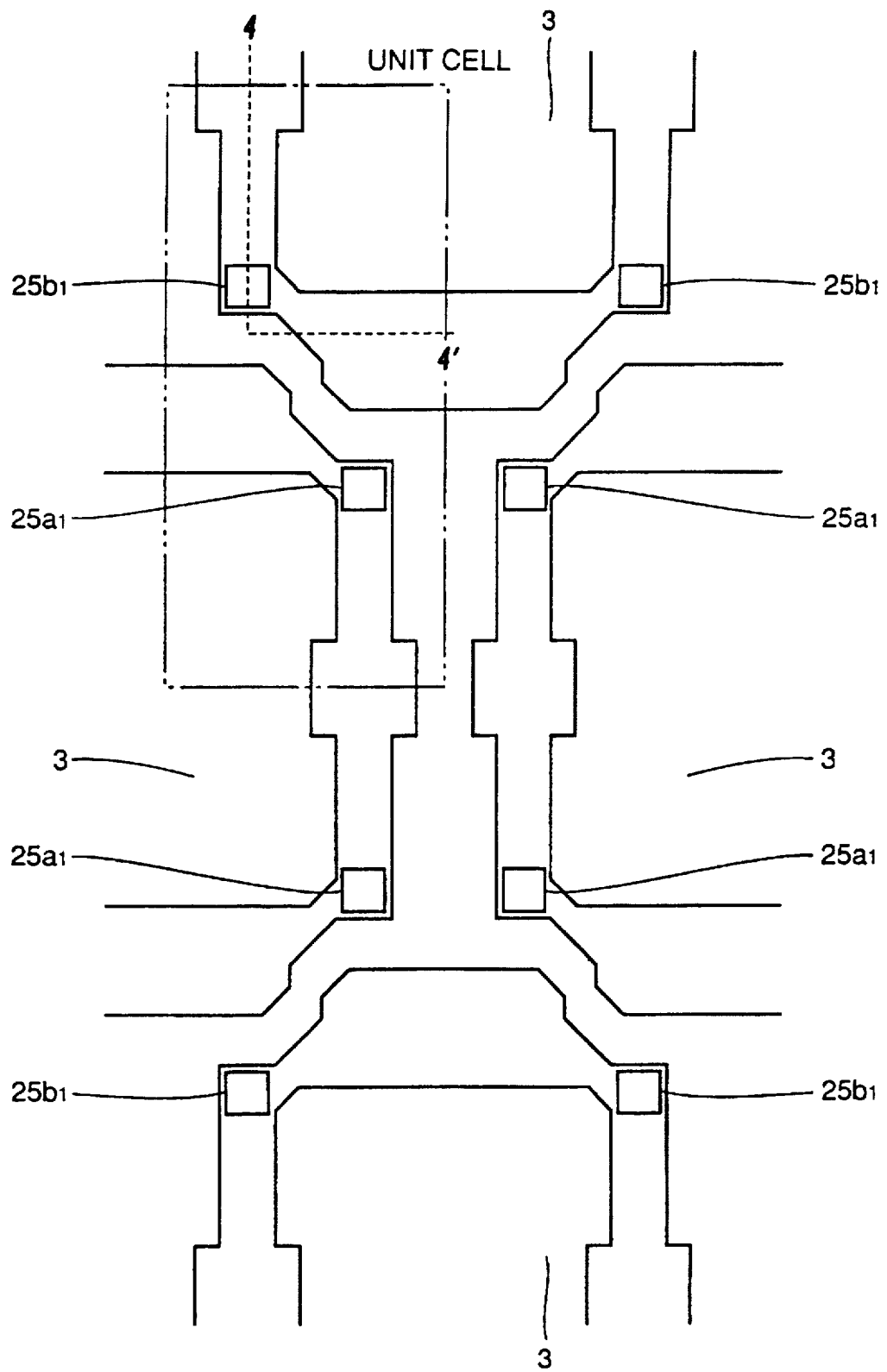
FIGS. 11 to 17 are fragmentary plans schematically showing, in accordance with the order of steps, the method of manufacturing the semiconductor memory device of the embodiment 1 of the invention.

Referring first to FIGS. 4 and 11, a field oxide film 5 of about 4000 Å in thickness made of silicon dioxide (SiO₂) is formed on n⁻-silicon substrate 1 by selective thermal oxidation such as a LOCOS (Local Oxidation of Silicon) method, which uses, for example, a silicon dioxide (SiO₂) film as a pad film and uses a silicon nitride (Si₃N₄) film as an oxidation-resistive mask.

Thereafter, the pad SiO₂ film and Si₃N₄ film used for the above selective thermal oxidation are removed to expose the surface of n⁻-silicon substrate 1.

Then, p-type impurity such as boron (B) is implanted into the whole surface of n⁻-silicon substrate 1 under the conditions, e.g., of about 200 to about 700 keV and about $1.0 \times 10^{12}$ to about $1.0 \times 10^{13} cm^{-2}$. This forms p⁻-well region 3 at the surface of n⁻-substrate 1. Thereafter, p-type impurity such as boron (B) is implanted under the conditions, e.g., of about 30 to about 70 keV and about $3.0 \times 10^{12} cm^{-2}$ to set a threshold voltage Vth of the access transistor and driver transistor. p⁻-well region 3 thus formed has an impurity concentration of about $1.0 \times 10^{16}$ to about $1.0 \times 10^{18} cm^{-3}$.

Processing such as thermal oxidation is effected on the whole surface to form a gate electrode layer 17, e.g., of about 100 Å in thickness made of SiO₂. A resist pattern having photoresist openings at predetermined positions is formed on the gate electrode layer by a photolithography technique. Using this resist pattern as a mask, gate electrode layer 17 is selectively removed with hydrofluoric acid (HF). Thereby, openings 25a₁ and 25b₁ are formed at predetermined positions of gate electrode layer 17. Then, the resist pattern is removed.

Figure 5:
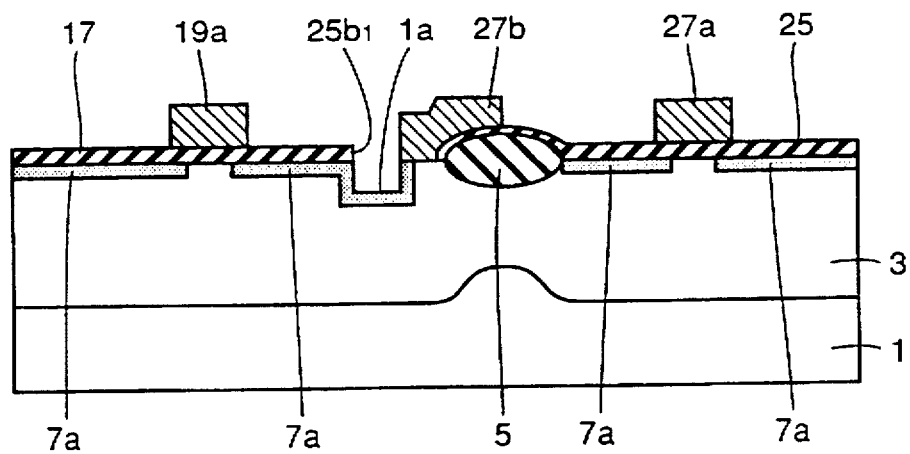
Figure 12:
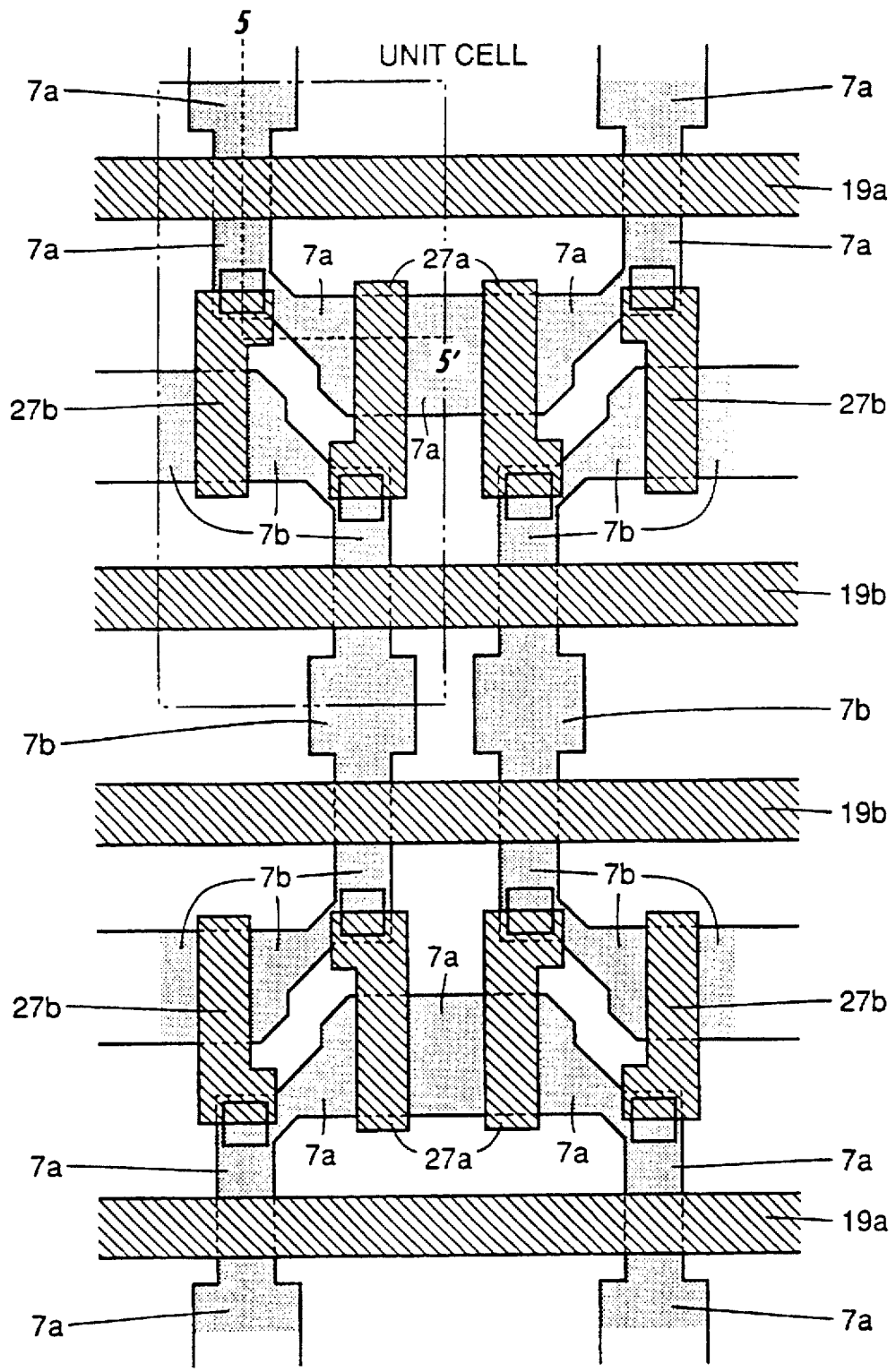

Referring to FIGS. 5 and 12, a method such as an LPCVD (Low Pressure Chemical Vapor Deposition) method with a gas containing phosphine (PH₃) or the like mixed thereinto is performed to deposit a phosphorus-doped polycrystalline silicon film having a thickness of about 1000 Å and a phosphorus concentration of about $1.0 \times 10^{20}$ to about $8.0 \times 10^{20} cm^{-3}$.

A resist pattern having a predetermined configuration is formed on the phosphorus-doped polycrystalline silicon film by the photolithography technique. Using this resist pattern as a mask, RIE (Reactive Ion Etching) is effected on the phosphorus-doped polycrystalline silicon film. Thereby, the phosphorus-doped polycrystalline silicon film is patterned to from word lines 19a and 19b as well as gate electrode layers 27a and 27b of driver transistors Q1 and Q2.

In the above processing, gate electrode layers 27a and 27b of driver transistors Q1 and Q2 are patterned to cover only portions of openings 25a₁ and 25b₁. Gate insulating layers, which function as an etching stopper in the process of patterning gate electrode layers 27a and 27b, do not exist at portions of openings 25a₁ and 25b₁ not covered with gate electrode layers 27a and 27b. Therefore, this etching also removes the surface of p⁻-well region 3 to from groove 1a of several hundreds to several thousands of angstroms in depth at p⁻-well region 3.

In this embodiment, gate electrode layers 27a and 27b as well as word lines 19a and 19b are made of only phosphorus-doped polycrystalline silicon layers. However, they may be formed of so-called polycide interconnections, each of which is made of a metal silicide film such as a tungsten silicide (WSi₂) film and a phosphorus-doped polycrystalline silicon film.

Thereafter, arsenic (As) is implanted through gate insulating layers 17 and 25 toward the whole surface of wafer, which is being rotated, with an energy of about 30 to about 50 keV, an implanting angle of, e.g., 45° and a dose of about $1.0 \times 10^{13}$ to about $5.0 \times 10^{13} cm^{-2}$. Thereby, n⁻-impurity region 7a is formed at surface regions of p⁻-well region 3 except for regions under field insulating layer 5, gate electrode layers 27a and 27b, and word lines 19a and 19b. n⁻-impurity region 7a has an impurity concentration of about $1 \times 10^{17}$ to about $1 \times 10^{19} cm^{-3}$. n⁻-impurity region 7a is formed by a so-called tilt-angle rotary implanting method, in which ion is implanted in an tilted direction into the wafer which is being rotated. Therefore, arsenic is implanted also into the side wall of groove 1a, and thus it is possible to prevent increase in a resistance of n⁻-impurity region 7a at the side wall of groove 1a.

Figure 6:
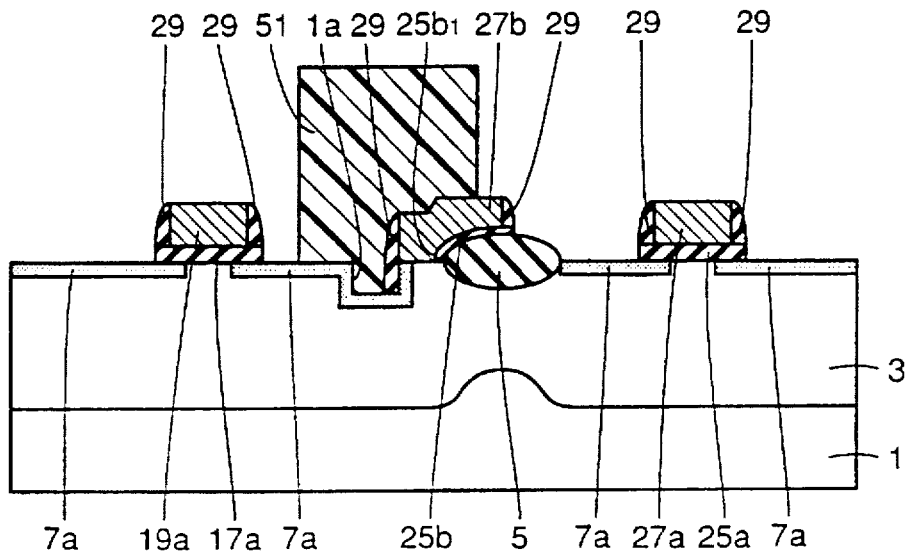
Figure 13:
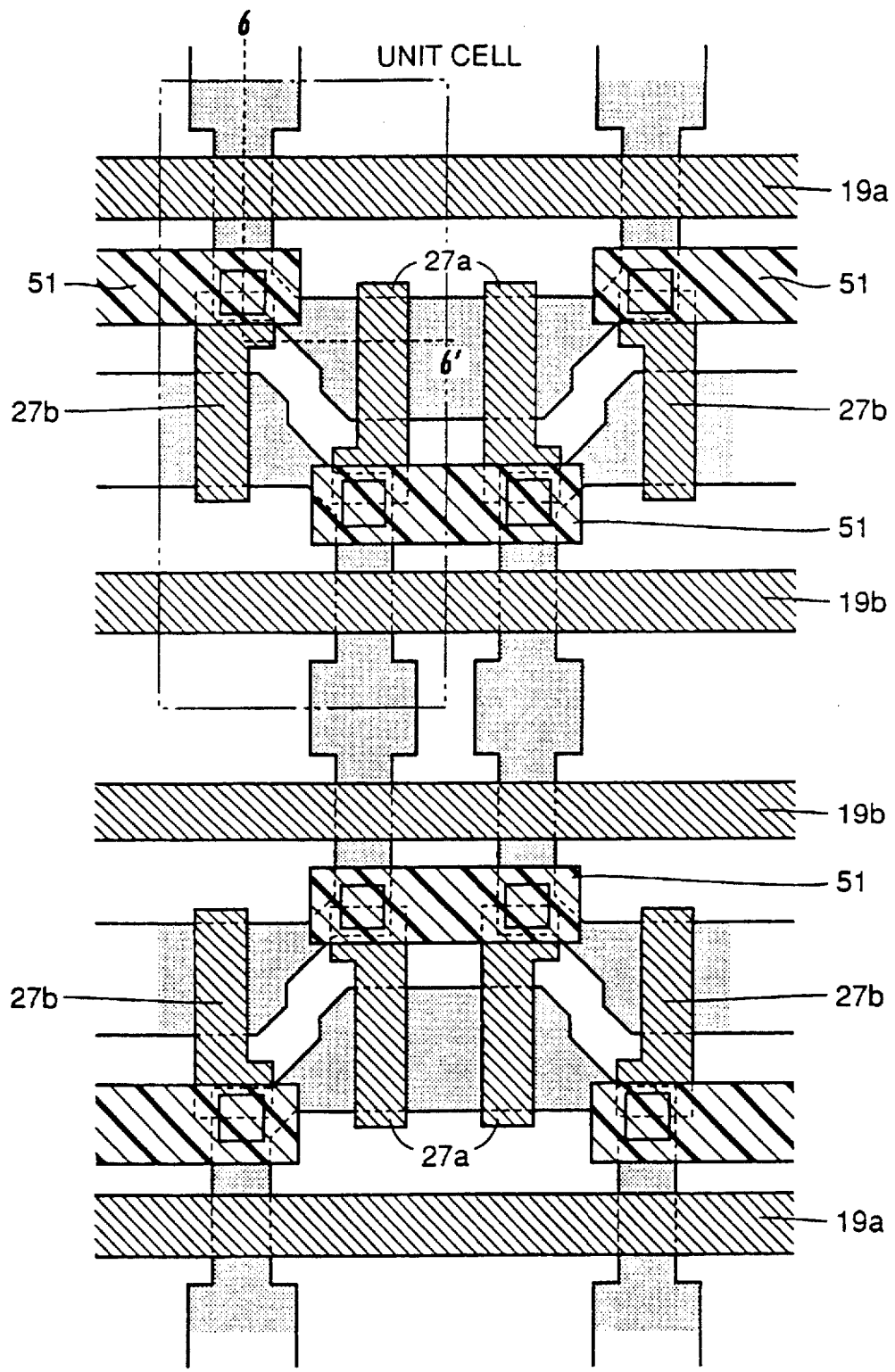

Referring to FIGS. 6 and 13, an SiO₂ film of about 800 Å in thickness is deposited on the whole surface by the LPCVD method. Thereafter, the whole surface of SiO₂ film is etched by RIE. Thereby, side wall oxide films 29 of about 500 to about 800 Å in width are formed at side walls of word lines 19a and 19b as well as side walls of gate electrode layers 27a and 27b.

Thereafter, a resist pattern 51 covering an upper portion of groove 1a is formed by the conventional photolithography technique. Using resist pattern 51, word lines 19a and 19b, gate electrode layers 27a and 27b, side wall insulating layers 29 and field insulating layer 5 as a mask, arsenic (As) is implanted with an energy of 50 keV and a dose of about $1.0 \times 10^{15}$ to about $5.0 \times 10^{15} cm^{-2}$. Thereafter, resist pattern 51 is removed.

Figure 7:
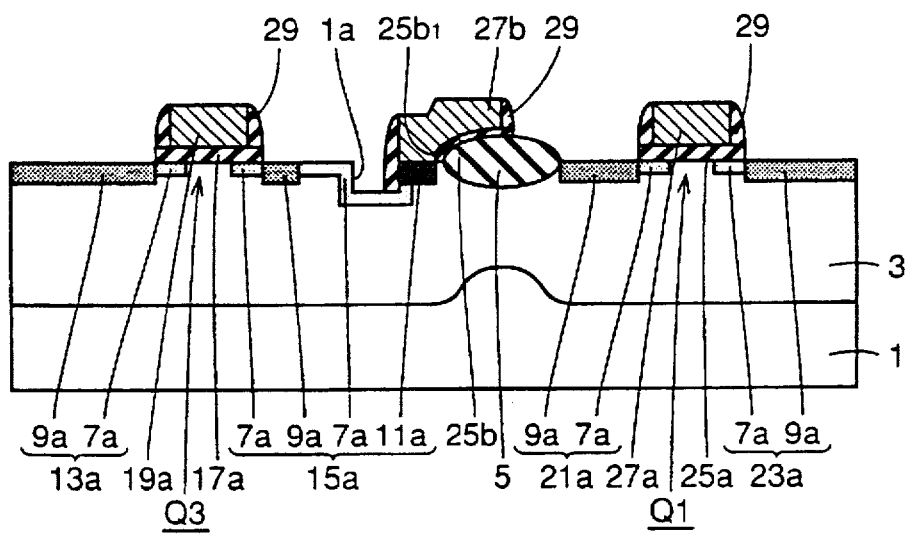
Figure 14:
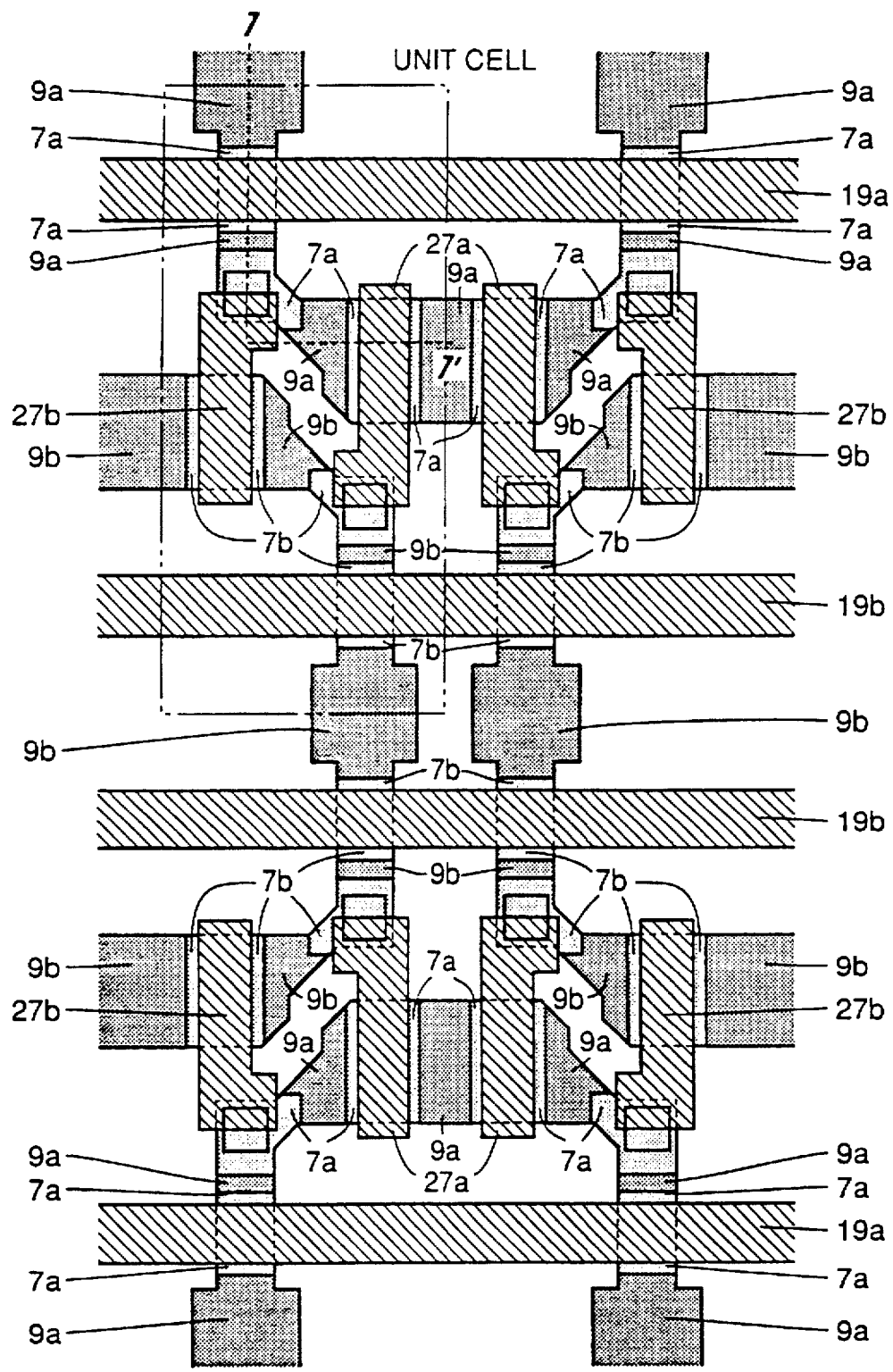

Referring to FIGS. 7 and 14, the implantation of arsenic forms each n⁺-impurity region 9a of an impurity concentration of about $1 \times 10^{20}$ to about $1 \times 10^{21} cm^{-3}$. n⁻-impurity region 7a and n⁺-impurity region 9a form a so-called LDD structure relieving an electric field near the drain.

Thereafter, thermal processing is performed, e.g., at a temperature of 850° C. for about 30 minutes, so that impurity in n⁻-impurity region 7a and n⁺-impurity region 9a are activated. In this manner, n⁻-impurity region 7a and n⁺-impurity region 9a are formed, but n⁺-impurity region 9a is not formed at the bottom of groove 1a. Therefore, a pn junction between n⁻-impurity region 7a and p⁻-well region 3 is formed at the bottom of groove 1a. Accordingly, the pn junction between n⁻-impurity region 7a and p⁻-well region 3 is formed at a shallower position than the structure in which n⁺-impurity region 9a is formed at the bottom of groove 1a.

Figure 19:
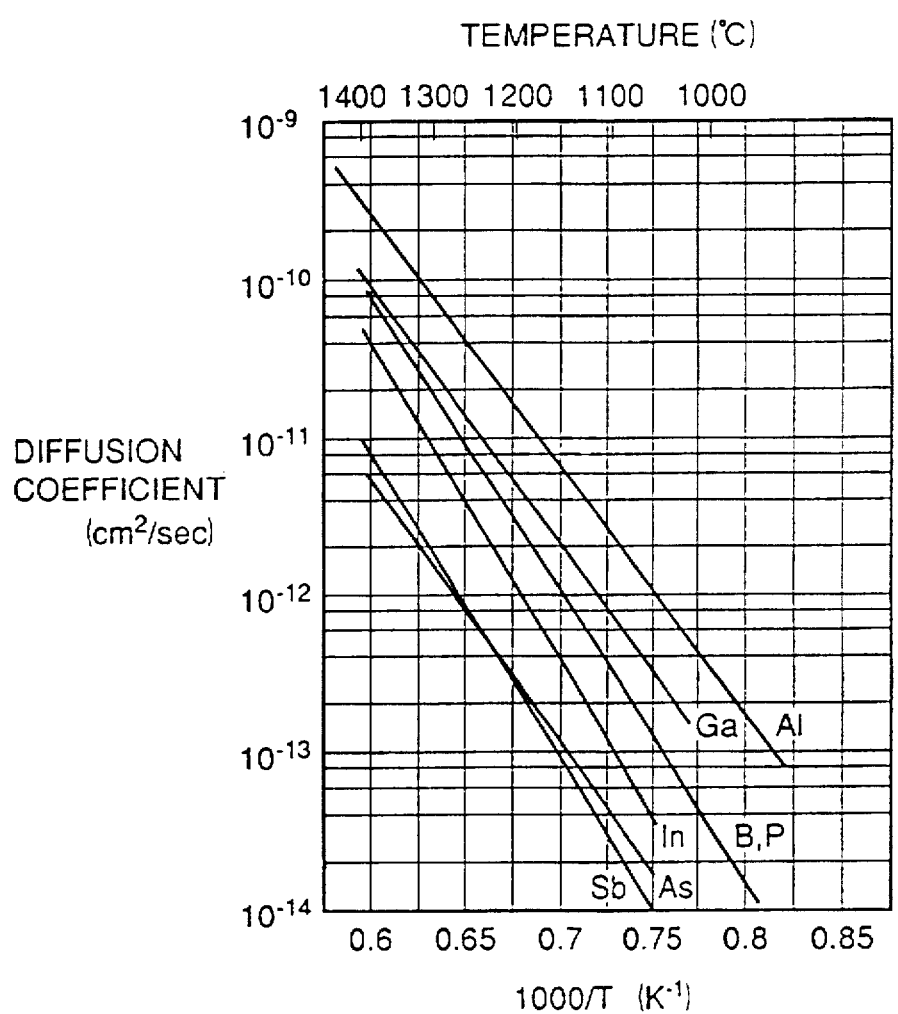
FIG. 19 is a graph showing change in a diffusion coefficient with respect to a temperature of several kinds of impurity.

Although the embodiment described above uses arsenic (As) for forming n⁻-impurity region 7a, other n-type impurity such as phosphorus (P) may be used. However, as shown in FIG. 19, arsenic (As) and antimony (Sb) having a smaller diffusion coefficient that phosphorus are preferable when the impurity is to be selected in view of formation of the pn junction between n⁻-impurity region 7a and p⁻-well region 3 at a shallow position.

Owing to the thermal processing for activating impurity in n⁺-impurity region 9a and others, impurity in gate electrode layers 27a and 27b diffuses into p⁻-well region 3, so that n-type regions 11a are formed. As a result, each of gate electrode layers 27a and 27b of driver transistors Q1 and Q2 is electrically connected to n⁻-impurity region 7a via n-type region 11a.

Figure 8:
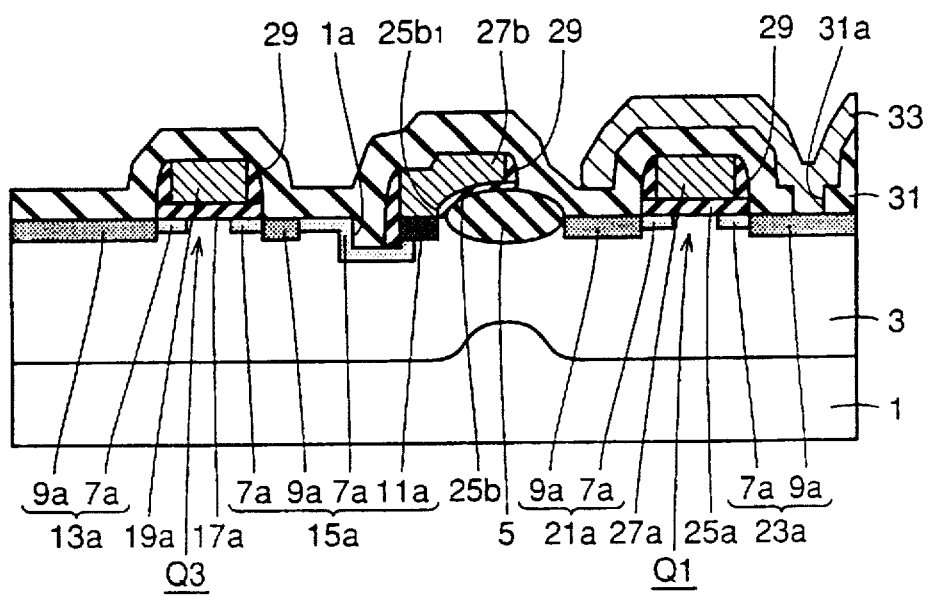
Figure 15:
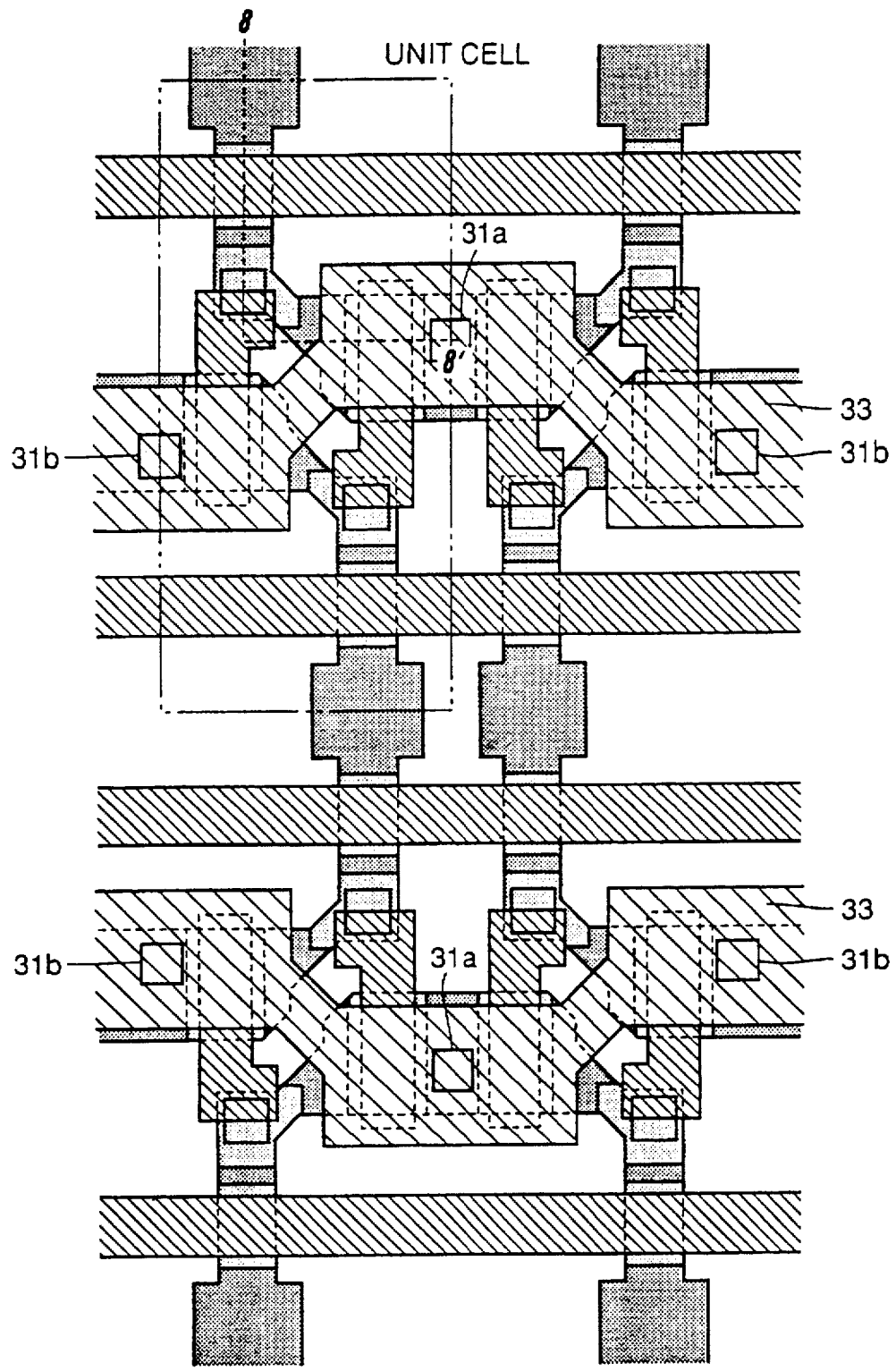

Referring to FIGS. 8 and 15, an interlayer insulating layer 31 of about 1500 Å in thickness made of SiO₂ is formed on the whole surface by the LPCVD method. Then, interlayer insulating layer 31 is selectively removed by the photolithography technique and RIE method. Thereby, contact holes 31a and 31b reaching source regions 9a of driver transistors Q1 and Q2 are formed at interlayer insulating layer 31.

Then, the LPCVD method is executed to deposit the phosphorus-doped polycrystalline silicon film having a thickness of about 1000 Å and a phosphorus concentration of about $1.0\times10^{20}$ to about $8.0\times10^{20} cm^{-3}$. Thereafter, the metal silicide film, e.g., of a tungsten silicide (WSi₂) film of about 1000 Å in thickness is deposited on the phosphorus-doped polycrystalline silicon film.

By the photolithography technique and RIE method, the tungsten silicide film and phosphorus-doped polycrystalline silicon film are continuously patterned to form ground interconnection layers 33. Ground interconnection layers 33 are electrically connected to source regions 9a and 9b of driver transistors Q1 and Q2 through contact holes 31a and 31b, respectively.

Figure 9:
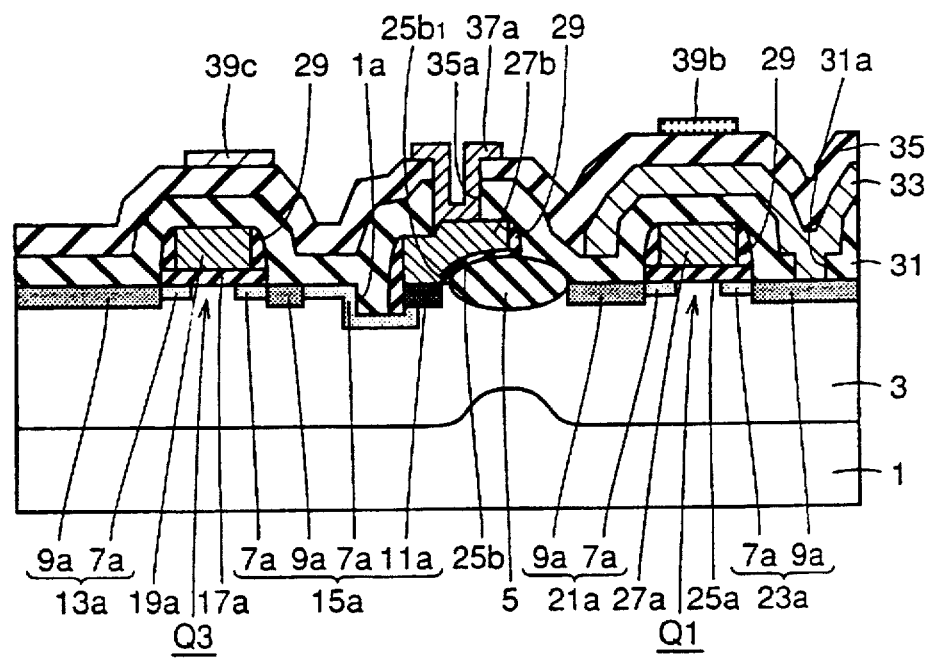
Figure 16:
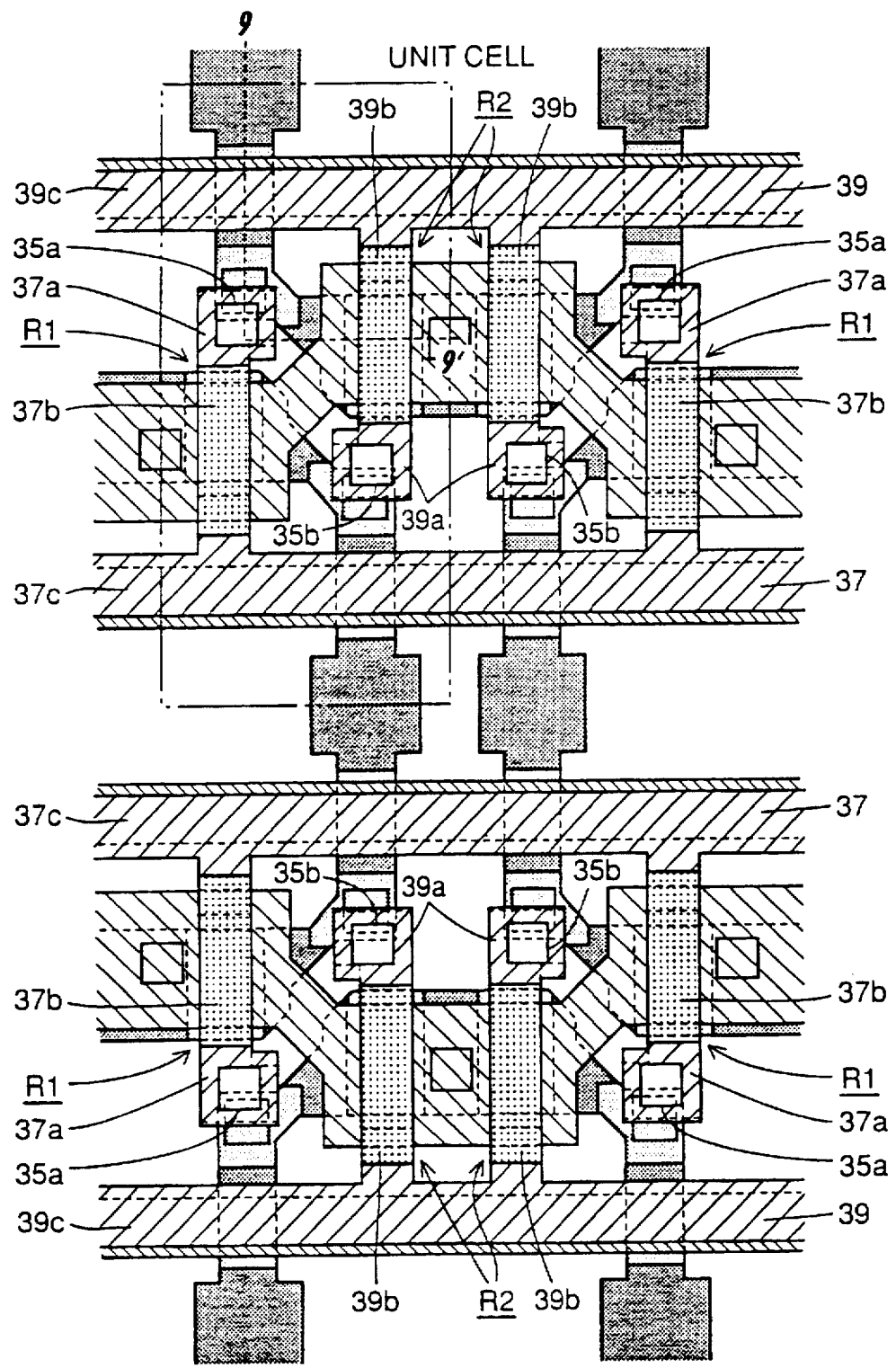

Referring to FIGS. 9 and 16, an interlayer insulating layer 35 of about 1500 Å in thickness made of SiO₂ is deposited on the whole surface by the LPCVD method. Then, interlayer insulating layer 35 is selectively removed by the photolithography technique and RIE method. Thereby, contact holes 35a and 35b reaching portions of the surfaces of gate electrode layers 27a and 27b of driver transistors Q1 and Q2 are formed at interlayer insulating layer 35.

The LPCVD method is executed to deposit a polycrystalline silicon film of about 1000 Å in thickness. Then, impurity such as phosphorus (P) is implanted into the polycrystalline silicon film with an energy of 30 keV and a dose of $1.0\times10^{12}$ to $1.0\times10^{14} cm^{-2}$. By the photolithography technique and RIE method, the phosphorus-doped polycrystalline silicon film is patterned to form first and second doped polycrystalline silicon films 37 and 39.

Thereafter, a resist pattern is formed by the photolithography technique on regions which will form resistance portions of first and second doped polycrystalline silicon films 37 and 39. Using this resist pattern as a mask, impurity such as arsenic (As) is implanted into first and second doped polycrystalline silicon films 37 and 39 with an energy of 50 keV and a dose of about $1.0\times10^{15}$ to about $5.\times10^{15} cm^{-2}$.

Thereafter, the resist pattern is removed. Annealing is performed, e.g., at a temperature of 750° C. to 850° C. for 30 minutes. This activates the impurity to form low resistance regions 37a, 37c, 39a and 39c and high resistance regions 37b and 39b at first and second doped polycrystalline silicon films 37 and 39.

Low resistance regions 37c and 39c form Vcc interconnections, and high resistance regions 37b and 39b form high resistances R1 and R2 which form load elements, respectively. Low resistance regions 37a and 39a form interconnections for connecting gate electrode layers 27a and 27b of driver transistors Q1 and Q2 to high resistance regions 37b and 39b, respectively. High resistance regions 37b and 39b have a sheet resistance of about several GΩ/□ to several TΩ/□.

Figure 10:
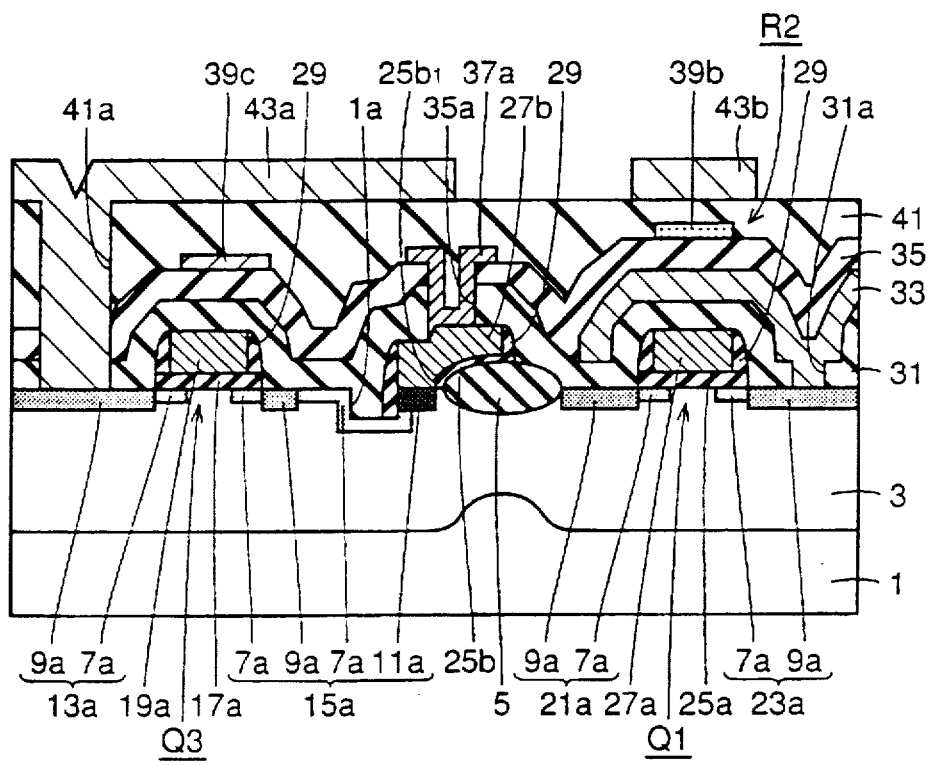
Figure 17:
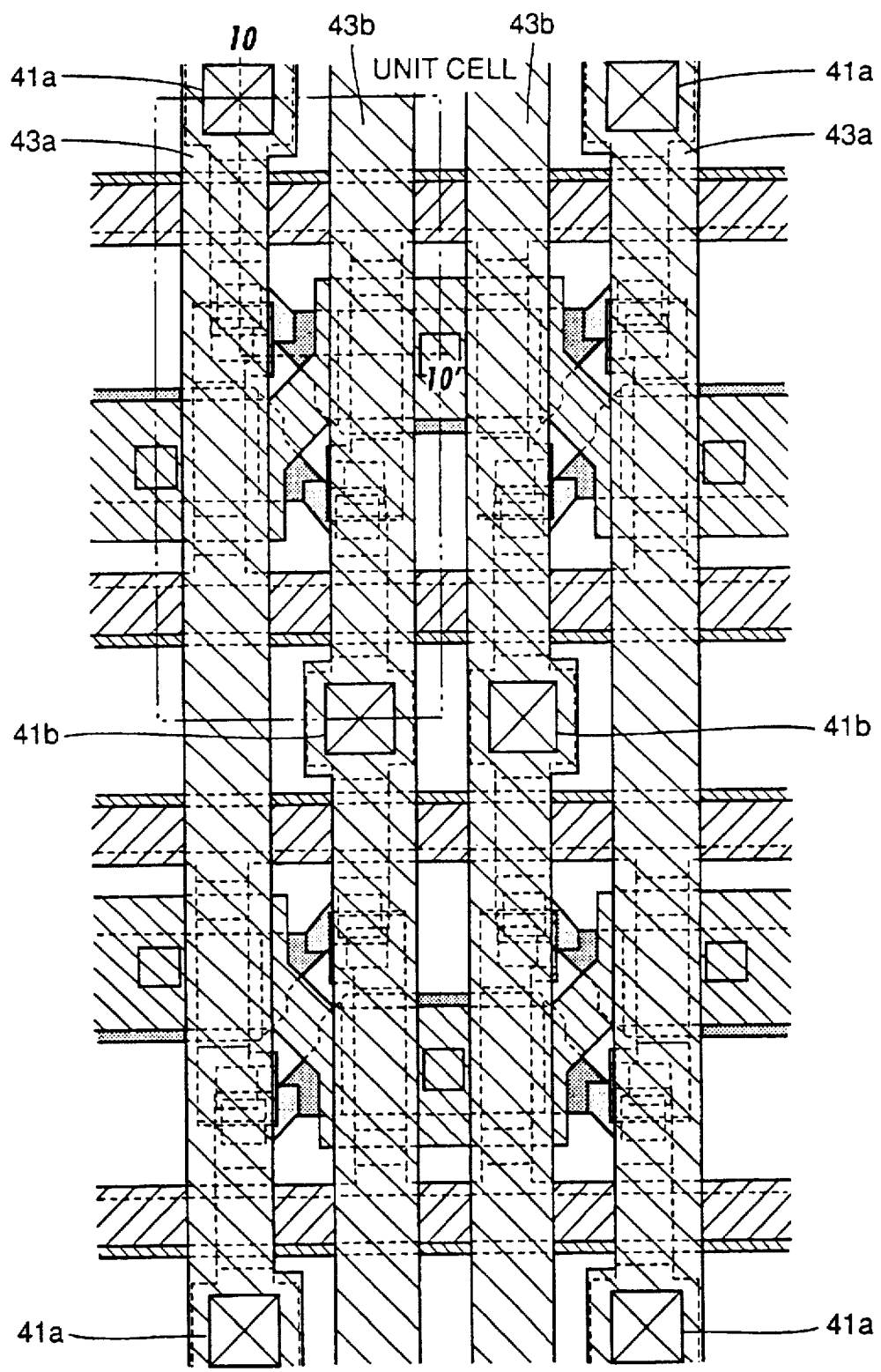

Referring to FIGS. 10 and 17, an interlayer insulating layer 41 covering first and second doped polycrystalline silicon films 37 and 39 is formed similarly to an ordinary LSI (Large Scale Integrated Circuit). Thereafter, contact holes 41a and 41b, which reach the others of source/drain regions 9a and 9b of access transistors Q3 and Q4, respectively, are formed at interlayer insulating layers 31, 35 and 41 by the photolithography technique and RIE method. Processing is performed to form bit lines 43a and 43b of intended configurations, which are made of aluminum and have portions electrically connected to the others of source/drain regions 9a of access transistors Q3 and Q4 through contact holes 41a and 41b, respectively.

In the structure of the semiconductor memory device of this embodiment, only n⁻-impurity region 7a is formed at the bottom of groove 1a as shown in FIG. 1. n⁻-impurity region 7a has a diffusion depth smaller than that of n⁺-diffusion region 9a. Therefore, a depth of the pn junction between n⁻-impurity region 7a and p⁻-well region 3 is smaller than that of the pn junction between n⁺-impurity region 9a and p⁻-well region 3 shown in FIG. 65. The p-type impurity concentration of p⁻-well region 3 decreases as the position moves toward the substrate surface, as shown in FIG. 3. Therefore, the impurity concentration of p⁻-well region at a position of junction to n⁻-impurity region 7a formed at the bottom of groove 1a can be smaller than that in the structure where n⁺-impurity region 9a is formed at the bottom of groove 1a. Accordingly, it is possible to reduce a leak current at the junction between n⁻-impurity region 7a and p⁻-well region 3.

Figure 18:
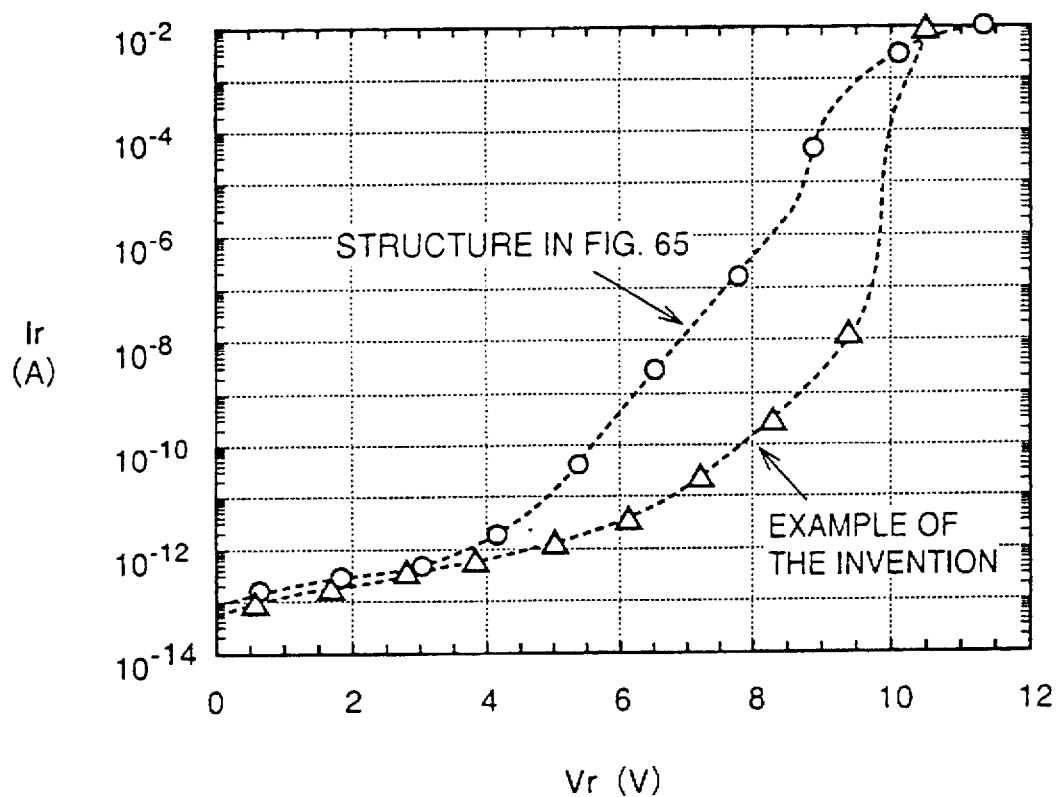
FIG. 18 is a graph showing change in leak currents in the embodiment and a structure shown in FIG. 65.

FIG. 18 shows effects of reducing junction leak current Ir by the example manufactured by the manufacturing method of the embodiment and the structure shown in FIG. 65. As is apparent from FIG. 18, leak current Ir in the structure of the invention can be smaller than that in the structure shown in FIG. 65 when an equal voltage Vr is applied in both the structures.

Since the structure is provided with groove 1a and n⁻-impurity region 7a is formed at the bottom thereof, a depth of junction between n⁻-impurity region 7a and p⁻-well region 3 can be larger than that in the conventional structure (FIG. 55) not provided with the groove. Therefore, the impurity concentration of p⁻-well region 3 at the position of junction to n⁻-impurity region 7a formed at the bottom of groove 1a can be larger than that in the conventional structure described before. Accordingly, the junction capacity can be larger than that in the conventional structure already described, and the capacity of the storage node can be increased, so that the resistance against soft error can be improved.

In connection with improvement in the resistance against soft error described above, the inventors and others made the following experiment. Three kinds of specimens shown at in FIGS. 20A, 20B and 20C were prepared.

Figure 20A:
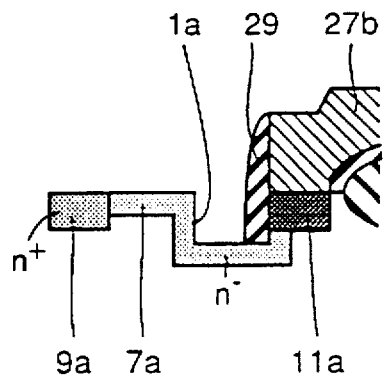
FIGS. 20A, 20B and 20C show fragmentary sections of structures of specimens used in an experiment.
Figure 20B:
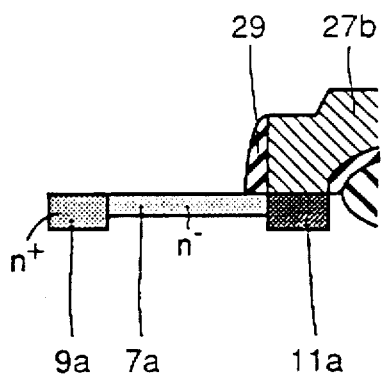
Figure 20C:
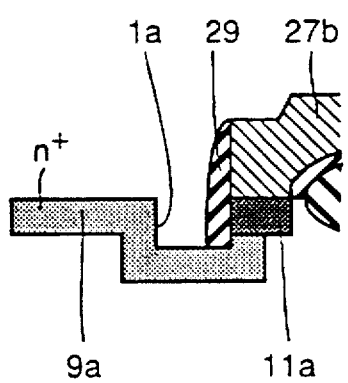
Figure 55:
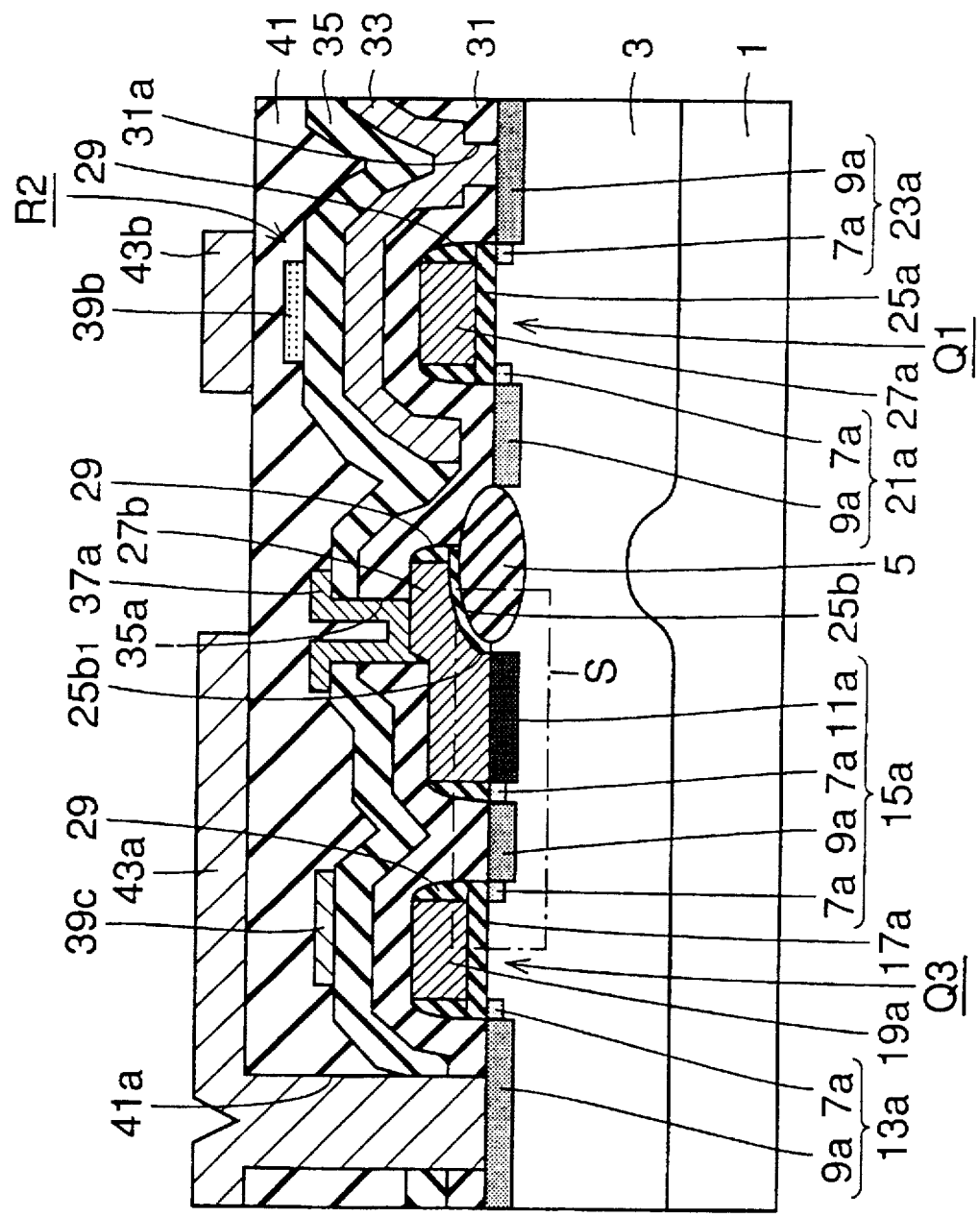
FIG. 55 is a schematic cross section showing a memory cell structure of a conventional SRAM using direct contact.
Figure 56:
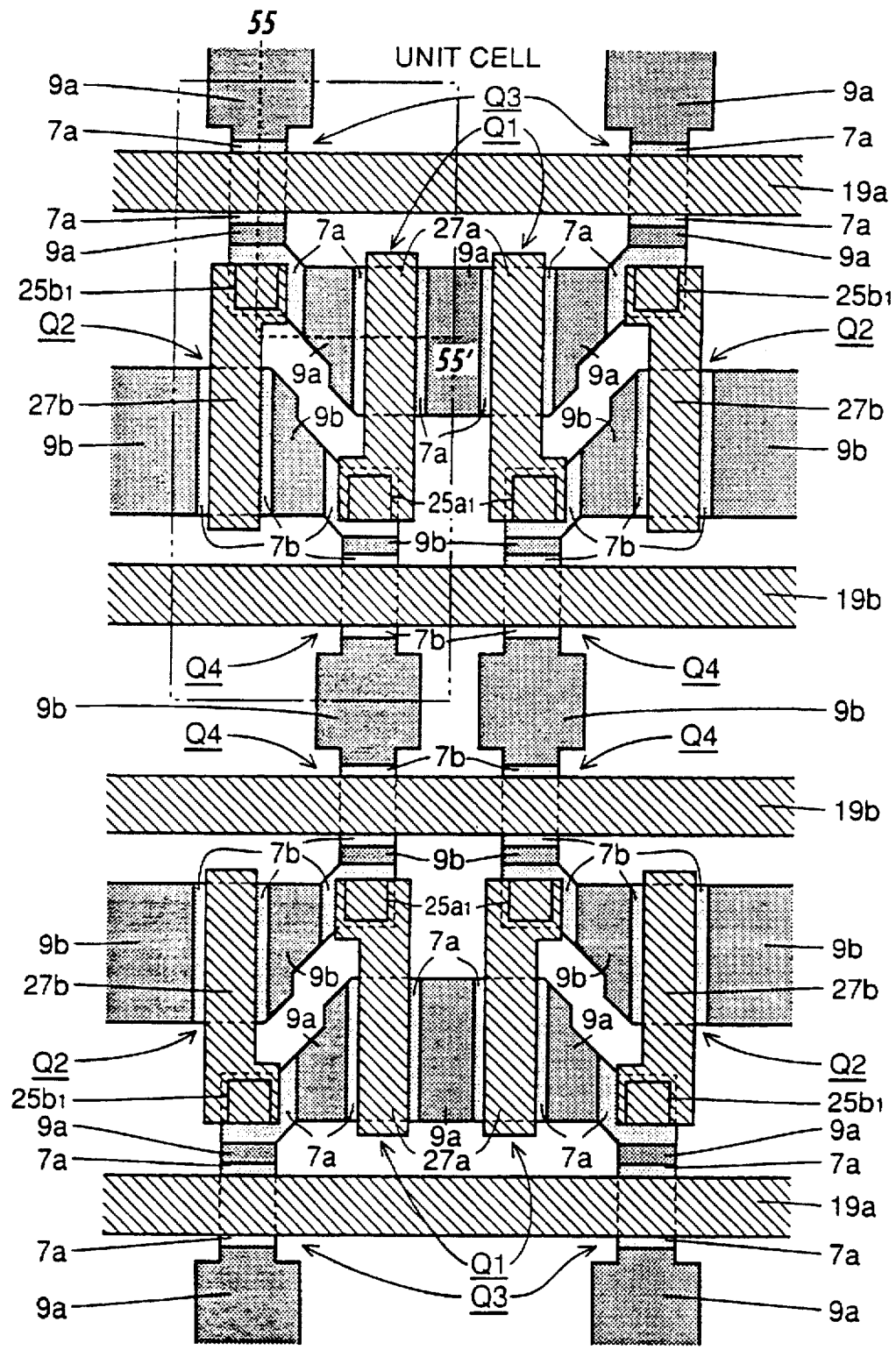
FIGS. 56 to 59 are fragmentary plans showing, in accordance with an ascending order, memory cell structures at different levels of the conventional SRAM using direct contact.
Figure 57:
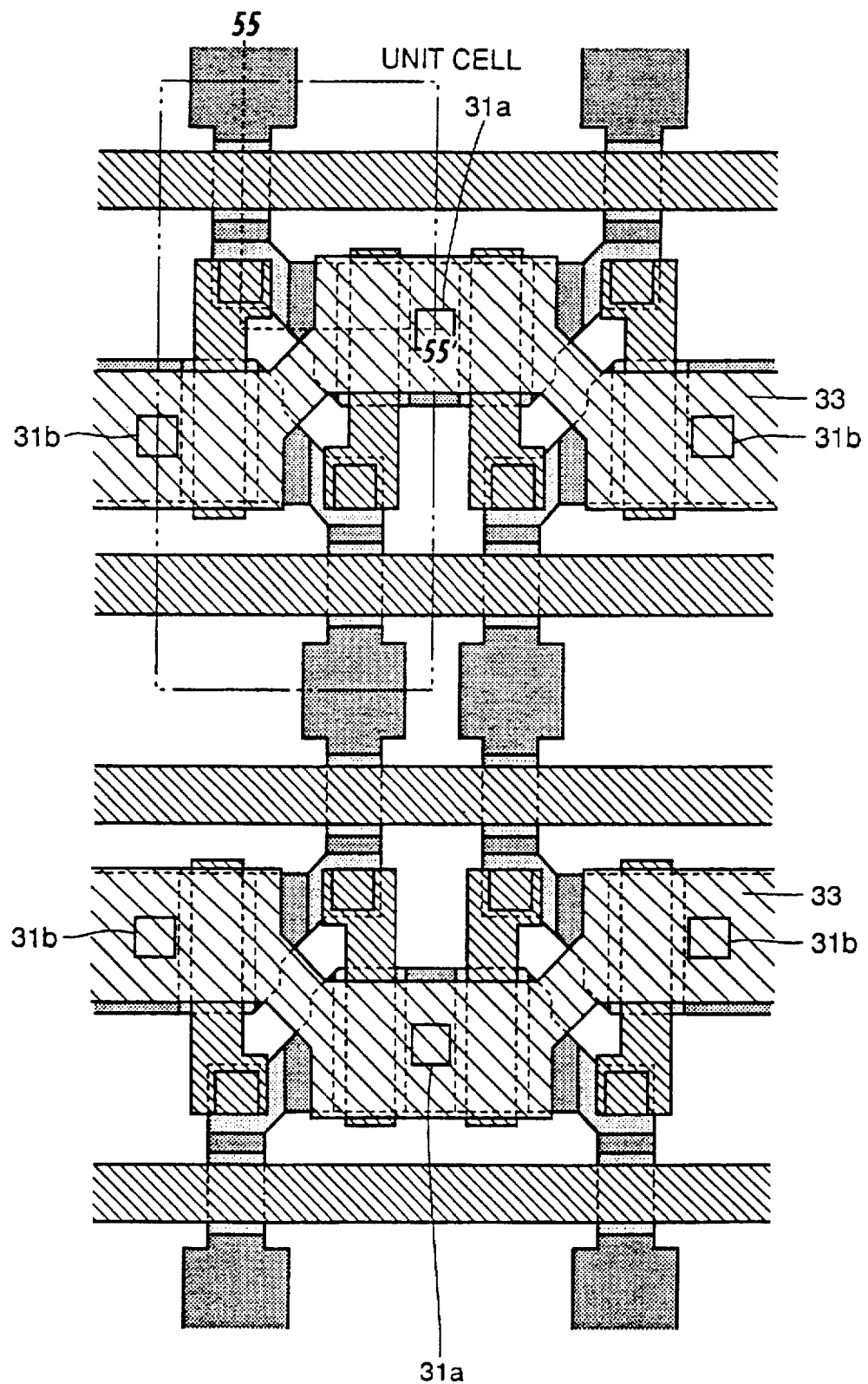
Figure 58:
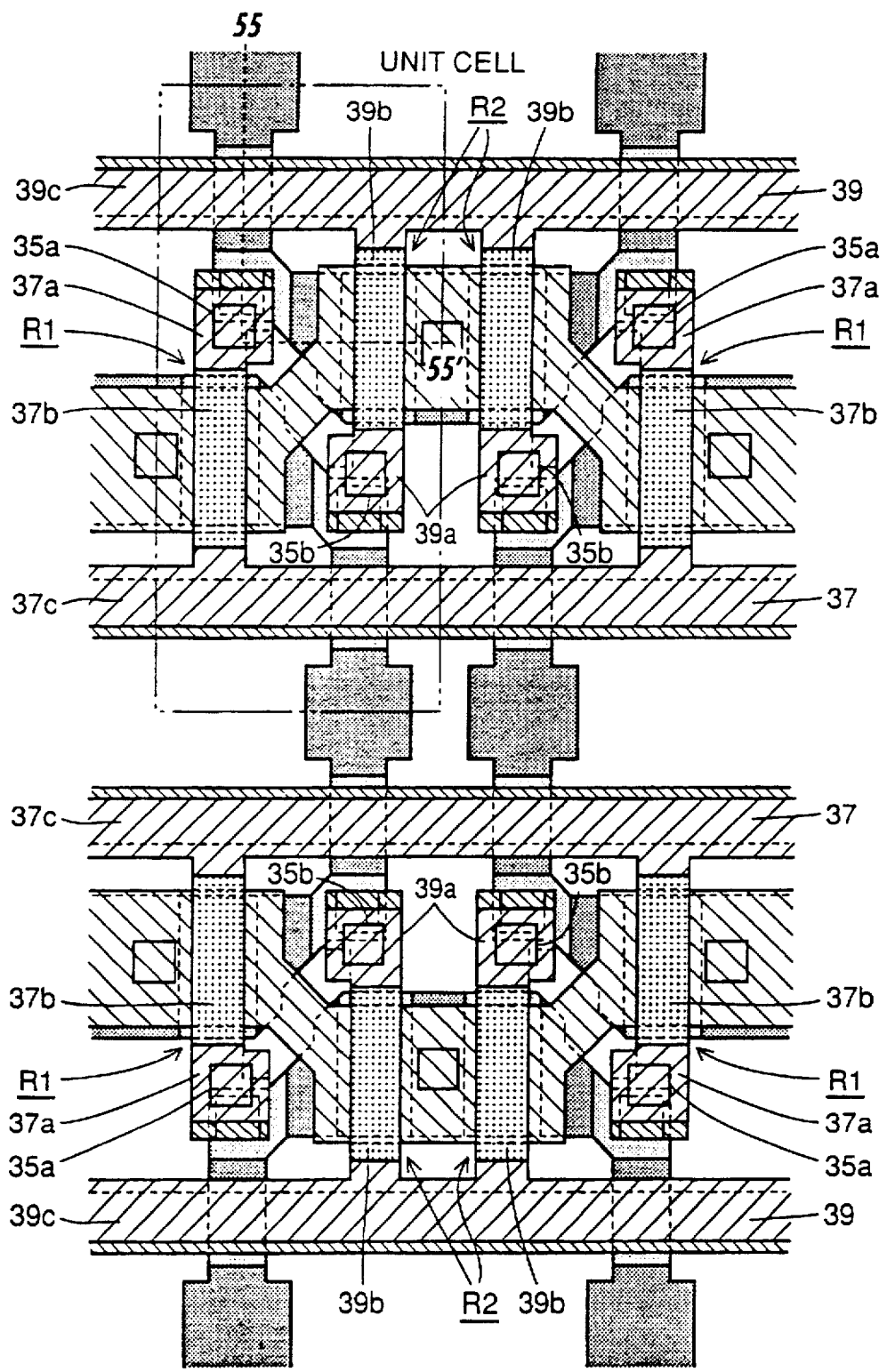
Figure 59:
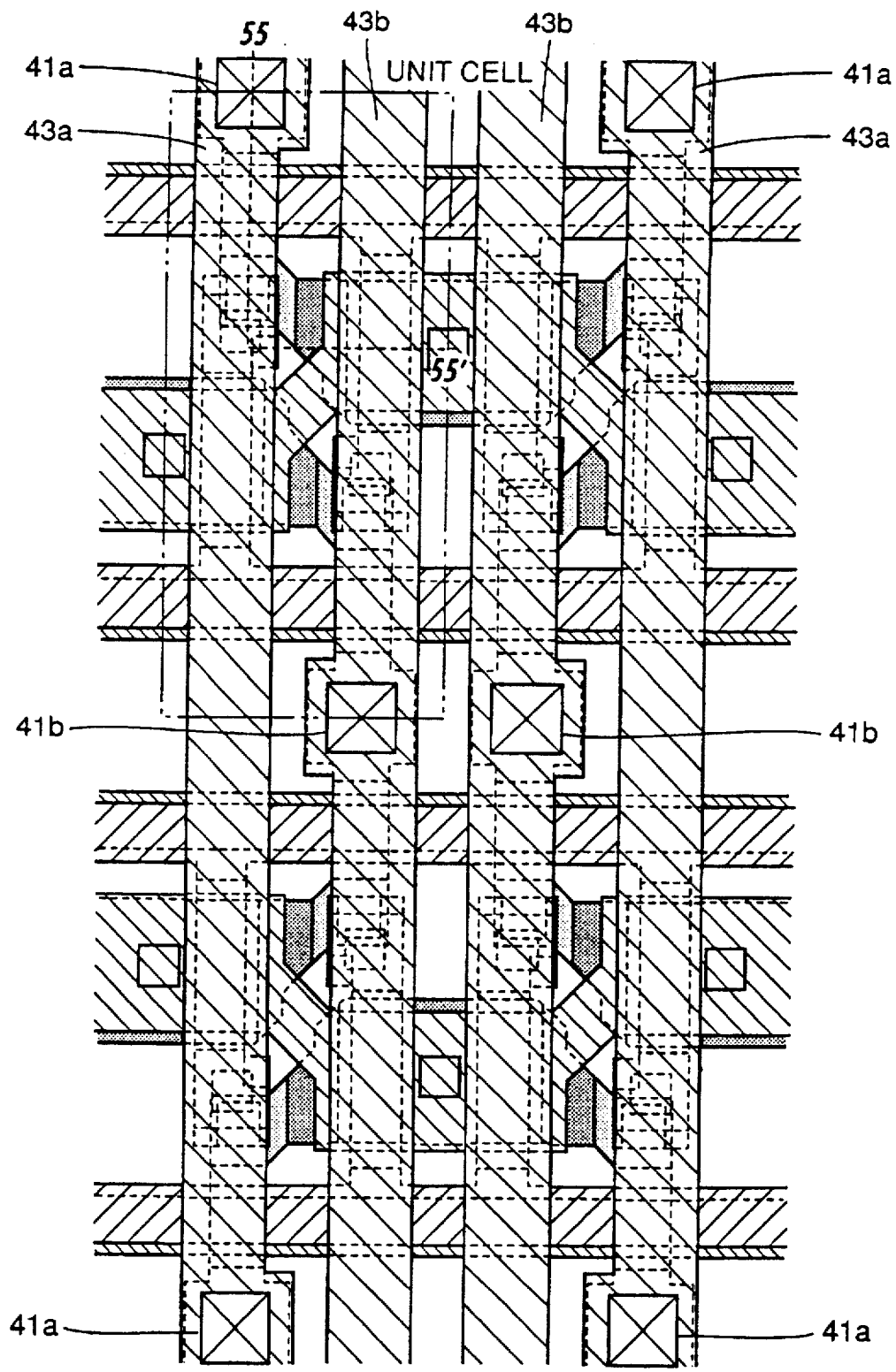

FIGS. 20A, 20B and 20C show fragmentary sections of structures corresponding to region S in FIG. 55. More specifically, FIG. 20A shows a structure of an example of the invention shown in FIG. 10, FIG. 20B shows a structure similar to that shown in FIG. 55, and FIG. 20C shows a structure similar to that shown in FIG. 65.

The structure shown in FIG. 20C differs from the structure shown in FIG. 65 in that $n^+$-impurity region 9a covers the whole bottom surface of groove 1a. In each of specimens in FIGS. 20A and 20C, a magnitude (depth) of a step defined by groove 1a is 500 Å.

For each specimen, a rate of soft error occurrence (which will be referred to as a soft error rate hereinafter) with various values of Vcc was determined. For the soft error rate, normalized S. E. R. was used. The results are shown in FIG. 21.

Figure 21:
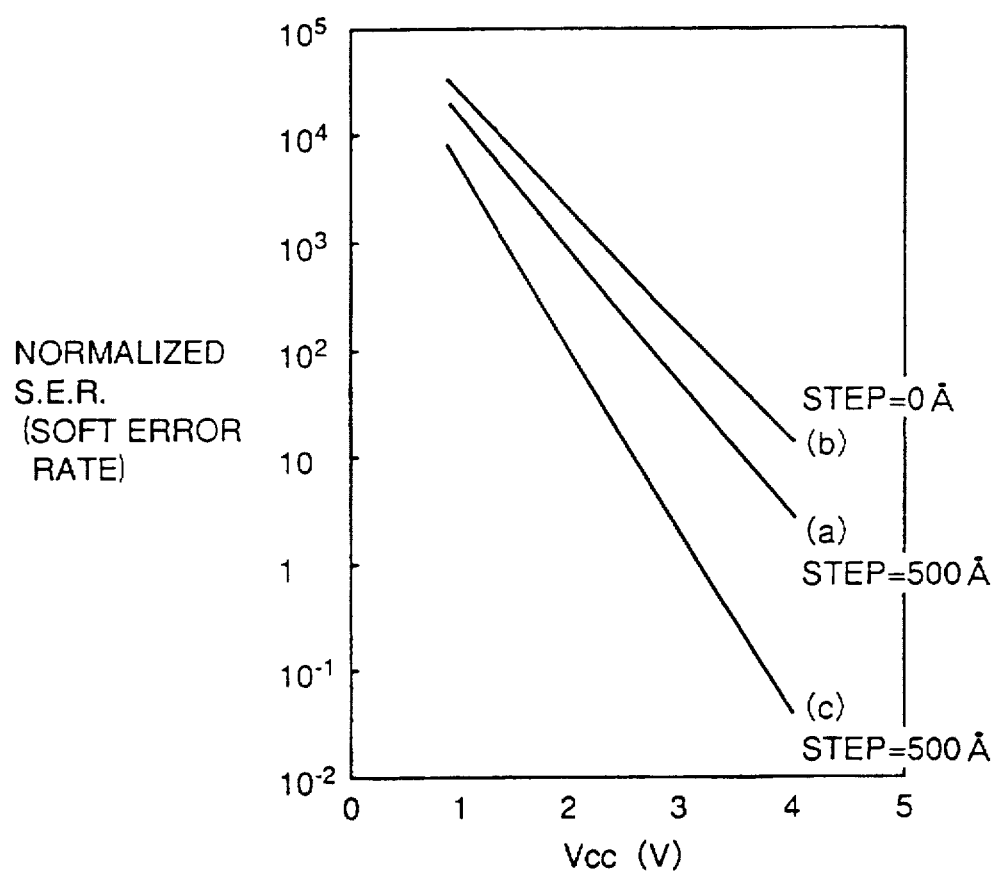
FIG. 21 is a graph showing change in a soft error rate with respect to Vcc in the respective specimens.

From the results of experiment shown in FIG. 21, it can be found that the example of the invention (FIG. 20A) attains a lower soft error rate and an improves the resistance against soft error as compared with the conventional structure shown in FIG. 55 (FIG. 20B).

The inventors and others also determined the soft error rate of the structure of the embodiment shown in FIG. 1 with various values of a magnitude (depth) of the step defined by groove 1a. The result is shown in FIG. 22.

Figure 22:
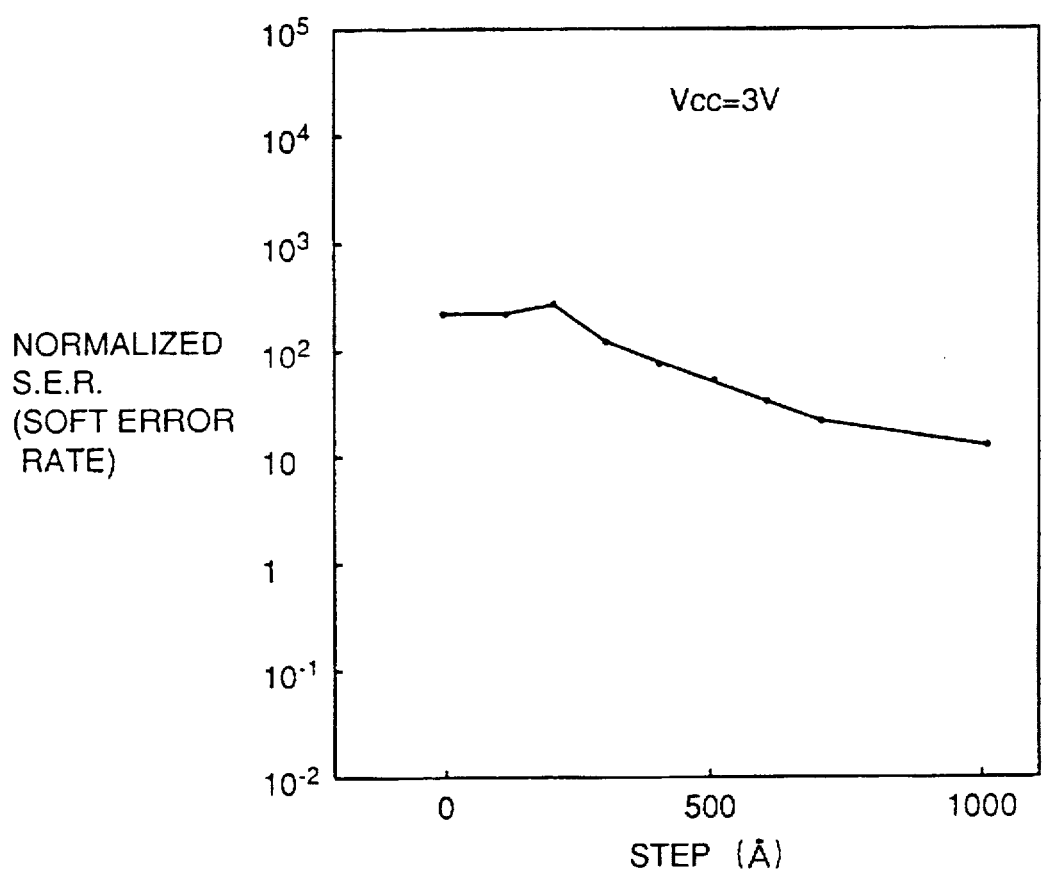
FIG. 22 is a graph showing change in a soft error rate with respect to change in a groove depth (step depth) in the semiconductor memory device of the embodiment.

From the result in FIG. 22, it is found that the magnitude of the step of groove 1a which is 300 Å or more can reduces the soft error rate. Thus, it is found that the depth of groove 1a of 300 Å or more attains a remarkable effect of improving the resistance against soft error. Therefore, the desirable depth of groove 1a is 300 Å or more.

Further, the inventors and others determined change in connection resistance R in accordance with change in magnitude of the step of groove 1a in the structure of the embodiment shown in FIG. 1. The relationship between the magnitude of the step and connection resistance R was determined in both the cases that the ion implantation for forming $n^-$-impurity region 7a shown in FIGS. 5 and 12 was performed with an implanting angle of 0° and it was performed by rotary implantation at 45°. Here, connection resistance R is the connection resistance between $n^+$-impurity region 9a and gate electrode layer 27a (or 27b) between which $n^-$-impurity region 7a formed at the bottom of groove 1a is interposed. The result of this experiment is shown in FIG. 23.

The ion implantation for the above experiment was performed by implanting arsenic (As) with an energy of 50 keV and a doze of $1.0 \times 10^{13} \text{cm}^{-2}$, and 45° means an angel to a normal to the surface of the semiconductor substrate.

Figure 23:
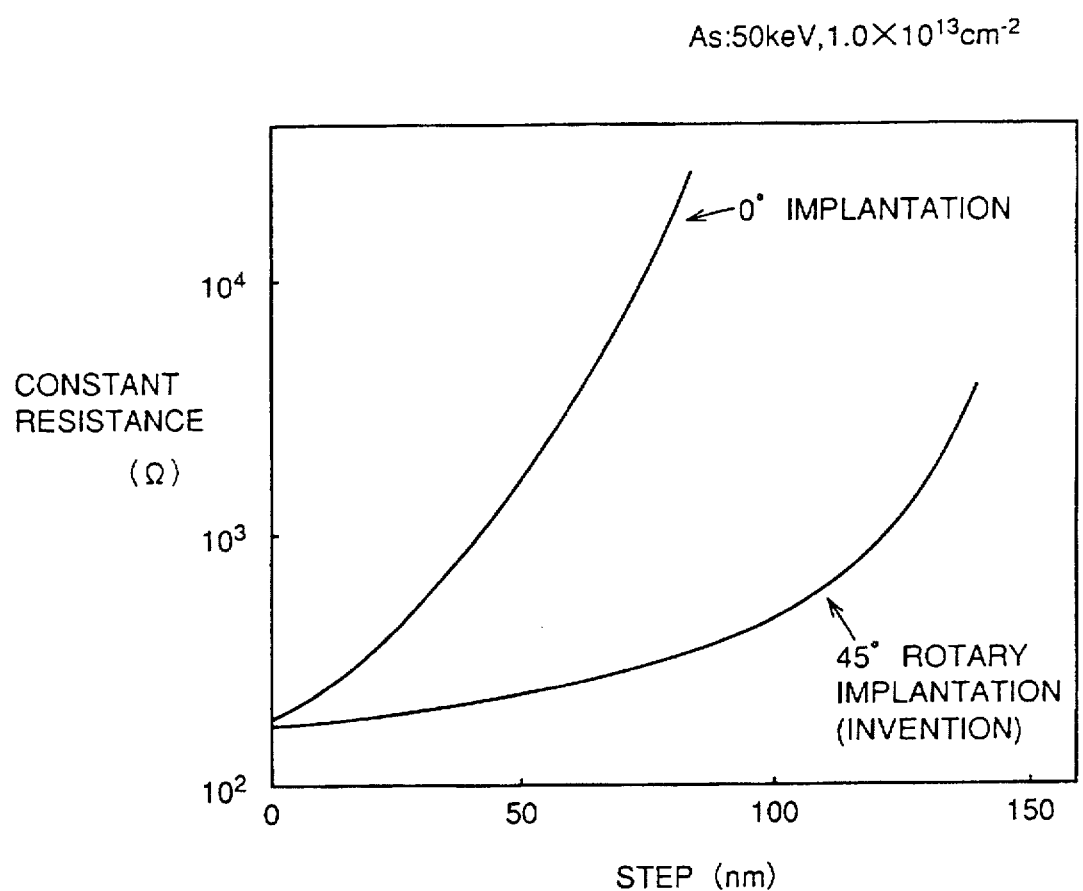
FIG. 23 is a graph showing change in a connection resistance R with respect to change in a magnitude of the step in the cases of implantation of impurity with angles of 0 degrees and 45 degrees in the method of manufacturing the semiconductor memory device of the embodiment 1.

As is apparent from the result in FIG. 23, the rotary implantation at 45° can achieve lower connection resistance R than the 0° implantation, provided that the magnitude of step of groove 1a is constant. The reason for this can be considered that the rotary implantation at 45° can sufficiently introduce impurity even into the side walls of groove 1a, so that the resistance of side walls of groove 1a can be reduced.

From the result in FIG. 23, it can be understood that the resistance of side wall of groove 1a can be reduced by the rotary implantation at 45° even in the case that total thermal processing after formation of the gate electrodes of LSI is performed at a temperature of 850° C. for a restricted time of about 2 to about 3 hours, as is done in the manufacturing method of this embodiment.

Figure 24:
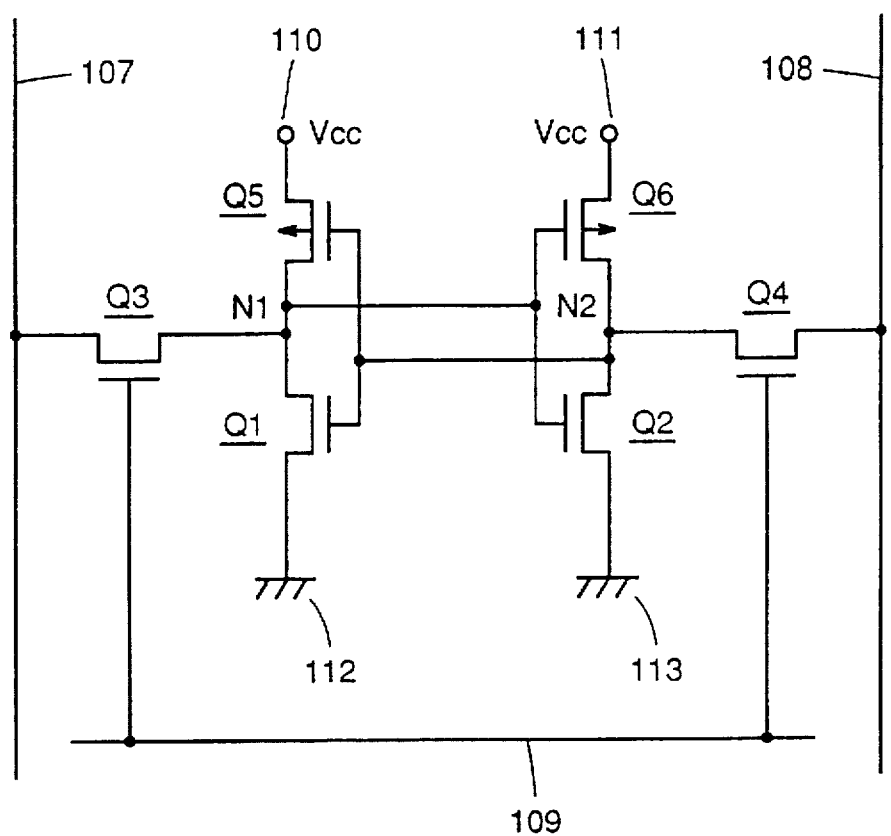
FIG. 24 is an equivalent circuit diagram of a memory cell of an SRAM including a load element formed of a load transistor made of a TFT.

Although the embodiment has been described in connection with the structure in which the load elements are formed of high resistances R1 and R2, load transistors Q5 and Q6 shown in FIG. 24 may be used as the load elements. Load transistors Q5 and Q6 are made of p-channel TFTs (Thin Film Transistors). In this case, source regions of load transistors Q5 and Q6 are connected to Vcc Power supply, and drain regions are connected to storage nodes N1 and N2, respectively, as shown in FIG. 24. A gate of load transistor Q5 is connected to the gate of driver transistor Q1 and the drain region of driver transistor Q2. A gate of load transistor Q6 is connected to the gate of driver transistor Q2 and the drain region of driver transistor Q1.

Figure 54:
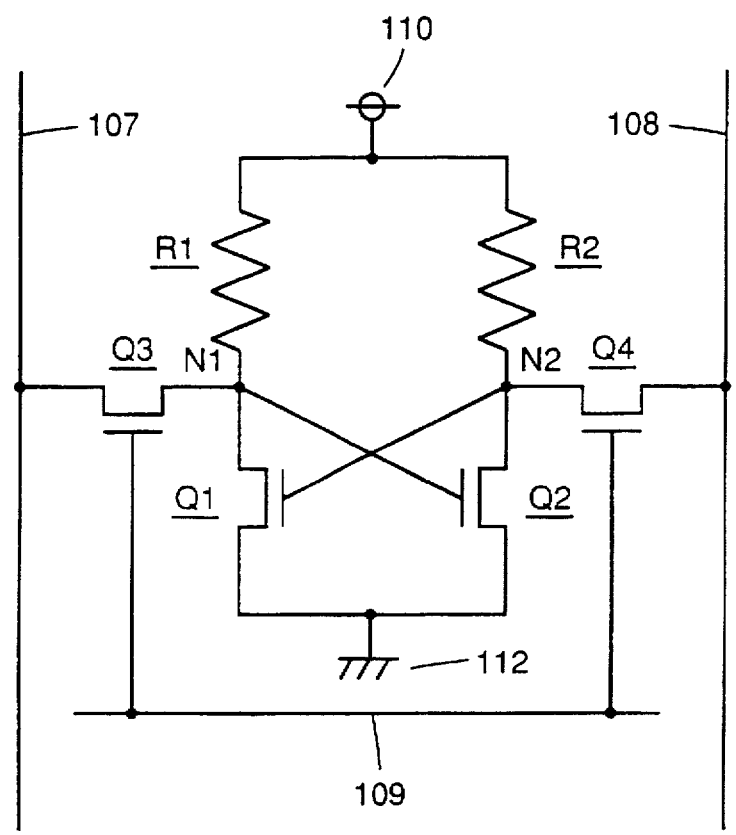
FIG. 54 is an equivalent circuit diagram showing a memory cell structure of an SRAM of a high resistance load type.

Since structures other than the above are substantially the same as those shown in FIG. 54, the same or similar portions and members bear the same reference characters, and will not be described below.

Embodiment 2

Figure 25:
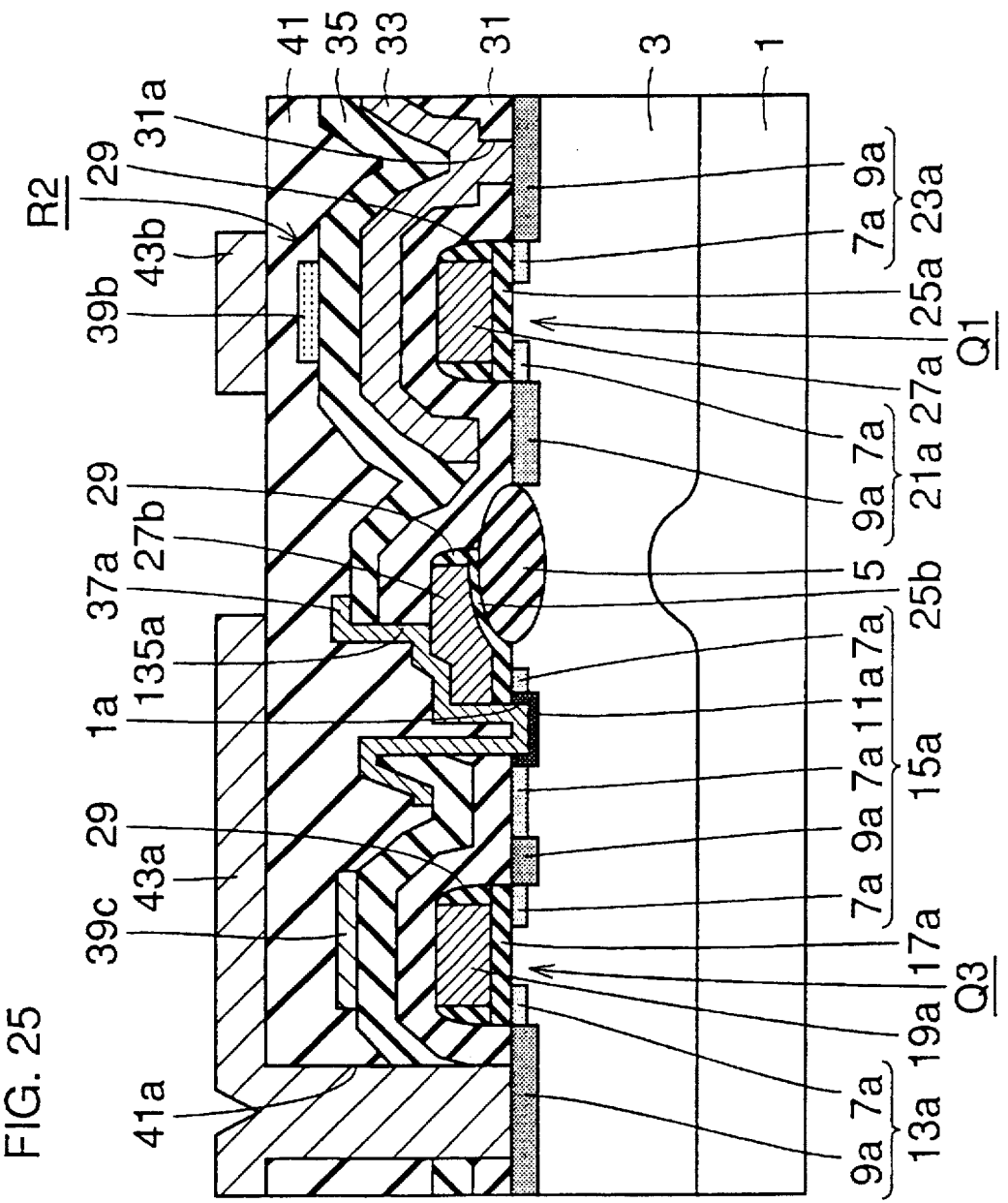
FIG. 25 is a schematic cross section showing a structure of a semiconductor memory device of an embodiment 2 of the invention.
Figure 26:
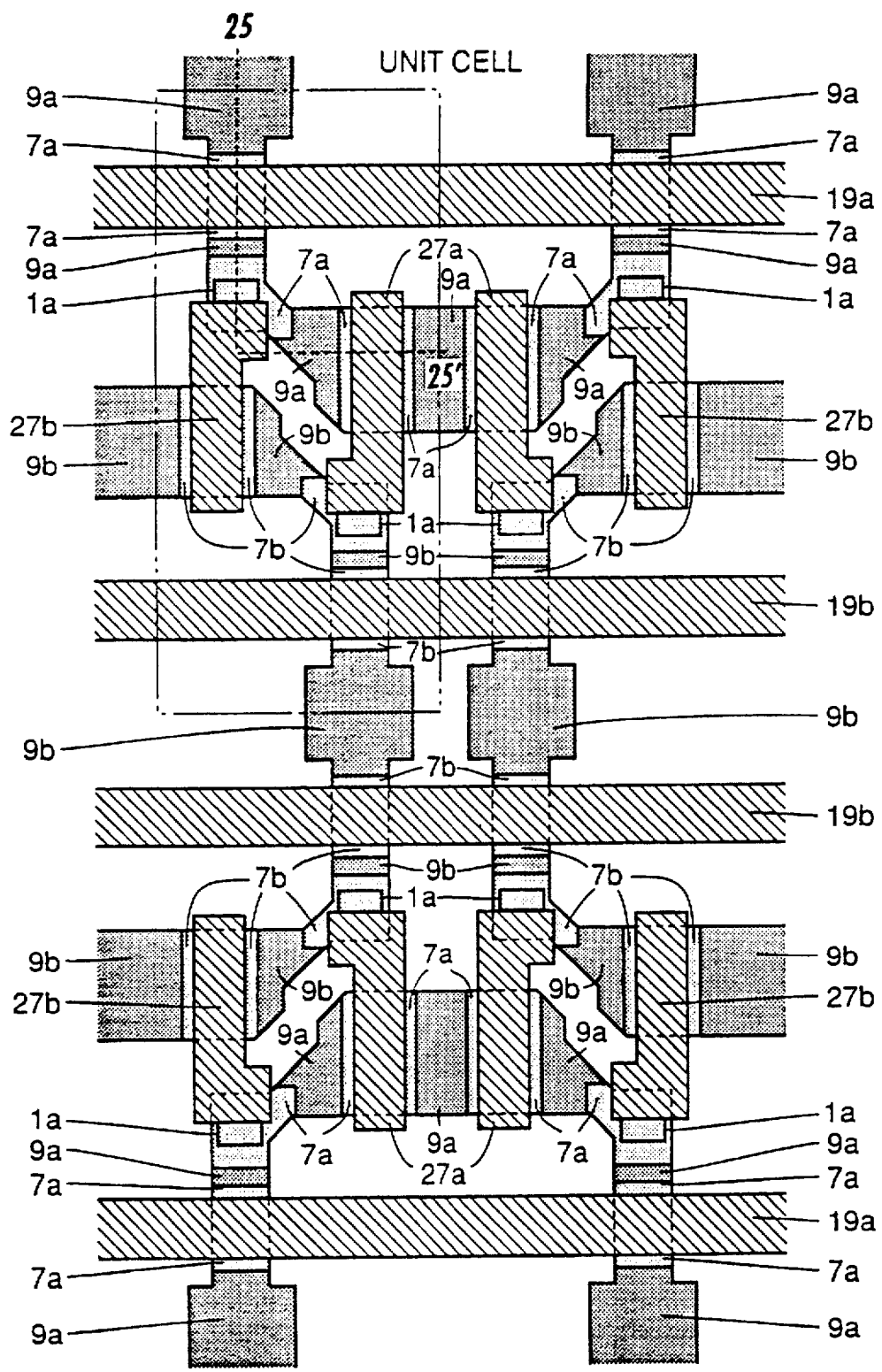
FIGS. 26 and 27 are fragmentary plans showing structures at lower and relatively upper levels of the semiconductor memory device of the embodiment 2, respectively.
Figure 27:
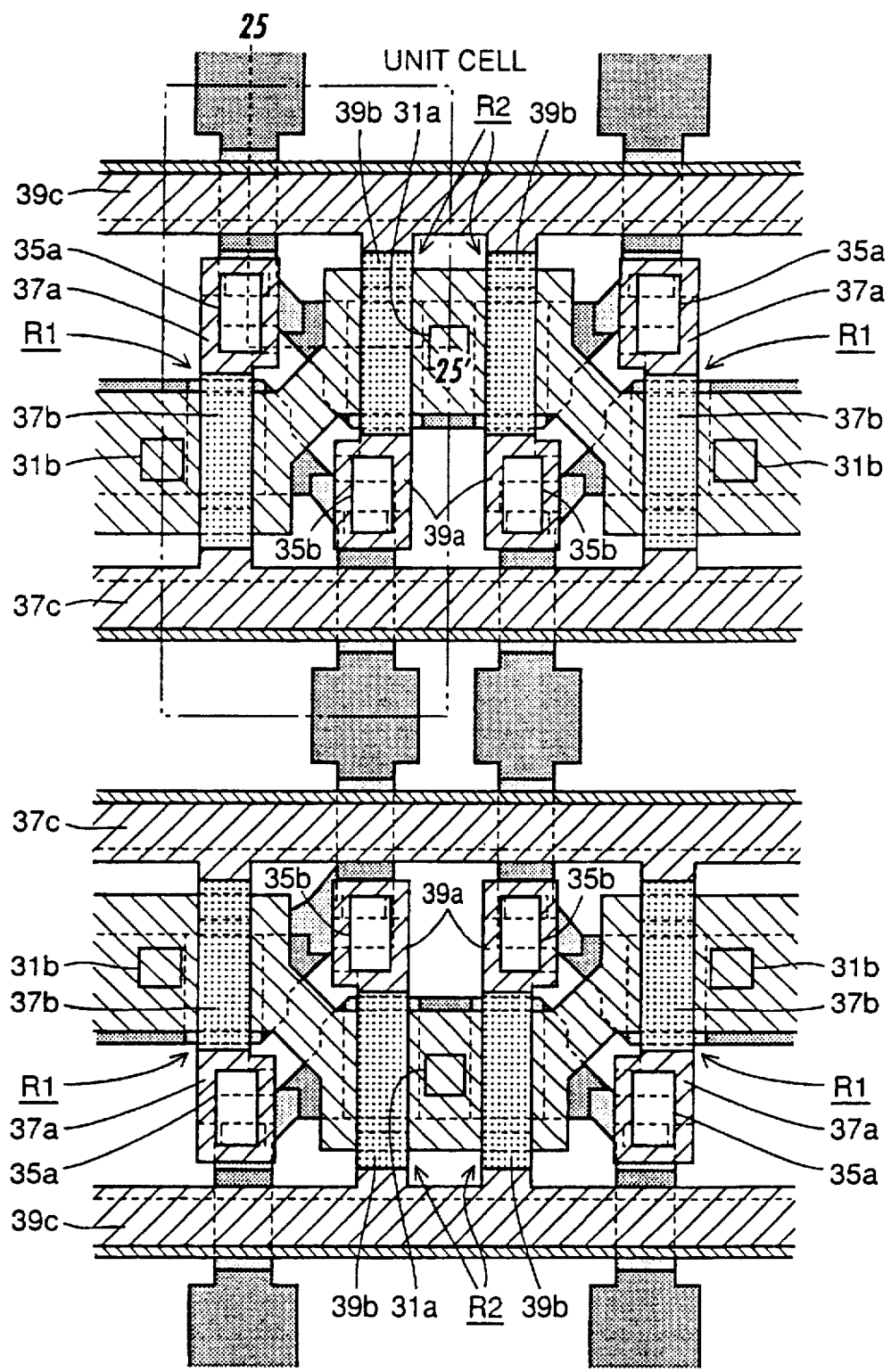

FIG. 25 shows a section taken along line 25—25'" in FIGS. 26 and 27.

Referring to FIGS. 25 to 27, a structure of this embodiment differs from the structure of the embodiment 1 in that it uses a so-called shared direct contact.

More specifically, gate electrode layers 27a and 27b of driver transistors Q1 and Q2 each are not directly connected to one of source/drain regions of corresponding access transistor Q3 or Q4, and each are connected to it via low resistance region 37a or 39a connected to high resistance R1 or R2.

Low resistance regions 37a and 39a are in contact with surfaces of gate electrode layer 27a and 27b as well as $p^-$-well region 3 through contact holes 135a and 135b, respectively, which are formed at interlayer insulating layers 31 and 35.

Grooves 1a are formed at the surface portions of $p^-$-well region 3, which are in contact with low resistance regions 37a and 39a. A bottom and side surfaces of each groove 1a are covered with an n-type impurity region 11a. n-type impurity region 11a has a diffusion depth smaller than that of $n^+$-impurity region 9a. In other words, if the top surfaces of n-type impurity region 11a and $n^+$-impurity region 9a are located on a common plane, the depth of n-type impurity region 11a from the common plan is smaller than that of $n^+$-impurity region 9a.

Since structures other than the above are substantially the same as those of the embodiment 1, the same or similar portions and members bear the same reference characters, and will not be described below.

A manufacturing method of this embodiment will be described below.

Figure 28:
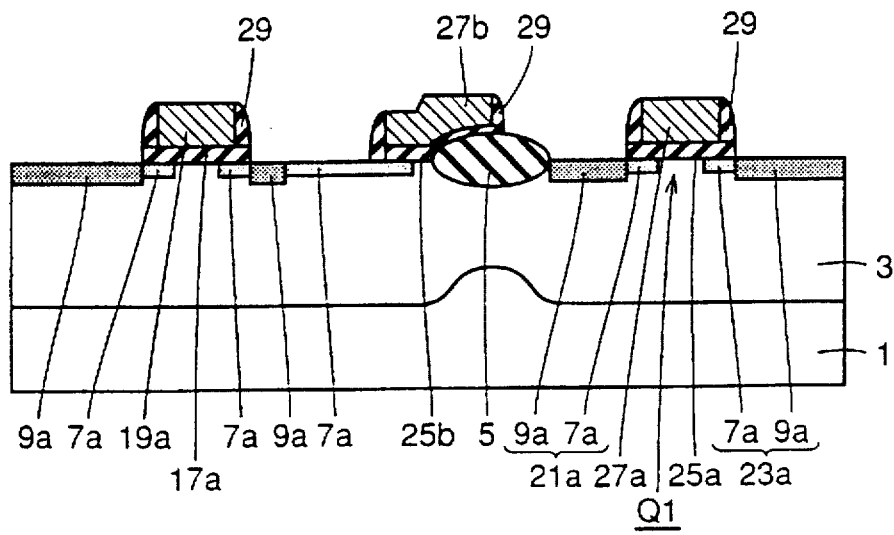
FIGS. 28 to 30 are schematic cross sections showing, in accordance with the order of steps, a method of manufacturing the semiconductor memory device of the embodiment 2.
Figure 29:
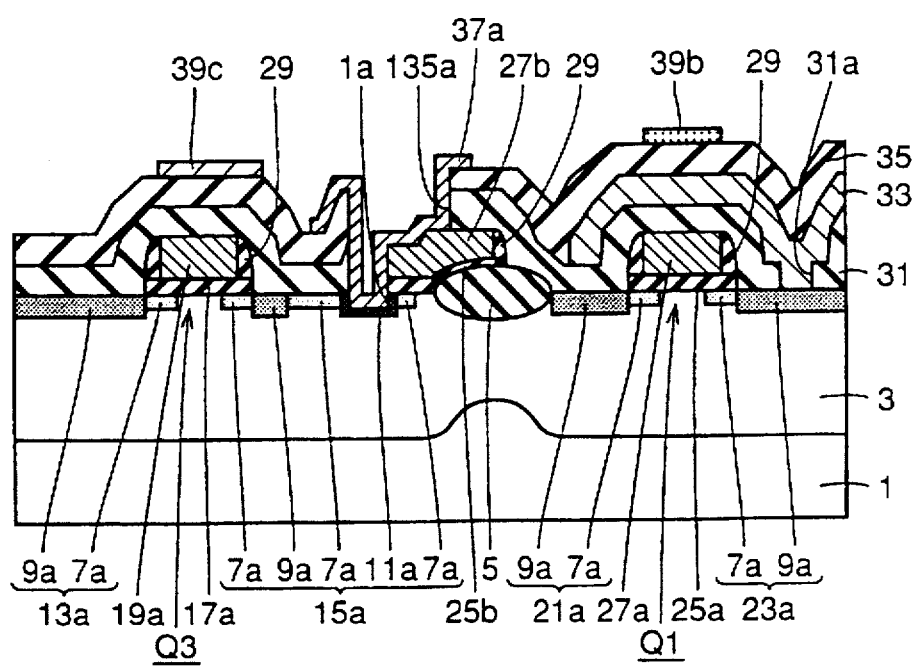
Figure 30:
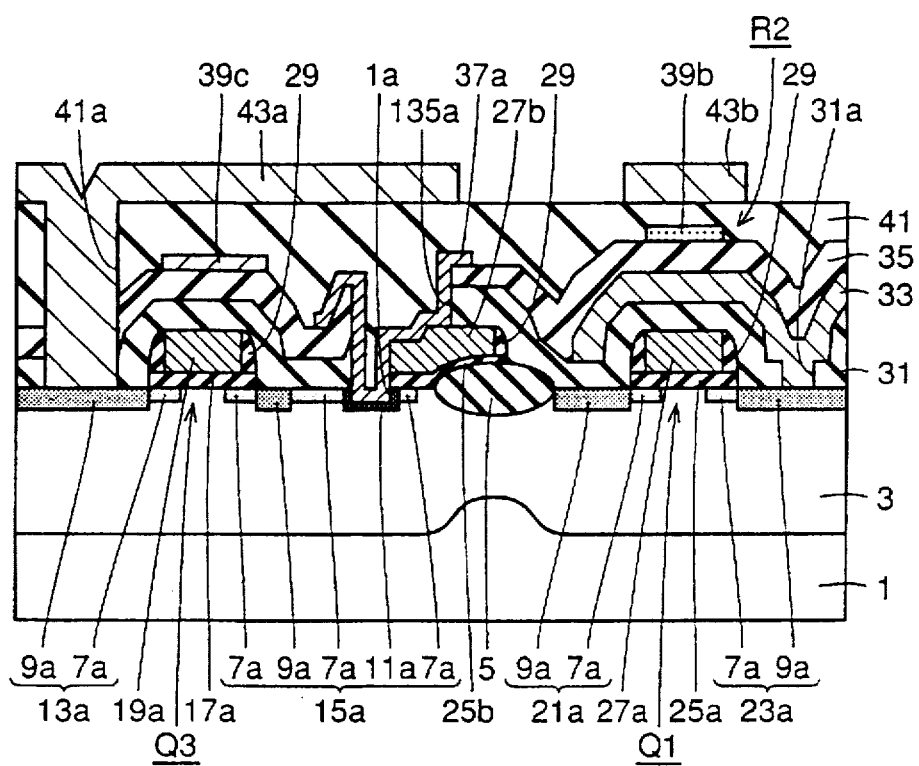
Figure 31:
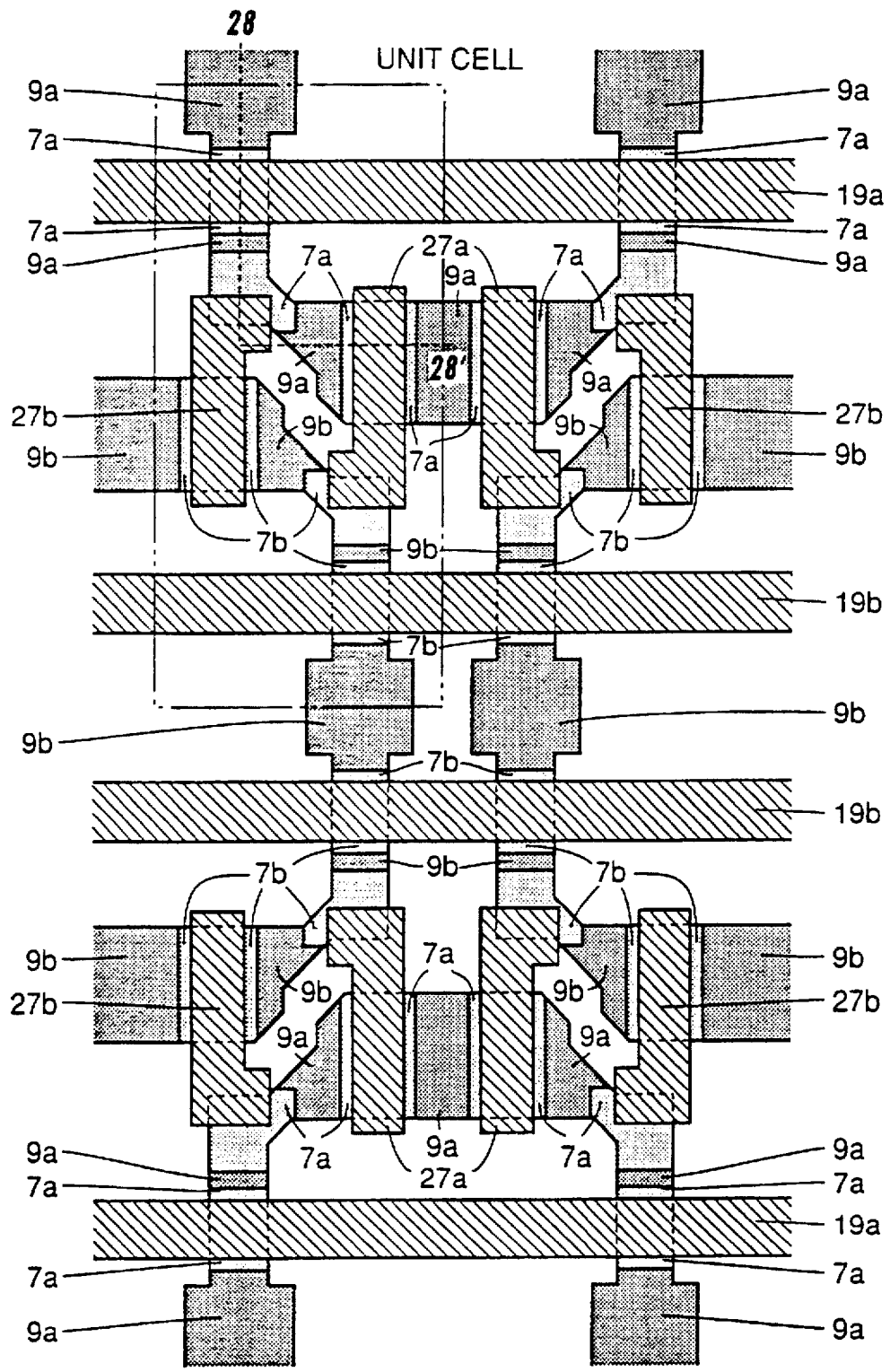
FIGS. 31 to 33 are fragmentary plans showing, in accordance with the order of steps, the method of manufacturing the semiconductor memory device of the embodiment 2.
Figure 32:
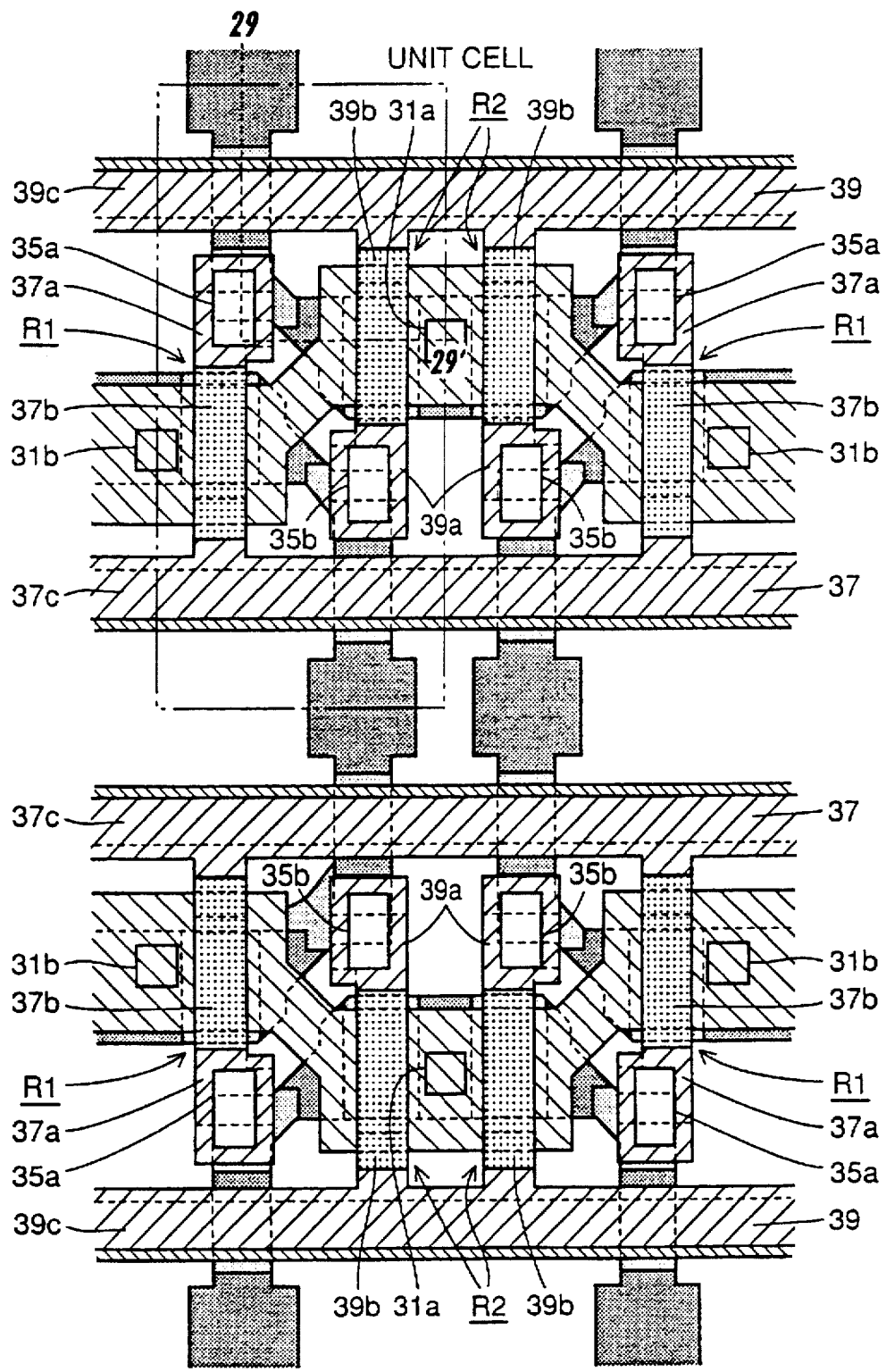
Figure 33:
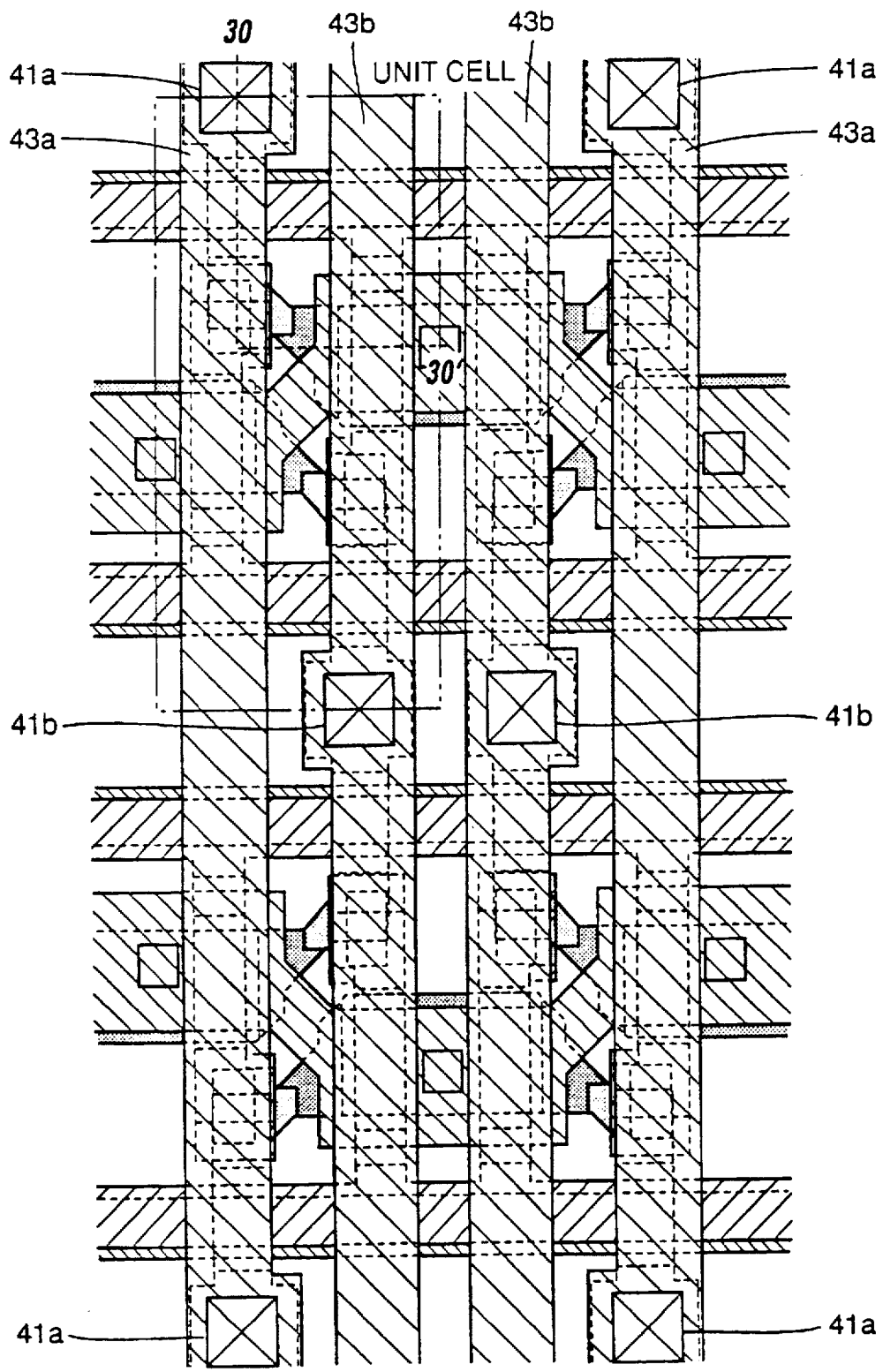

FIGS. 28 to 30 show sections taken along line 28—28', 29—29' and 30—30' in FIGS. 31 to 33, respectively.

In the manufacturing method of this embodiment, the step shown in FIGS. 28 and 31 and steps preceding it are the same as those of the embodiment 1 shown in FIGS. 4 to 7 and FIGS. 11 to 14 except for that openings $25a_1$ and $25b_1$ are not formed at the gate electrode layer and groove 1a is not formed. After these steps, interlayer insulating layer 31 made of $SiO_2$ and covering driver transistors Q1 and Q2 and access transistors Q3 and Q4 is formed under conditions similar to those of the embodiment 1 as shown in FIGS. 29 and 32. Contact holes 31a and 31b reaching source regions 23a and others of driver transistors Q1 and Q2 are formed at interlayer insulating layer 31. Processing is performed under conditions similar to those of the embodiment 1 to form ground interconnection layers 33 which are electrically in contact with source regions 23a and other of driver transistors Q1 and Q2 through contact holes 31a and 31b, respectively.

Interlayer insulating layer 35 of about 1500 Å in thickness made of $SiO_2$ is deposited on the whole surface to cover ground interconnection layers 33 by the LPCVD method.

By the photolithography technique and RIE method, contact holes 135a and 135b reaching surfaces of gate electrode layers 27a and 27b and $p^-$-well region 3 are formed at interlayer insulating layers 31 and 35.

During formation of openings at interlayer insulating layers 31 and 35 by dry etching, the surface of $p^-$-well region 3 is recessed, e.g., by over-etching to form groove 1a having a depth of 300 Å or more.

Similarly to the embodiment 1, the LPCVD method is executed to deposit a polycrystalline silicon film of about 1000 Å in thickness. Then, impurity such as phosphorus (P) is implanted into the polycrystalline silicon film with an energy of 30 keV and a dose of $1.0 \times 10^{12}$ to $1.0 \times 10^{14} cm^{-2}$. By the photolithography technique and RIE method, the phosphorus-doped polycrystalline silicon film is patterned into an intended configuration to form first and second doped polycrystalline silicon films 37 and 39. Thereafter, a resist pattern having an intended configuration is formed by the photolithography technique on first and second doped polycrystalline silicon films 37 and 39. Using this resist pattern as a mask, impurity such as arsenic (As) or phosphorus (P) is implanted with an energy of about 30 keV and a dose of about $1.0 \times 10^{15}$ to about $5.0 \times 10^{15} cm^{-2}$.

Thereafter, the resist pattern is removed, and annealing is performed, e.g., at a temperature of 750° C. to 850° C. for about 30 minutes. This activates the impurity to form low resistance regions 37a, 39a, 37c and 39c and high resistance regions 37b and 39b at first and second doped polycrystalline silicon films 37 and 39. High resistance regions 37b and 39b form high resistances R1 and R2, respectively. Low resistance regions 37c and 39c form Vcc interconnections. Low resistance regions 37a and 39a electrically connect gate electrode layers 27a and 27b to $p^-$-well region 3 through contact holes 135a and 135b, respectively.

As described above, low resistance regions 37a and 39a are in contact with the surface of $p^-$-well region 3. Therefore, the thermal processing which is performed for activating the impurity diffuses the impurity, i.e., arsenic (As) in low resistance regions 37a and 37b into $p^-$-well region 3. Thereby, n-type impurity region 11a covering the bottom and side surfaces of groove 1a is formed.

As described above, the whole bottom surface of groove 1a is covered with n-type impurity region 11a. n-type impurity region 11a has a diffusion depth smaller than that of $n^+$-impurity region 9a. Therefore, a depth of junction between $p^-$-well region 3 and n-type impurity region 11a in the structure including impurity region 11a formed at the bottom of groove 1a is smaller than that in the structure including $n^+$-impurity region 9a at the bottom of groove 1a.

Referring to FIGS. 30 and 33, interlayer insulating layer 41 is formed similarly to the embodiment 1, and contact holes 41a and 41b, each of which reaches the other of source/drain regions 13a and others of corresponding access transistor Q3 or Q4, is formed at the interlayer insulating layer 41. Thereafter, processing is performed to form bit lines 43a and 43b, each of which is made of an aluminum interconnection and is electrically connected to the other of source/drain regions 13a of corresponding access transistor Q3 or Q4 through contact hole 41a or 41b.

In the semiconductor memory device of this embodiment, n-type impurity region 11a is formed at the whole bottom surface of groove 1a as shown in FIG. 25. n-type impurity region 11a has a diffusion depth smaller than that of $n^+$-impurity region 9a as already described. Therefore, a depth of junction between n-type impurity region 11a and $p^-$-well region 3 under the groove 1a can be smaller than that in the structure including $n^+$-impurity region 9a formed at the bottom of groove 1a. Accordingly, the impurity concentration of $p^-$-well region 3 at the position of junction to n-type impurity region 11a can be smaller than that in the structure including $n^+$-impurity region 9a at the bottom of groove 1a. Therefore, the leak current at the junction between n-type impurity region 11a and $p^-$-well region 3 can be reduced.

Figure 60:
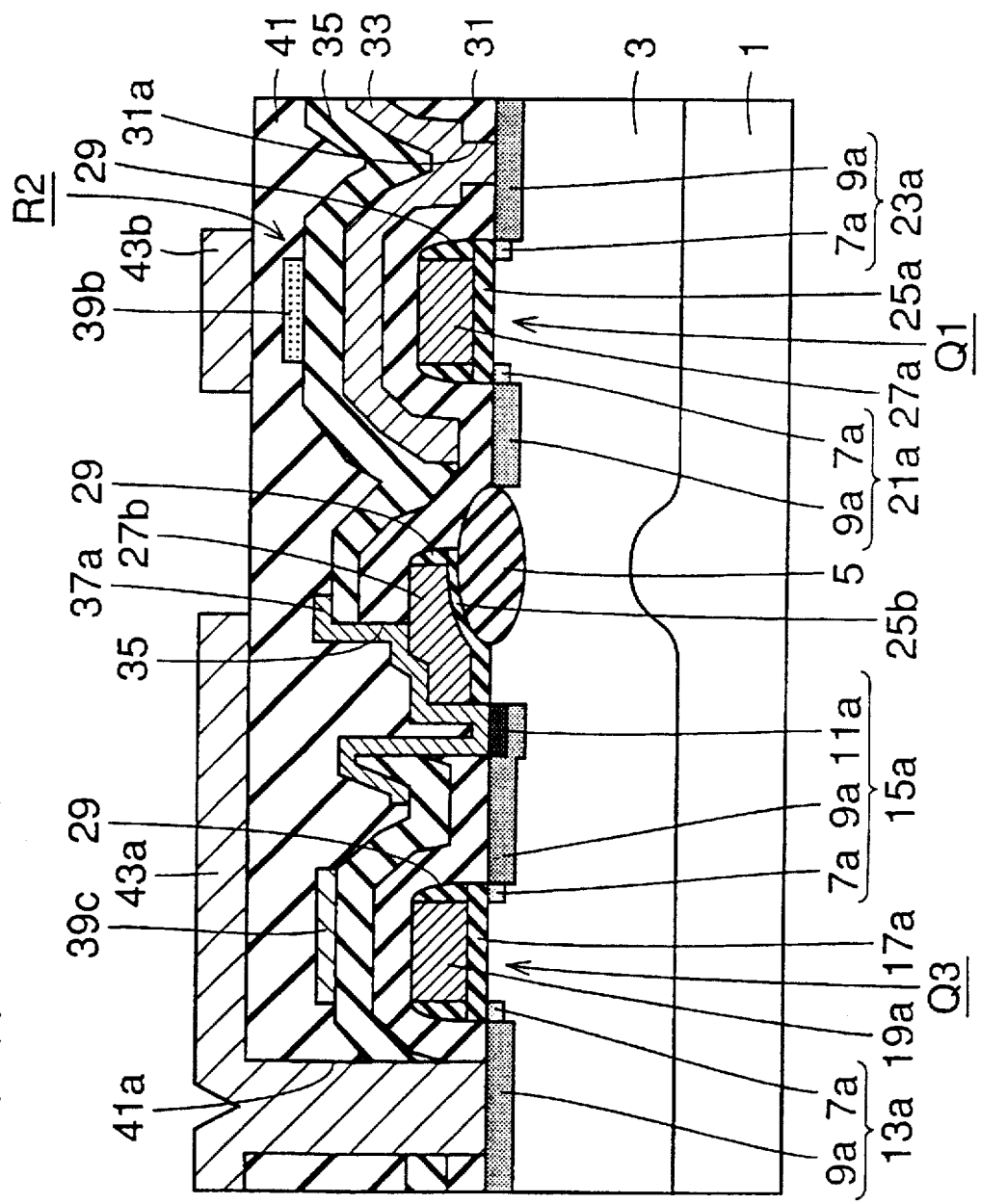
FIG. 60 is a schematic cross section showing a memory cell structure of a conventional SRAM using shared direct contact.
Figure 61:
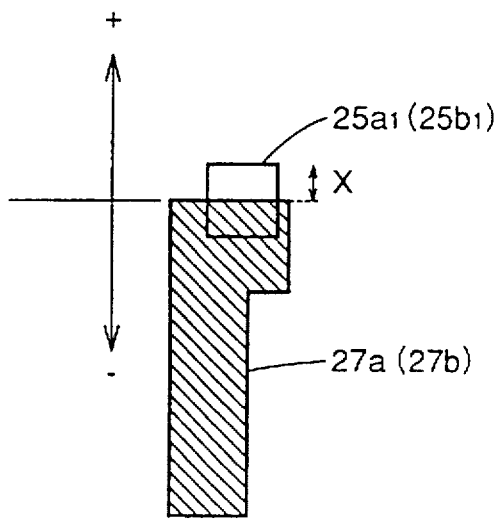
FIG. 61 shows a positional relationship between a gate electrode layer of a driver transistor and an opening pattern.
Figure 62:
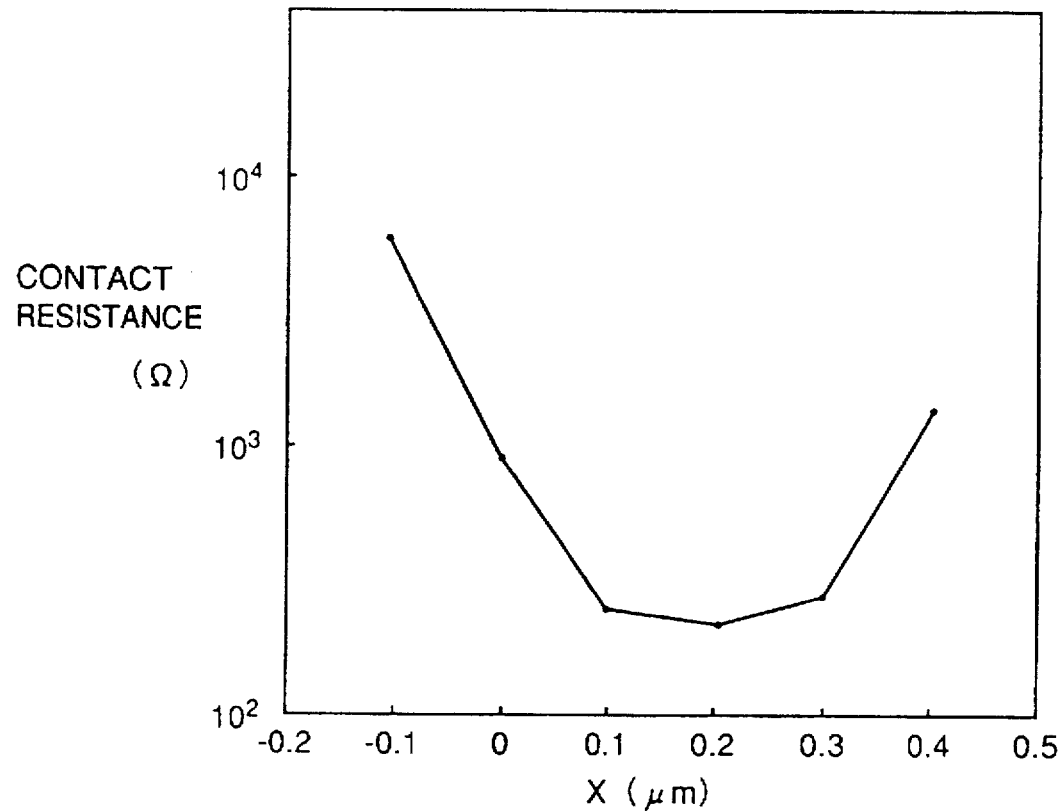
FIG. 62 is a graph showing change in a connection resistance R depending on a state of overlapping of the opening pattern over the gate electrode layer.
Figure 63:
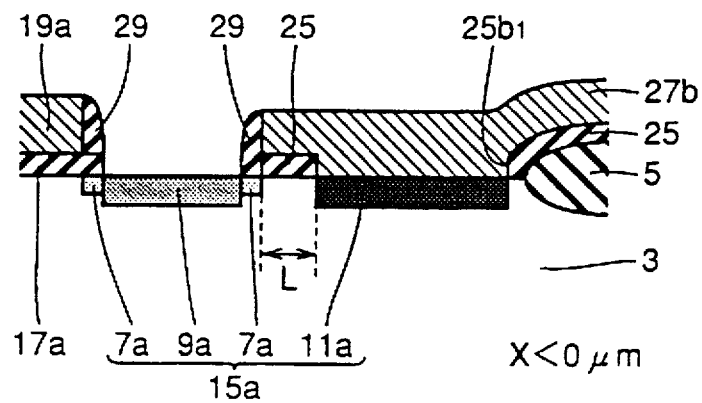
FIG. 63 is a schematic cross section showing a disadvantage caused by excessive overlapping of the opening pattern over the gate electrode layer.
Figure 64:
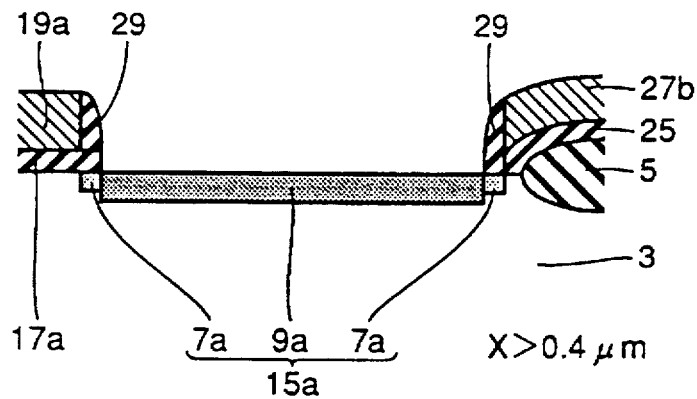
FIG. 64 is a schematic cross section showing a disadvantage caused by the opening pattern and the gate electrode layer not overlapped over the same.

In this embodiment, groove 1a is formed, and n-type impurity region 11a is arranged at the bottom thereof. Therefore, a depth of junction between n-type impurity region 11a and $p^-$-well region 3 can be larger than that in the conventional structure in FIG. 60 not provided with groove 1a. Therefore, as already described in connection with the embodiment 1, the junction capacity can be larger than that in the conventional structure shown in FIG. 60, and the capacity of the storage node can be increased, so that the resistance against soft error can be improved.

Embodiment 3

A method of manufacturing a semiconductor memory device of this embodiment will be described below.

Figure 36:
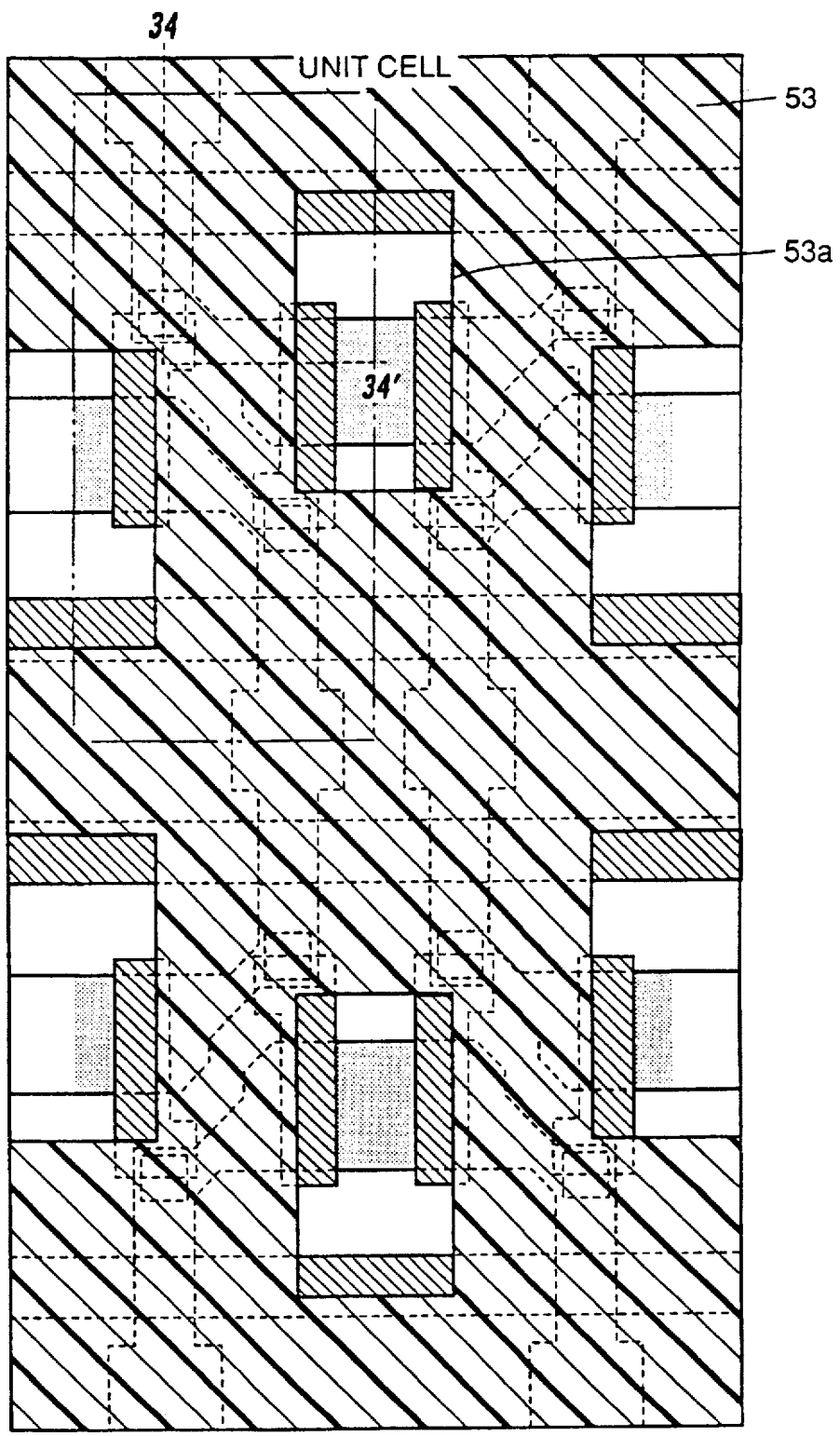
FIGS. 36 and 37 are fragmentary plans showing, in accordance with the order of steps, the method of manufacturing the semiconductor memory device of the embodiment 3.
Figure 37:
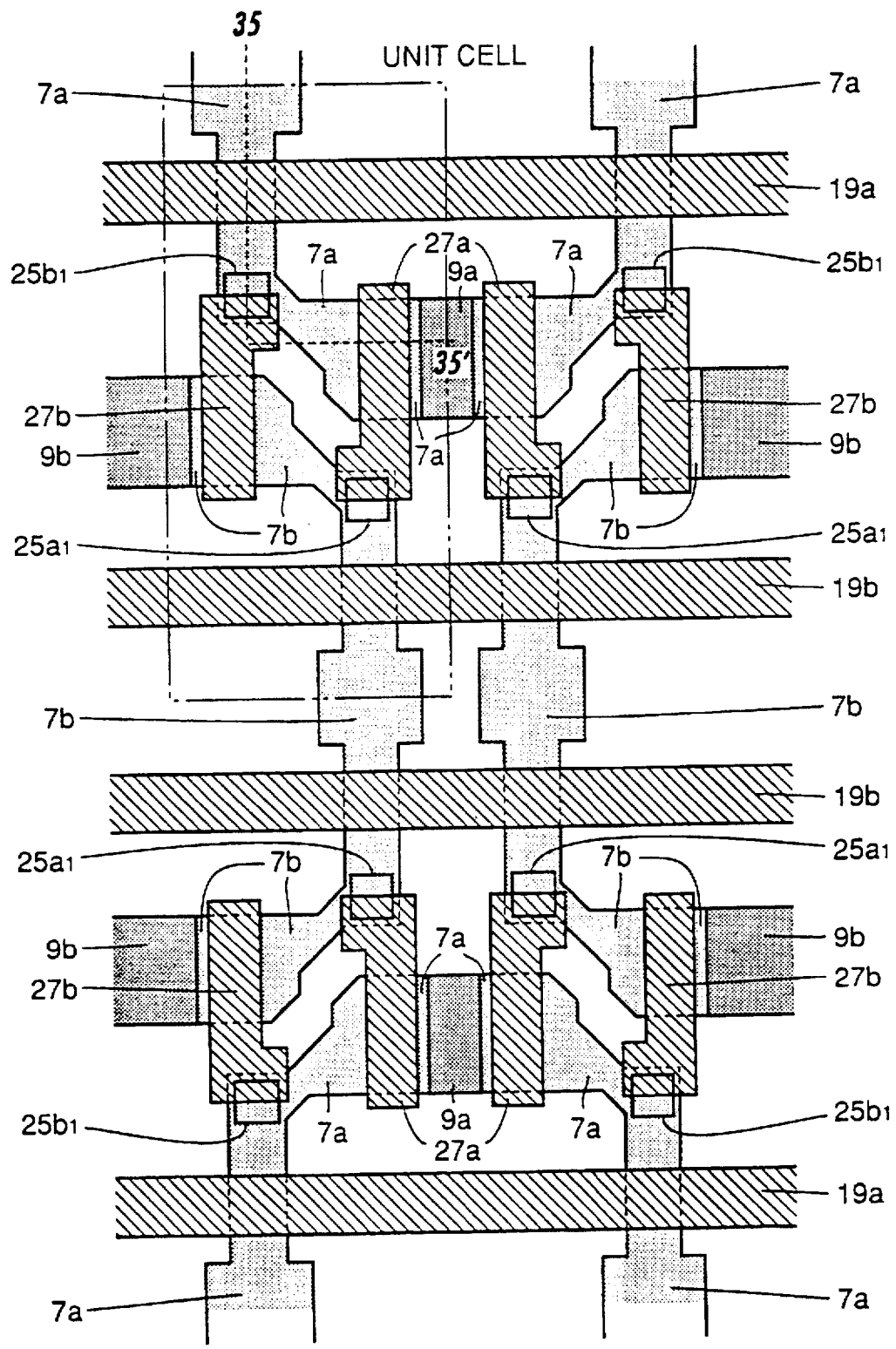

FIGS. 34A, 34B and 35A, 35B show sections taken along line 34—34' and 35—35' in FIGS. 36 and 37.

FIGS. 34A, 34B and 35A, 35B show a memory cell region as well as a peripheral circuit region.

Figure 34B:
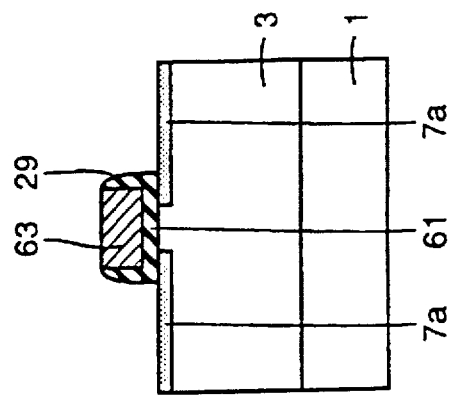
Figure 34A:
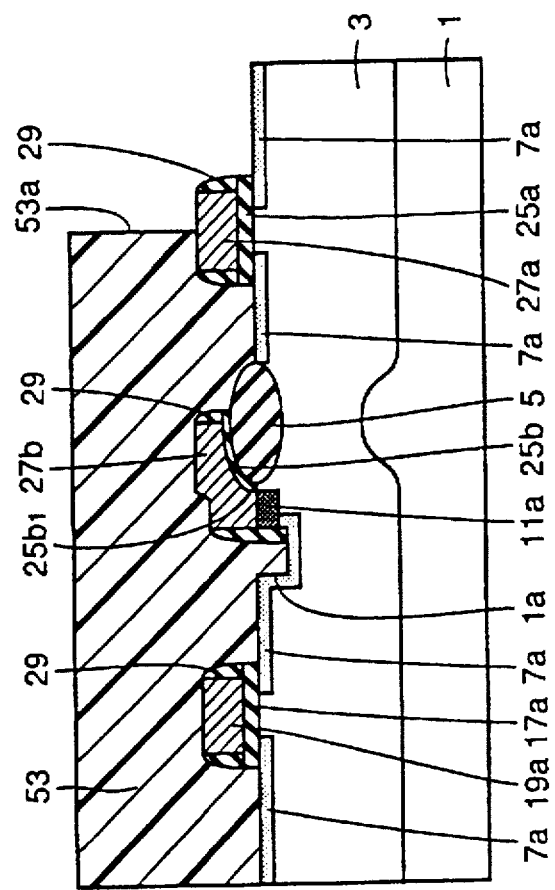

In the manufacturing method of this embodiment, steps similar to those of the embodiment 1 shown in FIGS. 4 and 5 are performed. Thereafter, side wall insulating layers 29 are formed at side walls of word lines 19a and 19b and gate electrode layers 27a and 27b under the substantially same conditions as the embodiment, as shown in FIGS. 34A, 34B and 36. Then, thermal processing is performed for activating impurity in $n^-$-impurity region 7a under the substantially same conditions as the embodiment 1. Owing to this thermal processing, impurity in gate electrode layers 27a and 27b diffuses into p-well region 3 to form n-type impurity region 11a and others.

Thereafter, processing is performed to form a resist pattern 53 having hole patterns 53a on source regions of driver transistors Q1 and Q2. Using resist pattern 53 as a mask, impurity such as arsenic (As) is implanted with an energy of 50 keV and a doze of $1.0 \times 10^{15}$ to $5.0 \times 10^{15} cm^{-2}$. Thereafter, resist pattern 53 is removed.

Referring to FIGS. 35A, 35B and 37, the above ion implantation forms $n^+$-impurity regions 9a at the source regions of driver transistors Q1 and Q2 and a pair of source/drain regions of the MOS transistor in the peripheral circuit region. Thereby, the source regions of driver transistors Q1 and Q2 as well as the source/drain regions of the MOS transistor in the peripheral circuit region each have the LDD structure formed of the two-layer structure including $n^-$-impurity region 7a and $n^+$-impurity region 9a.

Thereafter, steps similar to those in the embodiment 1 are performed, so that the ground interconnection layer, high resistances R1 and R2, and the bit line are formed.

Also in this embodiment, only n⁻-impurity region 7a is formed at the whole bottom surface of groove 1a. Therefore, a depth of junction between n⁻-impurity region 7a and p⁻-well region 3 under groove 1a can be smaller than that in the structure including n⁺-impurity region 9a formed at the bottom of groove 1a. Accordingly, the leak current at the junction between n⁻-impurity region 7a and p⁻-well region 3 can be reduced similarly to the embodiment 1.

Since the structure is provided with groove 1a and n⁻-impurity region 7a is formed at the bottom thereof, a depth of junction between n⁻-impurity region 7a and p⁻-well region 3 can be larger than that in the conventional structure shown in FIG. 55 not provided with groove 1a. Accordingly, the junction capacity can be larger than that in the conventional structure shown in FIG. 55 not provided with the groove, as can be done in the embodiment 1, and the capacity of the storage node can be increased, so that the resistance against soft error can be improved.

In the manufacturing method of this embodiment, n⁺-impurity regions 9a are formed only at the source regions of driver transistors Q1 and Q2 and the peripheral circuit regions. Therefore, patterning of resist pattern 53, which is used as the mask for ion implantation for forming n⁺-impurity region 9a, can be performed more easily than the patterning of resist pattern 51 shown in FIG. 13. Accordingly, it is not necessary to use the photolithography technique with a high alignment accuracy, so that a cost can be reduced.

Embodiment 4

Figure 39B:
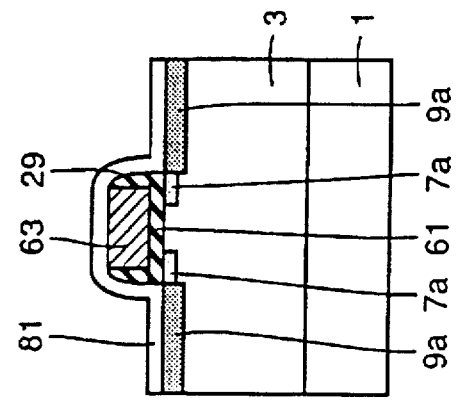
Figure 39A:
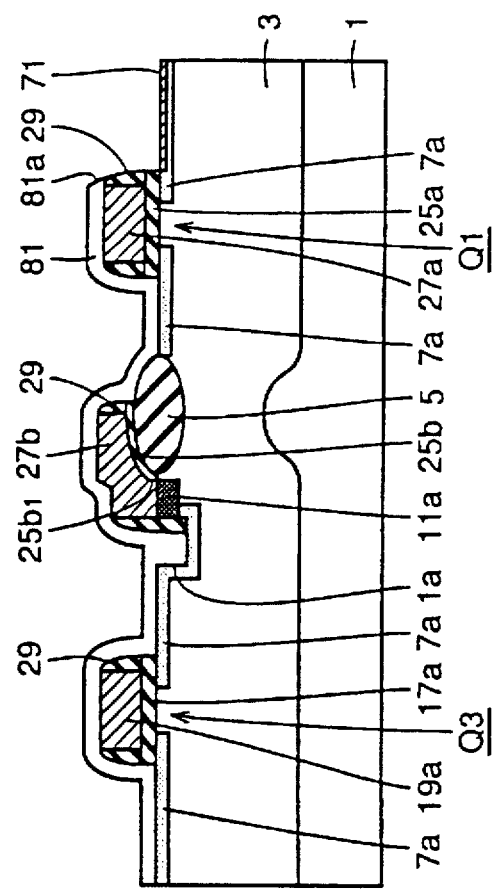
Figure 40:
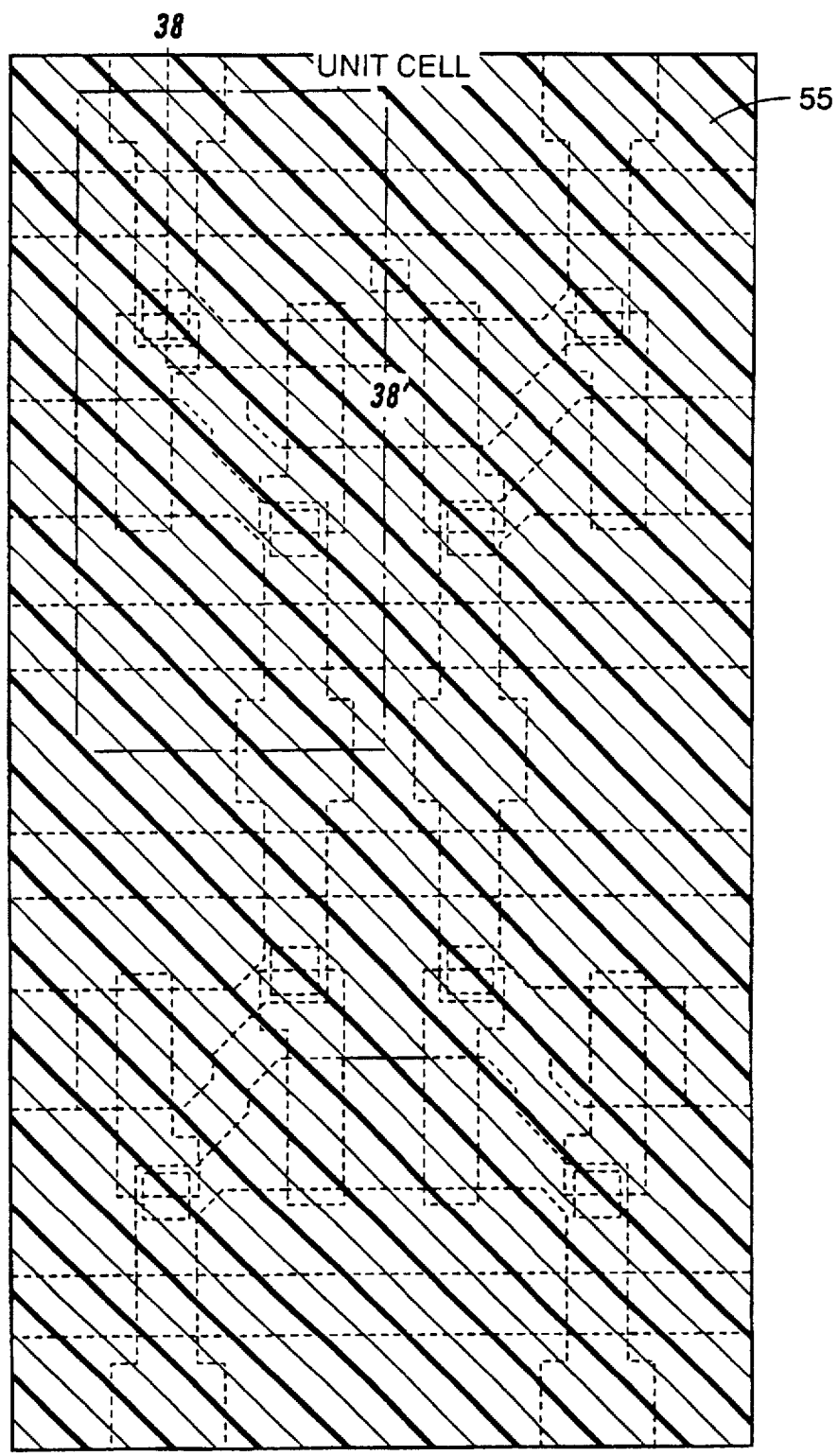
FIGS. 40 and 41 are fragmentary plans showing, in accordance with the order of steps, the method of manufacturing the semiconductor memory device of the embodiment 4.
Figure 41:
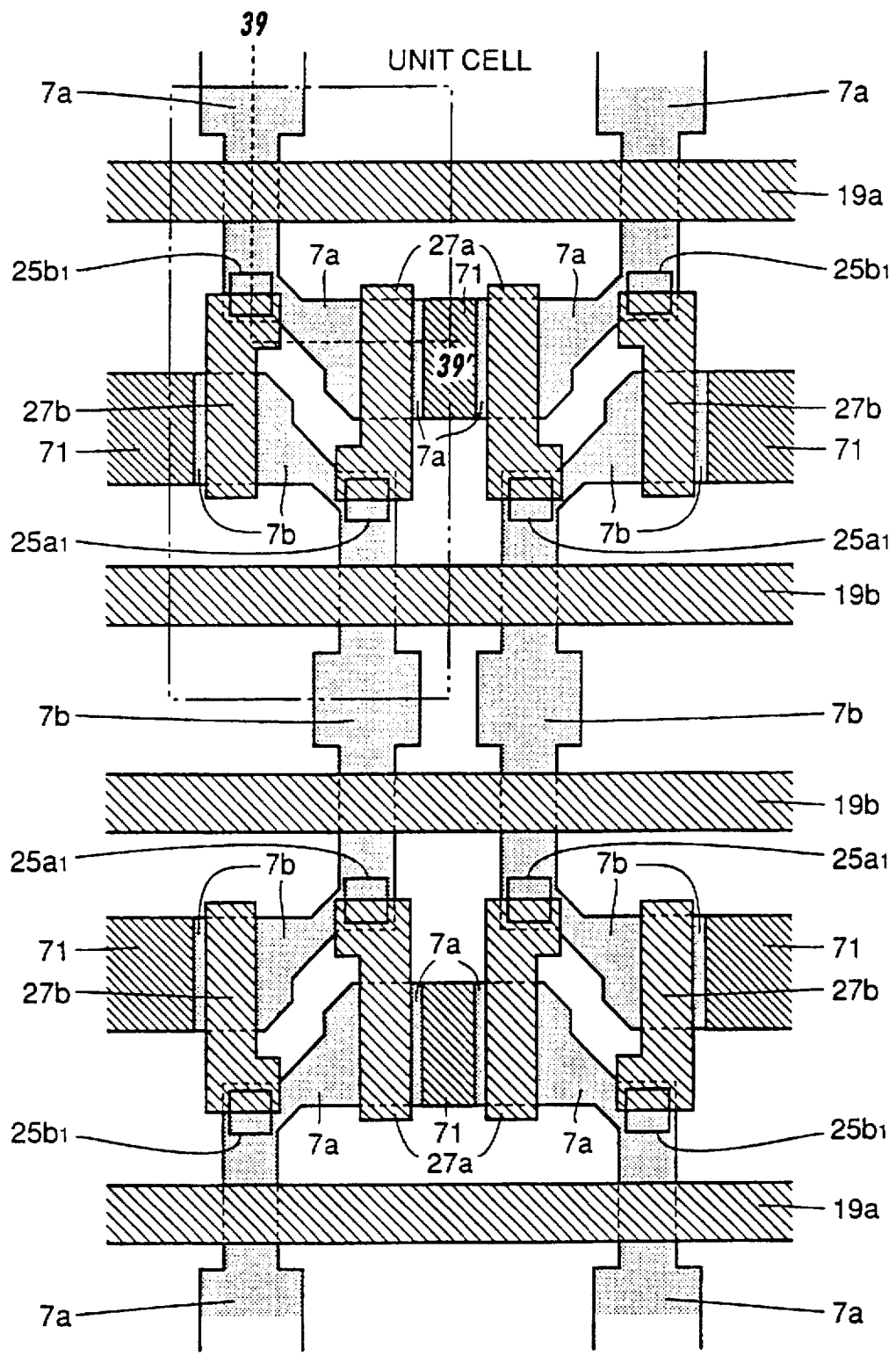

FIGS. 38A, 38B and 39A, 39B show sections taken along line 38—38' and 39—39' in FIGS. 40 and 41.

FIGS. 38A, 38B and 39A, 39B show a memory cell region as well as a peripheral circuit region.

Referring to FIGS. 38A, 38B and 40, the step corresponding to these figures and steps preceding the same are substantially the same as those of the embodiment 3, and thus will not be described below. However, a resist pattern 55 has a different configuration. Patterned resist pattern 55 covers entirely the memory cell region, and exposes the peripheral circuit region. Using resist pattern 55 as a mask, impurity such as arsenic (As) is implanted with an energy of 50 keV and about $1.0 \times 10^{15}$ to about $5.0 \times 10^{15} cm^{-2}$. Thereafter, resist pattern 55 is removed.

Referring to FIGS. 39A, 39B and 41, this ion implantation forms n⁺-impurity regions 9a at the pair of source/drain regions of the MOS transistor in the peripheral circuit region. n⁻-impurity region 7a and n⁺-impurity regions 9a form the LDD structure at the source/drain regions of the MOS transistor in the peripheral circuit region.

Since resist pattern 55 covers the whole surface of the memory cell region, patterning of resist pattern 55 can be performed further easily compared with the embodiments 1 and 3.

In this case, however, the source regions of driver transistors Q1 and Q2 are formed of only n⁻-impurity regions 7a, and thus have a relatively high resistance. This results in such a problem that the GND potential of memory cell is unstable.

In view of the above, silicide is formed at the source region surfaces of driver transistors Q1 and Q2 by the following steps.

First, an insulating layer 81 of about 500 Å in thickness made of $SiO_2$ is deposited on the whole surface by the LPCVD method. By photolithography technique and RIE method, processing is performed to remove selectively only portions of insulating layer 81 located on the source regions of driver transistors Q1 and Q2. Thereby, openings 81a exposing the source regions of driver transistors Q1 and Q2 are formed at insulating layer 81.

By a sputtering method, a titanium (Ti) film of about 500 Å in thickness is formed on the whole surface. RTA (Rapid Thermal Anneal) processing is performed, e.g., at a temperature of about 700° to about 800° C. for about 1 minute. Thereby, titanium silicide (TiSi) layers 71 are selectively formed only at the source regions of driver transistors Q1 and Q2. Thereafter, the titanium layer is removed with acid mixture of sulfuric acid ($H_2SO_4$) and hydrogen peroxide solution ($H_2O_2$) at a rate of 7:3, and then RTA processing is performed, e.g., at a temperature of about 700° to about 900° C. for about 1 minute.

In this manner, titanium silicide (TiSi) layers 71 are selectively formed only at the surfaces of source regions of driver transistors Q1 and Q2, so the resistance is reduced.

The titanium silicide layer in this embodiment has a sheet resistance of about $10\Omega/\square$, while conventional n⁺-impurity region 9a has a sheet resistance of about $100\Omega/\square$.

Although the structure including the titanium silicide (TiSi) layer as silicide layer 71 has been described, the structure may use another layer such as a cobalt silicide (CoSi) layer or a nickel silicide (NiSi) layer made of another high-melting-point metal silicide.

Then, steps similar to those in the embodiment 1 are performed, so that the ground interconnection layers, high resistances R1 and R2 as bit lines are formed.

Also in the semiconductor memory device of this embodiment, n⁻-impurity region 7a having a diffusion depth smaller than that of n⁺-impurity region 9a is formed at the bottom of groove 1a. Therefore, a depth of junction between n⁻-impurity region 7a and p⁻-well region 3 under groove 1a can be smaller than that in the structure including n⁺-impurity region 9a formed at the bottom of groove 1a. Therefore, leak current at the junction between n⁻-impurity region 7a and p⁻-well region 3 can be reduced, similarly to the embodiment 1.

Since the structure is provided with groove 1a and n⁻-impurity region 7a is formed at the bottom thereof, a depth of junction between n⁻-impurity region 7a and p⁻-well region 3 can be larger than that in the conventional structure shown in FIG. 55 not provided with groove 1a. Accordingly, the junction capacity can be larger than that in the conventional structure shown in FIG. 55, as can be done in the embodiment 1, and the capacity of the storage node can be increased, so that the resistance against soft error can be improved.

In the method of manufacturing the semiconductor memory device of this embodiment, ion implantation for forming n⁺-impurity region 9a is performed using resist pattern 55 as a mask. Resist pattern 55 can have such a configuration that covers the whole surface of the memory cell region and does not cover the peripheral circuit region. Patterning of resist pattern 55 can be performed further easily as compared with the embodiments 1 and 3. Accordingly, it is not necessary to use the photolithography technique with a high alignment accuracy, so that a cost can be reduced.

Embodiment 5

Figure 42B:
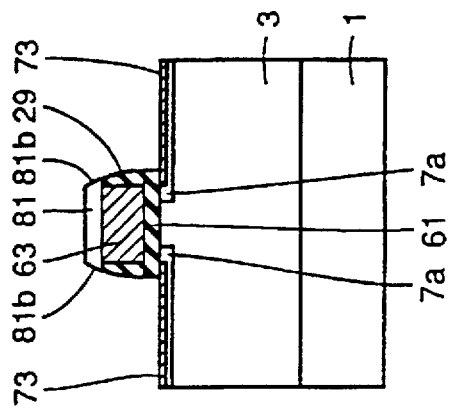
FIGS. 42A and 42B are a schematic cross section showing a step in a method of manufacturing a semiconductor memory device of an embodiment 5 of the invention.
Figure 42A:
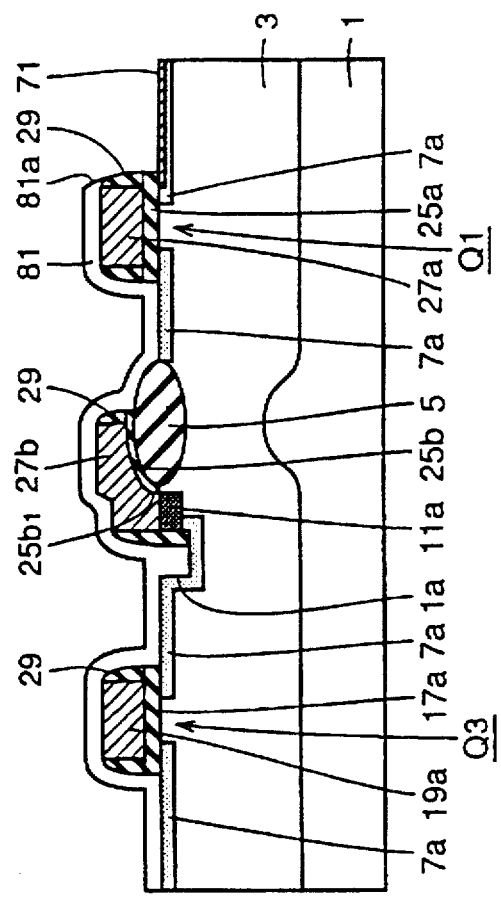
Figure 43:
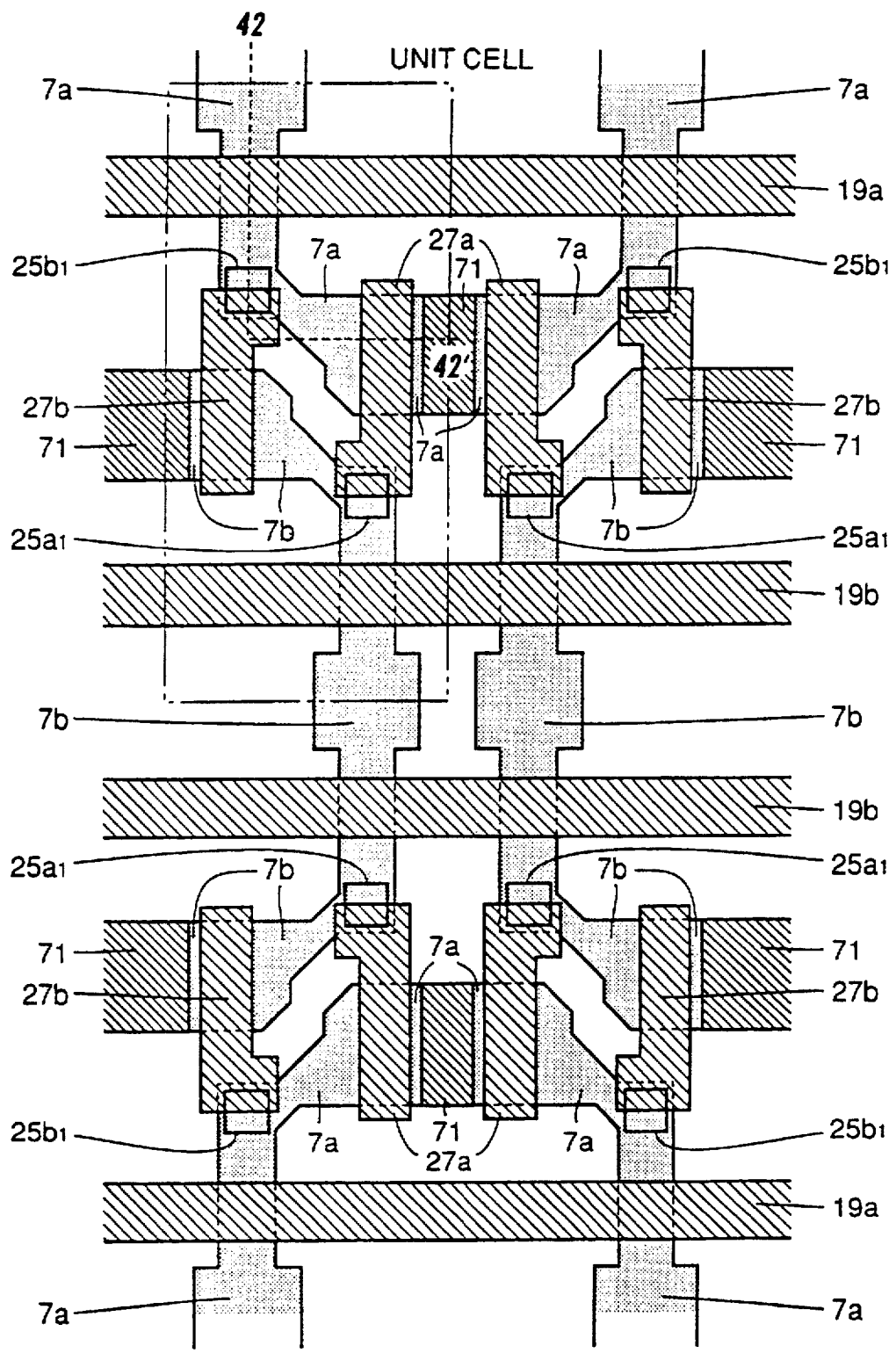
FIG. 43 is a fragmentary plan showing a step in the method of manufacturing the semiconductor memory device of the embodiment 5.

FIGS. 42A and 42B are a cross section taken along line 42—42' in FIG. 43. FIG. 42 shows the memory cell region as well as the peripheral circuit region.

Referring to FIGS. 42A, 42B and 43, this embodiment includes a titanium silicide (TiSi) layer 73, which is formed not only at source regions of driver transistors Q1 and Q2 but also at source/drain regions of the MOS transistor in the peripheral circuit. In this case, processing is performed to form an insulating layer 81 having openings 81a and 81b located on the source regions of driver transistors Q1 and Q2 as well as source/drain regions of the MOS transistor in the peripheral circuit region. Thereafter, steps similar to those in the embodiment 4 are performed so that silicide layers 71 and 73 are formed at the surfaces of source regions of driver transistors Q1 and Q2 as well as surfaces of the paired source/drain regions of the MOS transistor in the peripheral circuit region.

Then, steps similar to those in the embodiment 1 are performed to form the ground interconnection layers, high resistances R1 and R2, and bit lines.

In the manufacturing method of this embodiment, $n^+$-impurity region 9a is not formed at any position in contrast to the embodiment 4, so that the step of forming $n^+$-impurity region 9a can be eliminated, and the process can be simplified.

In the semiconductor memory device of this embodiment, the high-melting-point silicide layers are formed at the source/drain regions of the MOS transistor in the peripheral circuit, so that sheet resistances at the source/drain regions can be reduced.

Figure 44:
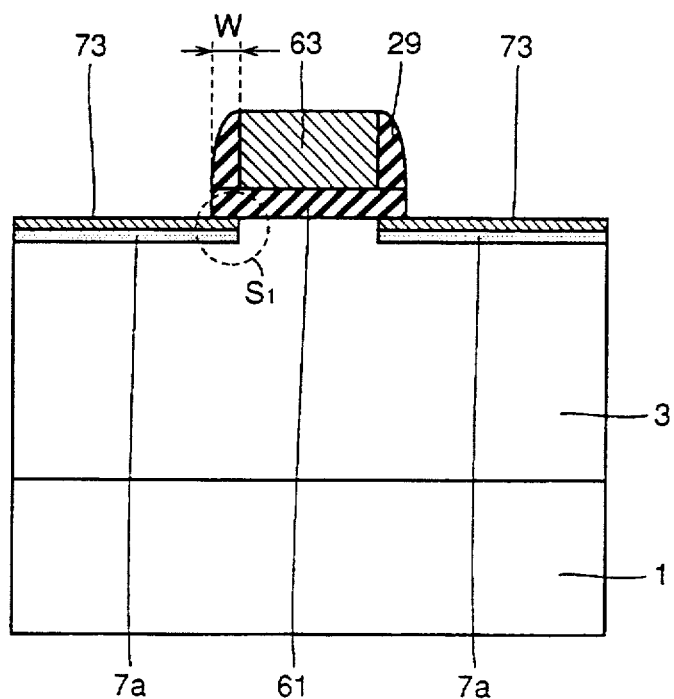
FIG. 44 is a schematic cross section showing short circuit between a source/drain region and a p$^-$-well region in an MOS transistor.

In the conventional semiconductor memory device, side wall insulating layer 29 has a small width W of about 500 to about 800 Å as shown in FIG. 44, and the tilt-angle rotary implanting method is not employed for forming $n^-$-impurity regions 7a which form the source/drain regions. Therefore, spiking of silicide layer 73 in the lateral direction in the figure occurs at a region $S_1$, which may cause short circuit between source/drain region 7a and $p^-$-well region 3.

Figure 45:
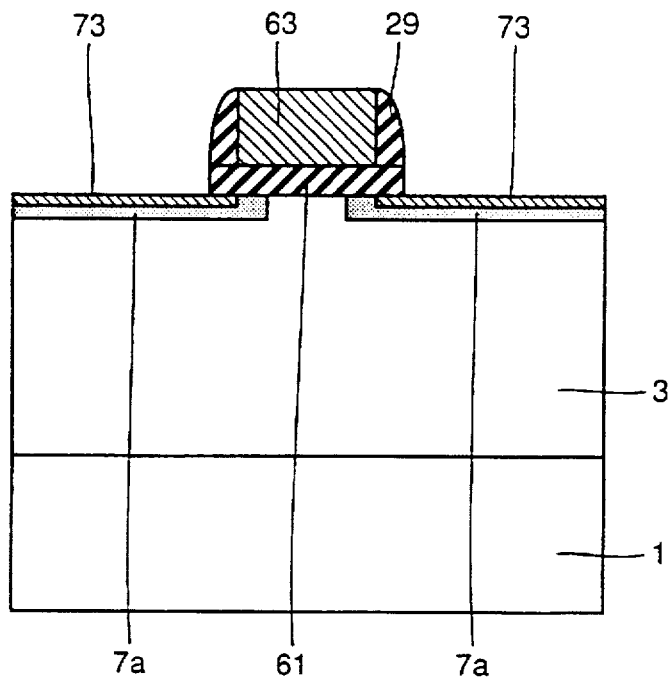
FIG. 45 is a schematic cross section showing a structure preventing short circuit between the source/drain region and the p$^-$-well region.

In contrast to the above, this embodiment employs the tilt-angle rotary implanting method at 45 degrees for forming $n^-$-impurity regions 7a which form the source/drain regions, as shown in FIG. 45. Therefore, the surface of silicide layer 73 at the lateral end in the figure is covered with $n^-$-impurity region 7a. Therefore, this embodiment can prevent short circuit between $n^-$-impurity regions 7a, i.e., source/drain regions and $p^-$-well region 3.

Embodiment 6

Figure 46:
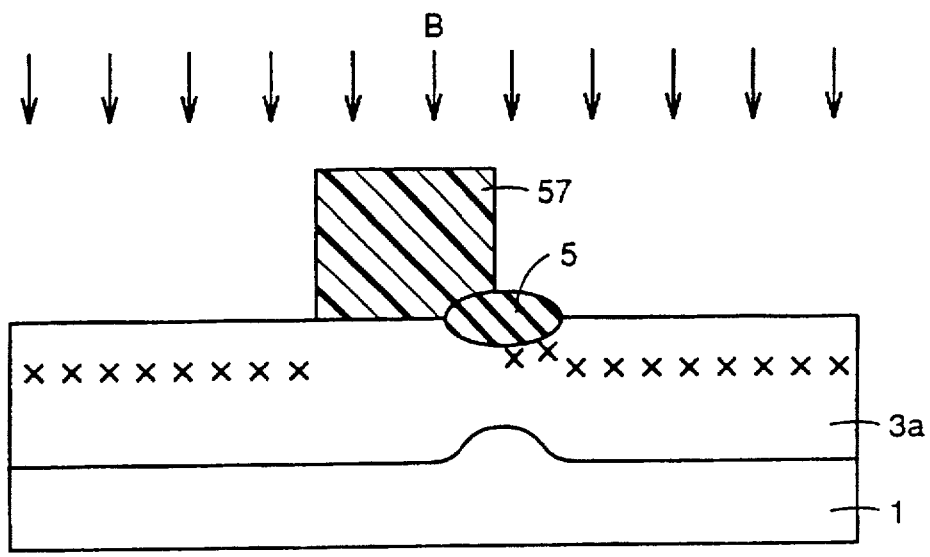
FIGS. 46 and 47 are schematic cross sections showing, in accordance with the order of steps, a method of manufacturing a semiconductor memory device of an embodiment 6 of the invention.
Figure 47:
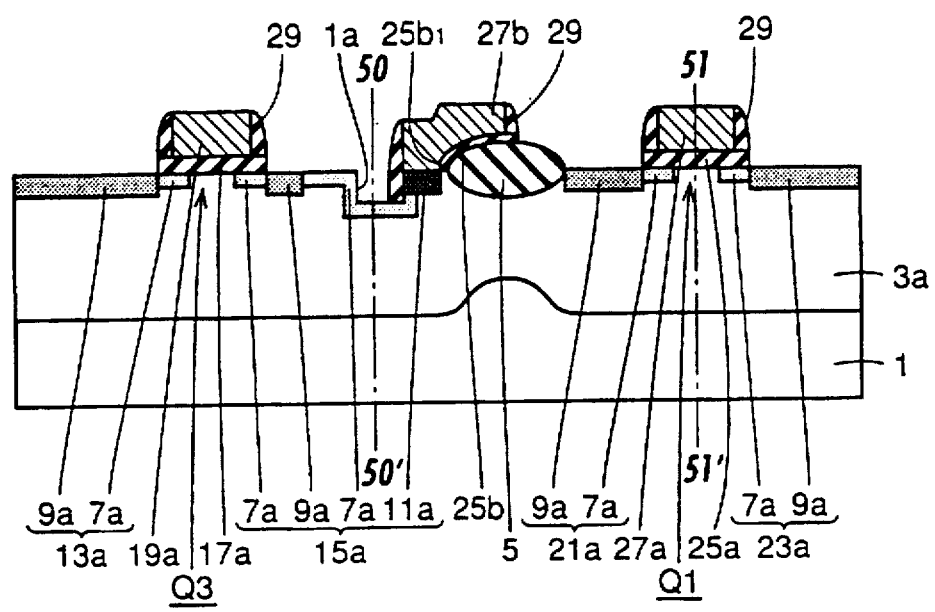
Figure 48:
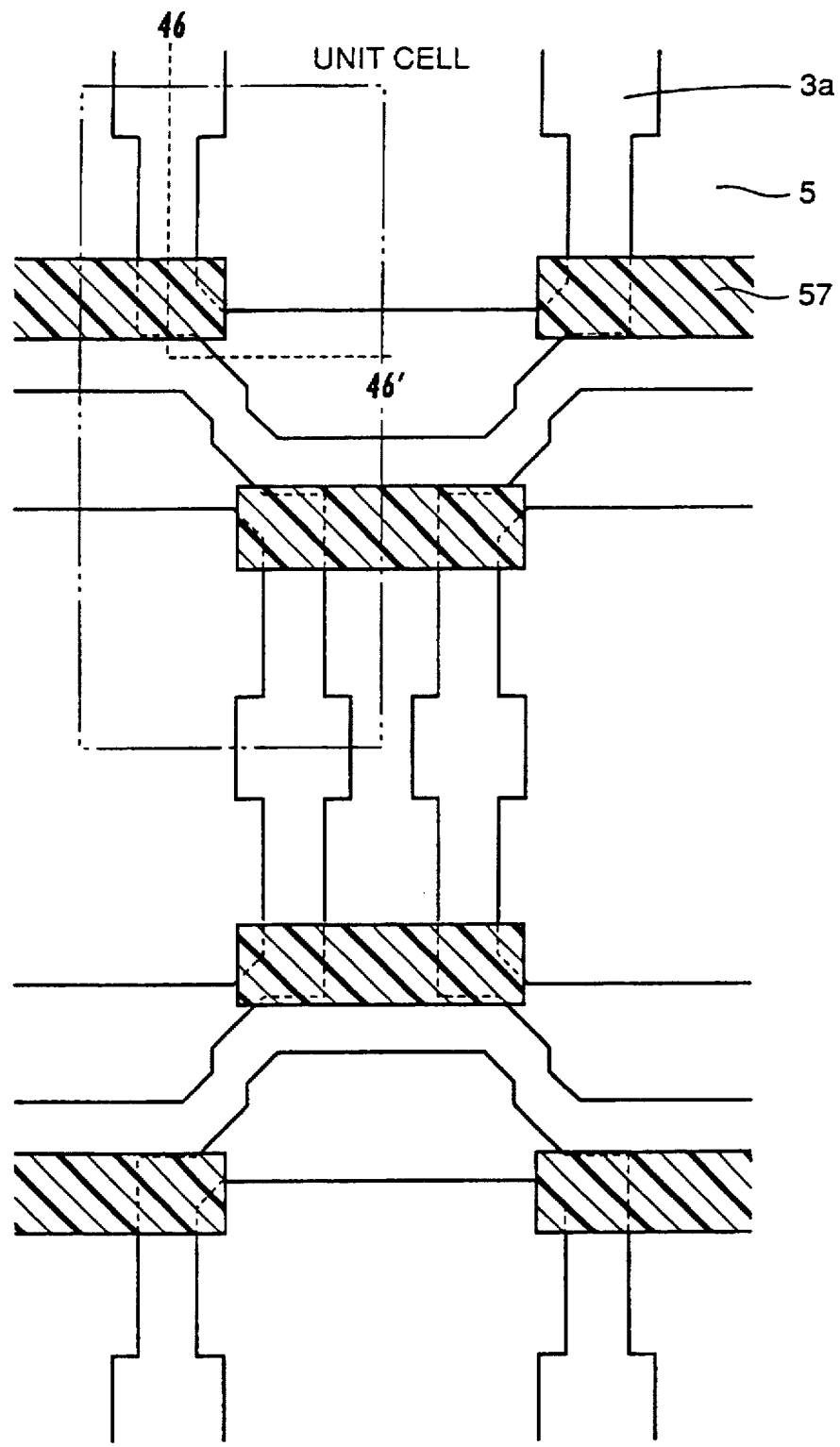
FIGS. 48 and 49 are fragmentary plans showing, in accordance with the order of steps, the method of manufacturing the semiconductor memory device of the embodiment 6.
Figure 49:
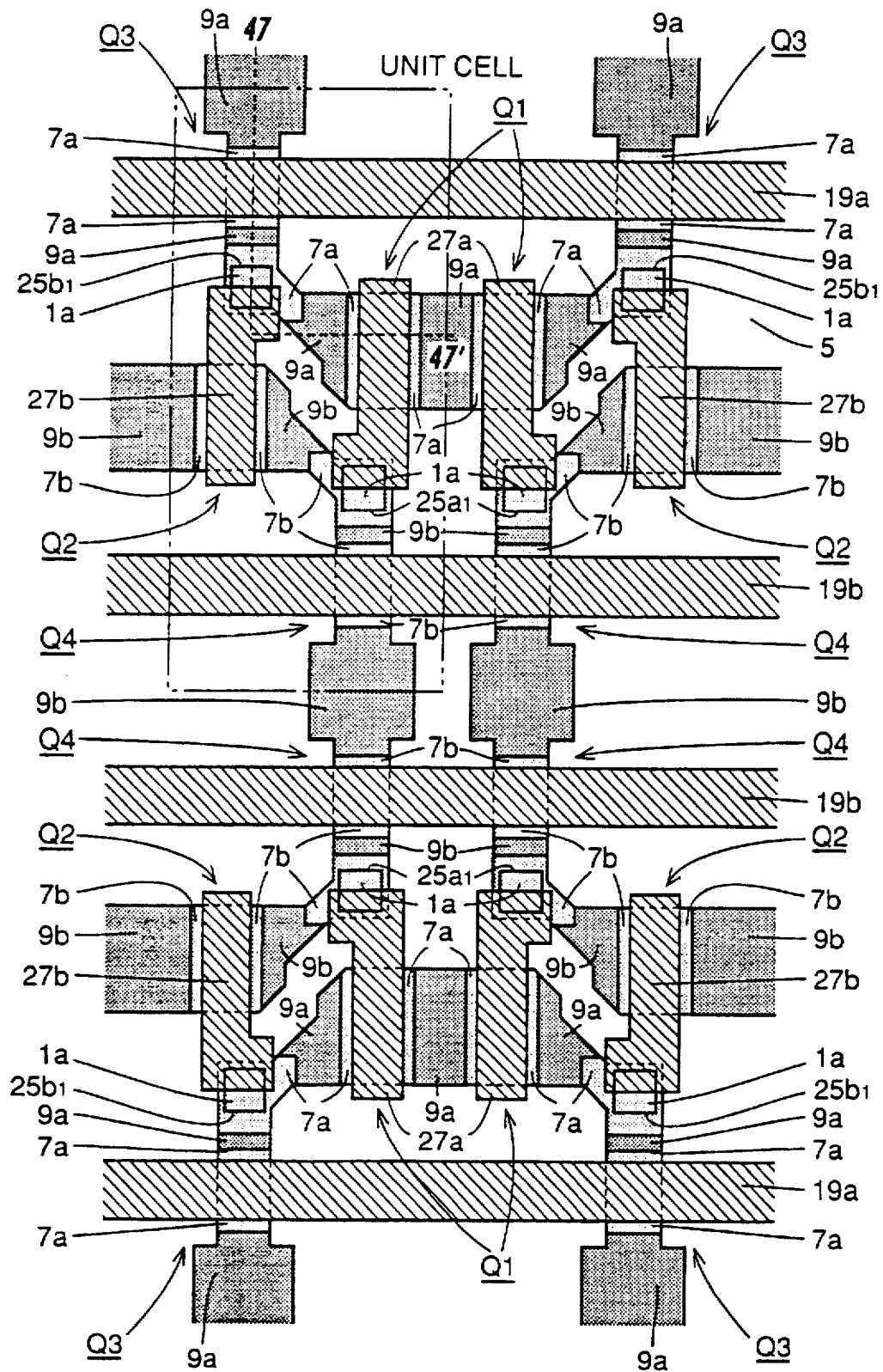

FIGS. 46 and 47 show sections taken along line 46—46' and 47—47' in FIGS. 48 and 49.

FIG. 46 shows a state before formation of gate electrode layer 17 in the state shown in FIG. 4.

In the embodiment 1 described before, threshold voltages Vth of access transistor and driver transistor are set by implanting p-type impurity such as boron (B) under predetermined conditions after $p^-$-well region 3 is formed.

Meanwhile, in the manufacturing method of this embodiment, $p^-$-well region 3a is formed, and then a resist pattern 57 is formed on regions at which openings $25a_1$ and $25b_1$ of gate electrode layer 17 are to be formed. Then, using resist pattern 57 as a mask, p-type impurity such as boron (B) is implanted for setting threshold voltages Vth of the access transistor and driver transistor.

Referring to FIGS. 47 and 49, steps similar to those of the embodiment 1 shown in FIGS. 4 to 7 are then performed to form $n^-$-impurity region 7a, $n^+$-impurity region 9a and n-type impurity region 11a.

Steps after this are substantially the same as those in the embodiment 1, and thus will not be described below.

Figure 50:
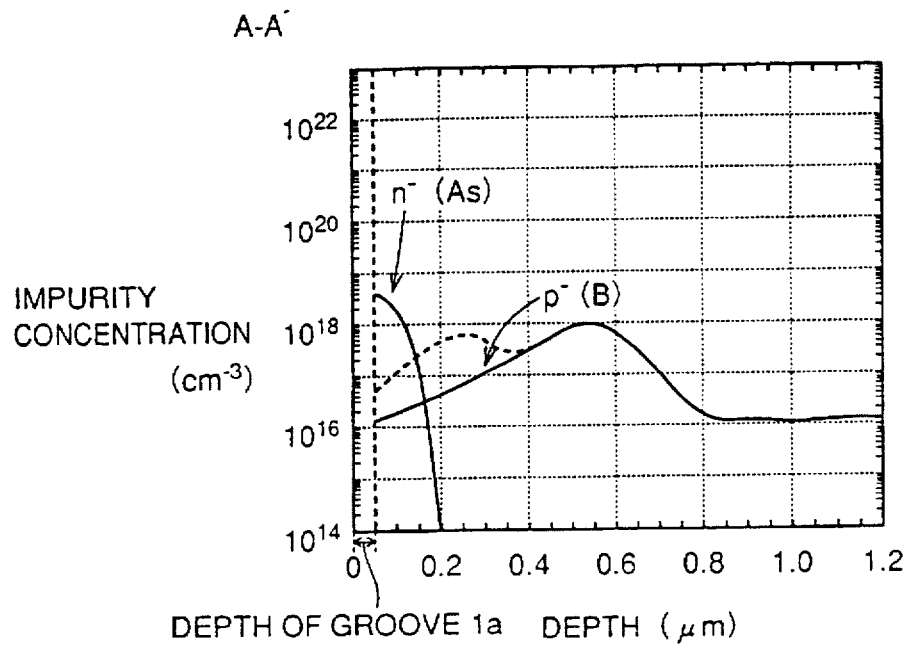
FIG. 50 is a graph showing a distribution of an impurity concentration along line 50—50' in FIG. 47.
Figure 51:
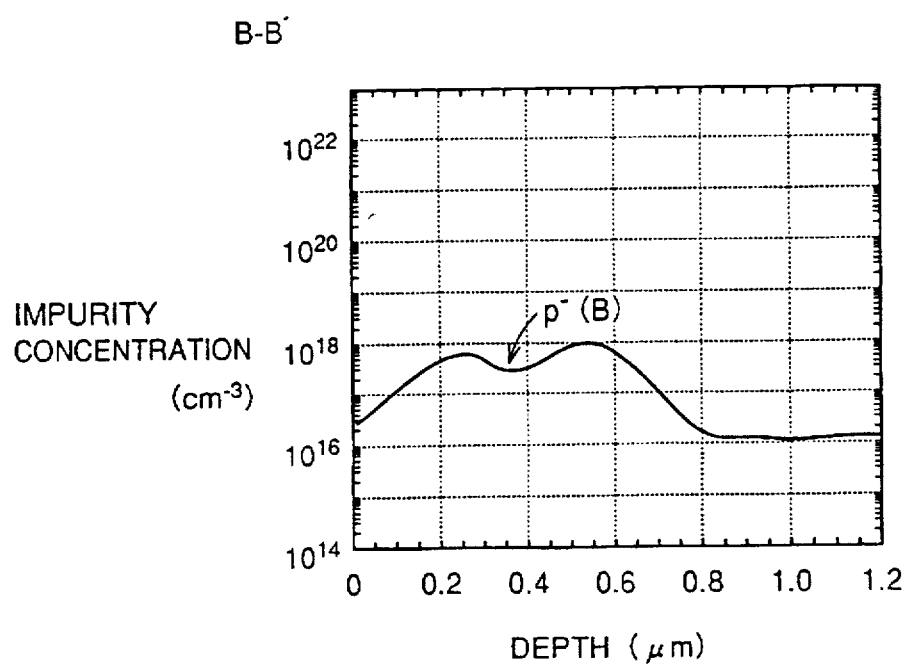
FIG. 51 is a graph showing a distribution of an impurity concentration along line 51—51' in FIG. 47.

FIGS. 50 and 51 are graphs showing distributions of the impurity concentration along lines 50—50' and 51—51' in FIG. 47. In the manufacturing method of this embodiment, impurity (boron) for controlling the threshold voltage is not implanted into the bottom of groove 1a at the step shown in FIG. 46. Therefore, an impurity concentration peak (dotted line), which may be caused by impurity implantation for controlling the threshold voltage, does not exist at the bottom of groove 1a, as can be seen in FIG. 50. Therefore, the impurity concentration of $p^-$-well region 3 at the junction to $n^-$-impurity region 7a can be smaller than that in the structure including the peak (dotted line) for the threshold voltage controlling. Accordingly, the depletion layer electric field can be weakened by reducing the impurity concentration of $p^-$-well region 3 at the junction between $n^-$-impurity region 7a and $p^-$-well region 3, and thus the junction leak current can be reduced.

Boron for the threshold voltage controlling is implanted into regions immediately under gate electrode layers 27a and 27b of the driver transistors. Therefore, the p-type impurity peaks for threshold voltage controlling exist at a depth of 0.2 to 0.3 µm from the substrate surface in regions immediately under gate electrode layers 27a and 27b.

Embodiment 7

The embodiments 1 to 6 have been described in connection with structures in which a so-called direct contact is used for connection between the gate electrode layer and $p^-$-well region 3 in the driver transistor, and in which a so-called shared direct contact is used for connection between them. However, the invention is not restricted to them, and may be applied to a structure using both the direct contact and the shared direct contact as shown in FIG. 52, in which case a similar effect can be achieved.

Figure 52:
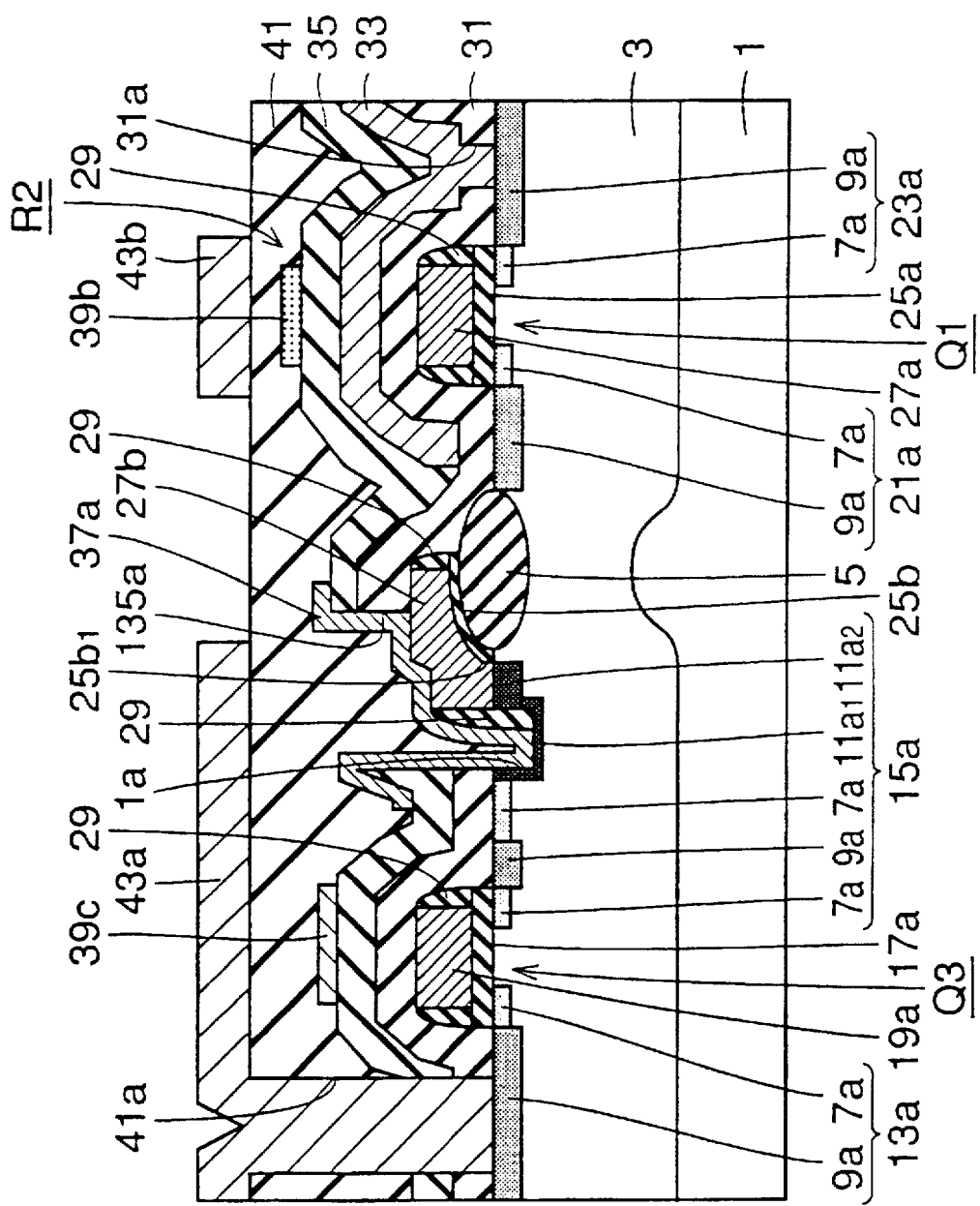
FIG. 52 is a schematic cross section showing a structure of a semiconductor memory device of an embodiment 7 of the invention.

More specifically, as shown in FIG. 52, gate electrode layers 27a and 27b of driver transistors Q1 and Q2 are in direct contact with the substrate surface, and n-type impurity regions $11a_2$ are formed at the contact portions. Gate electrode layer 27a is electrically connected to the substrate via low resistance region 37a.

Interlayer insulating layers 31 and 35 are provided with a contact hole 135a exposing gate electrode layer 27b and $p^-$-well region 3. Low resistance region 37a is formed in contact hole 135a to make electrical connection between gate electrode layer 27b and $p^-$-well region 3. Groove 1a is formed at a region where low resistance region 37a is in contact with $p^-$-well region 3, and side and bottom surfaces of groove 1a is covered with an n-type impurity region $11a_1$.

Since structures other than the above are substantially the same as those of the embodiment 1 shown in FIG. 1, the same or similar portions and members bear the same reference characters, and will not be described below.

Embodiment 8

In the embodiments 1 to 6, arsenic (As) having a small diffusion coefficient is used as impurity for forming $n^-$-impurity region 7a in order to reduce a depth of the junction. In the peripheral circuit transistor, however, a transistor having a long gate length may be used for preventing degradation of hot carriers. In this case, it is preferable to perform the $n^-$-impurity region by the tilt-angle rotary implantation of another n-type impurity such as phosphorus (P) having a large diffusion coefficient. This relieves a profile of junction between the drain and the $p^-$-well region in a direction along the substrate surface, and thus relieves the drain electric field, so that degradation can be suppressed.

Figure 53:
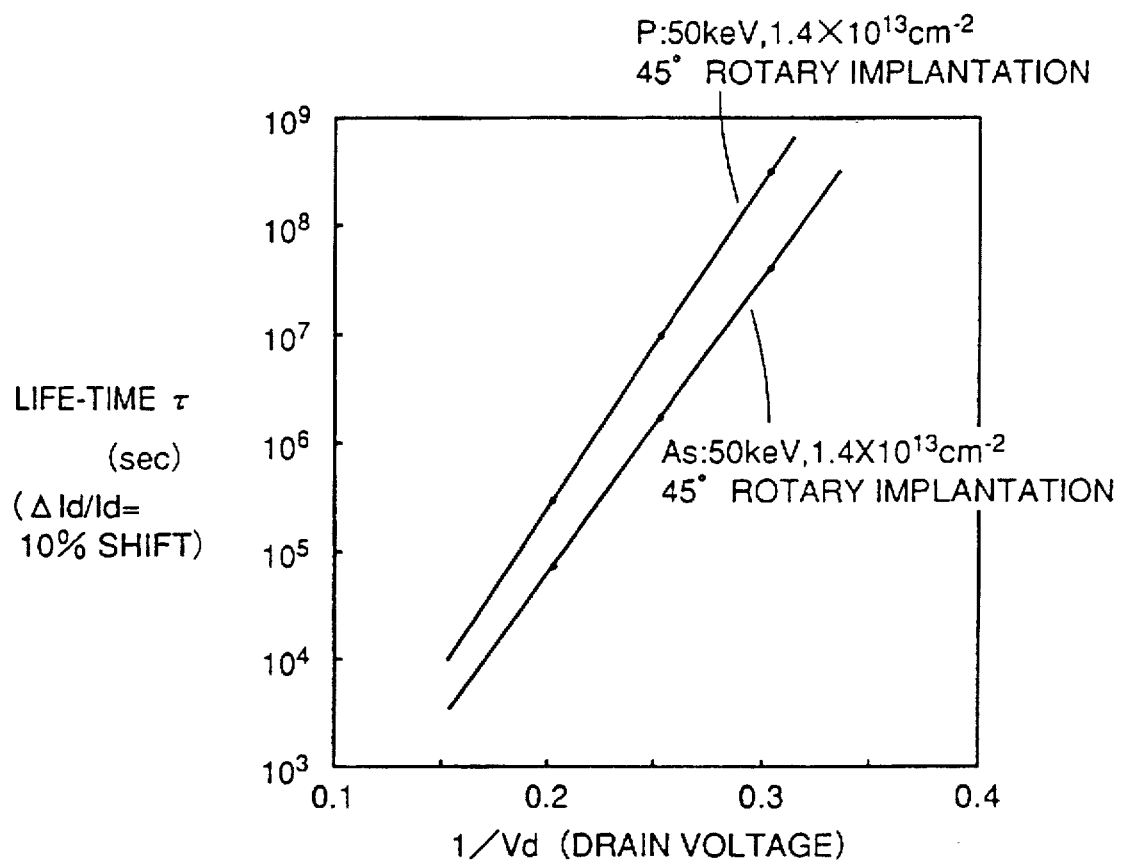
FIG. 53 is a graph showing change in a life-time in the cases where phosphorus and arsenic are implanted for source/drain regions under the same conditions.

FIG. 53 is a graph showing change in a life-time in the cases where phosphorus (P) and arsenic (As) are implanted for source/drain regions under the same conditions. It can be seen from FIG. 53 that implantation of phosphorus can effectively relieve the drain electric field and thus can increase the life-time. In view of this, arsenic (As), i.e., impurity of a small diffusion coefficient may be used for forming n⁻-impurity region 7a of the memory cell, and phosphorus, i.e., impurity of a large impurity concentration may be used for forming n⁻ source/drain regions of the peripheral circuit, whereby the reliability of the semiconductor memory device can be further improved.

The embodiments have been described in connection with the structures in which driver transistors Q1 and Q2, access transistors Q3 and Q4 and the transistor in the peripheral circuit region are MOS transistors. However, they may be another type of transistors provided that they are MIS (Metal Insulator Semiconductor) transistors.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device provided with static memory cells comprising:

a semiconductor substrate having a main surface and provided at said main surface with a groove; and an access transistor having a pair of source/drain regions formed at said main surface and spaced from each other, wherein one of said source/drain regions of said access transistor has:

a first impurity region formed at said main surface and having a first diffusion depth from said main surface, a second impurity region formed at said main surface, being in contact with an end of said first impurity region on the side of the other of said source/drain regions, and having a smaller impurity concentration than said first impurity region, and a third impurity region spaced from said second impurity region with said first impurity region therebetween, formed at a whole bottom surface of said groove, and having a second diffusion depth from the bottom surface of said groove smaller than said first diffusion depth.

2. The semiconductor memory device according to claim 1, wherein said third impurity region has a lower impurity concentration than said first impurity region.

3. The semiconductor memory device according to claim 1 further comprising:

a driver transistor having a pair of source/drain regions formed at said main surface and spaced from each other, and a gate electrode layer formed on a region between said pair of source/drain regions with a gate insulating layer therebetween, wherein an impurity concentration of said semiconductor substrate immediately under said groove is lower, at a depth of a junction between said semiconductor substrate and said third impurity region arranged at the bottom of said groove, than the impurity concentration of said semiconductor substrate immediately under said gate electrode layer of said driver transistor.

4. The semiconductor memory device according to claim 1, wherein a depth from said main surface to the bottom surface of said groove is 300 Å or more.

5. The semiconductor memory device according to claim 1, further comprising:

a driver transistor having a pair of source/drain regions formed at said main surface and spaced from each other, and a gate electrode layer formed on a region between said pair of source/drain regions with a gate insulating layer therebetween; and a load element having one end electrically connected to said gate electrode layer of said driver transistor, and another end connected to a power supply potential line.

6. The semiconductor memory device according to claim 5, wherein said gate electrode layer of said driver transistor is in contact with a surface of one of said source/drain regions of said access transistor, and said one end of said load element is in contact with the surface of said gate electrode layer of said driver transistor.

7. The semiconductor memory device according to claim 5, wherein said one end of said load element is in contact with a surface of said gate electrode layer of said driver transistor and a surface of one of said source/drain regions of said access transistor.

8. The semiconductor memory device according to claim 5, wherein said gate electrode layer of said driver transistor is in contact with a surface of one of said source/drain regions of said access transistor, and said one end of said load element is in contact with the surface of said gate electrode layer of said driver transistor and the surface of one of said source/drain regions of said access transistor.

9. The semiconductor memory device according to claim 5, wherein said load element is a resistance.

10. The semiconductor memory device according to claim 5, wherein said load element is a thin-film transistor, and the end of said load element electrically connected to said gate electrode layer of said driver transistor is either a drain region or a gate electrode layer of said thin-film transistor.

11. A semiconductor memory device provided with static memory cells comprising:

a semiconductor substrate having a main surface and provided at said main surface with a groove;

a driver transistor having a pair of source/drain regions formed at said main surface and spaced from each other;

said source region of said driver transistor having a first impurity region formed at said main surface and having a first diffusion depth from said main surface, and a second impurity region formed at said main surface, being in contact with an end of said first impurity region on said drain region side, and having a lower impurity concentration than said first impurity region; and an access transistor having a pair of source/drain regions formed at said main surface and spaced from each other, wherein one of said source/drain regions of said access transistor is formed at a whole bottom surface of said groove, and has a second diffusion depth from the bottom surface of said groove smaller than said first diffusion depth.

12. The semiconductor memory device according to claim 11, wherein one of said source/drain regions of said access transistor has a lower impurity concentration than said first impurity region.

13. The semiconductor memory device according to claim 11, wherein said drain region of said driver transistor and said pair of source/drain regions of said access transistor have impurity concentrations of $1\times10^{19} \text{cm}^{-3}$ or less.

14. A semiconductor memory device provided with static memory cells and a peripheral circuit comprising:

a semiconductor substrate having a main surface and provided at said main surface with a groove;

an MIS transistor included in said peripheral circuit and having a pair of source/drain regions formed at said main surface and spaced from each other;

one of said source/drain regions of said MIS transistor having:

a first impurity region formed at said main surface and having a first diffusion depth from said main surface, a second impurity region formed at said main surface, being in contact with an end of said first impurity region on the side of the other of said source/drain regions, and having a lower impurity concentration than said first impurity region; and an access transistor having a pair of source/drain regions formed at said main surface and spaced from each other, wherein one of said source/drain regions of said access transistor is formed at a whole bottom surface of said groove, and has a second diffusion depth from the bottom surface of said groove smaller than said first diffusion depth.

15. The semiconductor memory device according to claim 14, wherein one of said source/drain regions of said access transistor has a lower impurity concentration than said first impurity region.

16. The semiconductor memory device according to claim 14, further comprising a driver transistor having a pair of source/drain regions formed at said main surface and spaced from each other, and a gate electrode layer formed on a region between said pair of source/drain regions with a gate insulating layer therebetween, wherein said pair of source/drain regions of said driver transistor and said pair of source/drain regions of said access transistor have impurity concentrations of $1\times10^{19} \text{cm}^{-3}$ or less.

17. The semiconductor memory device according to claim 14, further comprising:

a driver transistor having a pair of source/drain regions formed at said main surface and spaced from each other, and a gate electrode layer formed on a region between said pair of source/drain regions with a gate insulating layer therebetween, wherein a silicide layer is formed in contact with the surface of said source region of said driver transistor.

18. The semiconductor memory device according to claim 14, wherein said pair of source/drain regions of said access transistor contain arsenic as impurity introduced thereinto, and said pair of source/drain regions of said MIS transistor included in said peripheral circuit contain phosphorus as impurity introduced thereinto.

19. A semiconductor memory device provided with static memory cells and a peripheral circuit comprising:

a semiconductor substrate having a main surface;

an MIS transistor having a source/drain region formed at said main surface, and included in said peripheral circuit;

said source/drain region of said MIS transistor having a first impurity region formed at said main surface under a side wall insulating layer formed on a side wall of a gate electrode of said MIS transistor, and a conductive layer being in contact with said first impurity region and having a lower resistance than that of said first impurity region;

an access transistor having a source/drain region formed at said main surface and including a second impurity region having higher resistance than that of said conductive layer; and driver transistor having a source/drain region formed at said main surface and including a third impurity region having higher resistance than that of said conductive layer and a silicide layer formed on said third impurity region only on a source region side.

20. The semiconductor memory device according to claim 19, characterized in that said conductive layer is formed of an impurity region having a higher concentration than that of said first impurity region.

21. The semiconductor memory device according to claim 19, characterized in that said conductive layer is formed of a silicide layer formed on said first impurity region.

22. The semiconductor memory device according to claim 19, characterized in that said first impurity region is formed of phosphorous, and said second impurity region and said third impurity region are formed of arsenic.

* * * * *